(12) United States Patent
Kister

(10) Patent No.: US 9,316,670 B2
(45) Date of Patent: Apr. 19, 2016

(54) MULTIPLE CONTACT PROBES

(71) Applicant: FormFactor, Inc., Livermore, CA (US)

(72) Inventor: January Kister, Portola Valley, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 14/664,220

(22) Filed: Mar. 20, 2015

(65) Prior Publication Data

US 2015/0192615 A1  Jul. 9, 2015

Related U.S. Application Data

(60) Division of application No. 12/880,808, filed on Sep. 13, 2010, now Pat. No. 8,988,091, which is a continuation-in-part of application No. 12/703,063, filed on Feb. 9, 2010, now Pat. No. 9,097,740, which is (Continued)

(51) Int. Cl.
*G01R 31/20* (2006.01)
*G01R 1/073* (2006.01)
*G01R 1/067* (2006.01)

(52) U.S. Cl.
CPC ............ *G01R 1/073* (2013.01); *G01R 1/06716* (2013.01); *G01R 1/06761* (2013.01); *G01R 1/07357* (2013.01); *G01R 1/06733* (2013.01)

(58) Field of Classification Search
CPC .. G01R 3/00; G01R 1/07342; G01R 1/06711; G01R 31/2886; G01R 1/06716; G01R 1/06727; G01R 1/06722; G01R 1/0675; G01R 1/06761; G01R 1/07314; G01R 1/07371; G01R 31/2889
See application file for complete search history.

(56) References Cited

U.S. PATENT DOCUMENTS

| | | |
|---|---|---|
| 2,754,203 A | 7/1956 | Vordahl |
| 3,518,612 A | 6/1970 | Dunman et al. |
| 3,599,093 A | 8/1971 | Oates |
| 3,710,251 A | 1/1973 | Hagge et al. |
| 3,812,311 A | 5/1974 | Kvaternik |
| 4,027,935 A | 6/1977 | Byrnes et al. |
| 4,115,736 A | 9/1978 | Tracy |
| 4,116,523 A | 9/1978 | Coberly et al. |
| 4,314,855 A | 2/1982 | Chang et al. |
| 4,423,376 A | 12/1983 | Byrnes et al. |
| 4,525,697 A | 6/1985 | Jones et al. |

(Continued)

FOREIGN PATENT DOCUMENTS

| | | |
|---|---|---|
| DE | 4237591 | 5/1994 |
| EP | 0144682 | 6/1985 |

(Continued)

OTHER PUBLICATIONS

Levy, "Wafer Probe TM System", Southwest Test Workshop, Jun. 1997, 1-19.

(Continued)

*Primary Examiner* — Tung X Nguyen
(74) *Attorney, Agent, or Firm* — Peacock Myers, P.C.; Deborah A. Peacock; Philip D. Askenazy

(57) ABSTRACT

The present invention is a probe array for testing an electrical device under test comprising one or more ground/power probes and one or more signal probes and optionally a gas flow apparatus.

10 Claims, 54 Drawing Sheets

Related U.S. Application Data a continuation-in-part of application No. 11/521,944, filed on Sep. 14, 2006, now Pat. No. 7,659,739, which is a continuation-in-part of application No. 11/450,977, filed on Jun. 9, 2006, now Pat. No. 7,733,101, and a continuation-in-part of application No. 10/850,921, filed on May 21, 2004, now Pat. No. 7,148,709.

(60) Provisional application No. 61/276,411, filed on Sep. 11, 2009, provisional application No. 61/314,492, filed on Mar. 16, 2010.

(56) References Cited

U.S. PATENT DOCUMENTS

| | | |
|---|---|---|
| 4,532,423 A | 7/1985 | Tojo et al. |
| 4,567,433 A | 1/1986 | Ohkubo et al. |
| 4,593,961 A | 6/1986 | Cosmo |
| 4,618,767 A | 10/1986 | Smith et al. |
| 4,618,821 A | 10/1986 | Lenz |
| 4,706,019 A | 11/1987 | Richardson |
| 4,730,158 A | 3/1988 | Kasai et al. |
| 4,747,698 A | 5/1988 | Wickramasinghe et al. |
| 4,757,255 A | 7/1988 | Margozzi |
| 4,772,846 A | 9/1988 | Reeds |
| 4,773,877 A | 9/1988 | Kruger et al. |
| 4,807,159 A | 2/1989 | Komatsu et al. |
| 4,871,964 A | 10/1989 | Boll et al. |
| 4,901,013 A | 2/1990 | Benedetto et al. |
| 4,967,148 A | 10/1990 | Doemens et al. |
| 4,973,903 A | 11/1990 | Schemmel |
| 5,015,947 A | 5/1991 | Chism |
| 5,026,291 A | 6/1991 | David |
| 5,030,318 A | 7/1991 | Reche |
| 5,061,192 A | 10/1991 | Chapin et al. |
| 5,067,007 A | 11/1991 | Otsuka et al. |
| 5,145,384 A | 9/1992 | Asakawa et al. |
| 5,205,739 A | 4/1993 | Malo et al. |
| 5,207,585 A | 5/1993 | Byrnes |
| 5,225,771 A | 7/1993 | Leedy |
| 5,230,632 A | 7/1993 | Baumberger et al. |
| 5,237,743 A | 8/1993 | Busacco et al. |
| 5,354,205 A | 10/1994 | Feigenbaum et al. |
| 5,399,982 A | 3/1995 | Driller |
| 5,422,574 A | 6/1995 | Kister |
| 5,430,614 A | 7/1995 | Difrancesco |
| 5,436,571 A | 7/1995 | Karasawa |
| 5,468,993 A | 11/1995 | Pendse |
| 5,468,994 A | 11/1995 | Pendse |
| 5,476,211 A | 12/1995 | Khandros |
| 5,531,022 A | 7/1996 | Beaman et al. |
| 5,576,631 A | 11/1996 | Stowers et al. |
| 5,632,631 A | 5/1997 | Fjelstad et al. |
| 5,635,846 A | 6/1997 | Beaman et al. |
| 5,642,056 A | 6/1997 | Nakajima et al. |
| 5,644,249 A | 7/1997 | Kister |
| 5,676,599 A | 10/1997 | Ricks et al. |
| 5,701,085 A | 12/1997 | Malladi |
| 5,720,098 A | 2/1998 | Kister |
| 5,742,174 A | 4/1998 | Kister et al. |
| 5,751,157 A | 5/1998 | Kister |
| 5,764,070 A | 6/1998 | Pedder |
| 5,764,072 A | 6/1998 | Kister |
| 5,764,409 A | 6/1998 | Colvin |
| 5,767,691 A | 6/1998 | Verkuil |
| 5,772,451 A | 6/1998 | Dozier, II et al. |
| 5,773,987 A | 6/1998 | Montoya |
| 5,802,699 A | 9/1998 | Fjelstad et al. |
| 5,806,181 A | 9/1998 | Khandros et al. |
| 5,821,763 A | 10/1998 | Beaman et al. |
| 5,829,128 A | 11/1998 | Eldridge et al. |
| 5,832,601 A | 11/1998 | Eldridge et al. |
| 5,834,946 A | 11/1998 | Albrow et al. |
| 5,847,936 A | 12/1998 | Forehand |
| 5,852,871 A | 12/1998 | Khandros |
| 5,864,946 A | 2/1999 | Eldridge et al. |
| 5,884,395 A | 3/1999 | Dabrowiecki et al. |
| 5,892,539 A | 4/1999 | Colvin |
| 5,914,613 A | 6/1999 | Gleason et al. |
| 5,917,707 A | 6/1999 | Khandros et al. |
| 5,923,178 A | 7/1999 | Higgins et al. |
| 5,926,951 A | 7/1999 | Khandros et al. |
| 5,932,323 A | 8/1999 | Throssel |
| 5,934,914 A | 8/1999 | Fjelstad et al. |
| 5,936,421 A | 8/1999 | Stowers et al. |
| 5,945,836 A | 8/1999 | Sayre et al. |
| 5,952,843 A | 9/1999 | Vinh |
| 5,969,533 A | 10/1999 | Takagi |
| 5,970,167 A | 10/1999 | Colvin |
| 5,974,662 A | 11/1999 | Eldridge et al. |
| 5,994,152 A | 11/1999 | Khandros et al. |
| 6,024,584 A | 2/2000 | Lemke et al. |
| 6,027,630 A | 2/2000 | Cohen |
| 6,029,344 A | 2/2000 | Khandros et al. |
| 6,031,282 A | 2/2000 | Jones et al. |
| 6,064,215 A | 5/2000 | Kister |
| 6,066,957 A | 5/2000 | Van Loan et al. |
| 6,071,630 A | 6/2000 | Tomaru et al. |
| 6,086,386 A | 7/2000 | Fjelstad et al. |
| 6,133,072 A | 10/2000 | Fjelstad |
| 6,184,576 B1 | 2/2001 | Jones et al. |
| 6,204,674 B1 | 3/2001 | Dabrowiecki et al. |
| 6,205,660 B1 | 3/2001 | Fjelstad et al. |
| 6,215,320 B1 | 4/2001 | Parrish |
| 6,218,203 B1 | 4/2001 | Khoury et al. |
| 6,246,245 B1 | 6/2001 | Akram et al. |
| 6,246,247 B1 | 6/2001 | Eldridge et al. |
| 6,247,228 B1 | 6/2001 | Distefano et al. |
| 6,255,126 B1 | 7/2001 | Mathieu et al. |
| 6,259,261 B1 | 7/2001 | Engelking et al. |
| 6,278,284 B1 | 8/2001 | Mori et al. |
| 6,292,003 B1 | 9/2001 | Fredrickson et al. |
| 6,334,247 B1 | 1/2002 | Beaman et al. |
| 6,336,269 B1 | 1/2002 | Eldridge et al. |
| 6,344,753 B1 | 2/2002 | Takada et al. |
| 6,350,953 B1 | 2/2002 | Franzen |
| 6,359,452 B1 | 3/2002 | Mozzetta |
| 6,367,150 B1 | 4/2002 | Kirsten |
| 6,411,112 B1 | 6/2002 | Das et al. |
| 6,414,502 B1 | 7/2002 | Sayre et al. |
| 6,419,500 B1 | 7/2002 | Kister |
| 6,420,887 B1 | 7/2002 | Kister et al. |
| 6,424,164 B1 | 7/2002 | Kister |
| 6,433,571 B1 | 8/2002 | Montoya |
| 6,437,584 B1 | 8/2002 | Gleason et al. |
| 6,441,315 B1 | 8/2002 | Eldridge et al. |
| 6,443,784 B1 | 9/2002 | Kimoto |
| 6,462,569 B2 | 10/2002 | Chen |
| 6,482,013 B2 | 11/2002 | Eldridge et al. |
| 6,483,328 B1 | 11/2002 | Eldridge et al. |
| 6,486,689 B1 | 11/2002 | Nishikawa |
| 6,496,026 B1 | 12/2002 | Long et al. |
| 6,525,552 B2 | 2/2003 | Kister |
| 6,529,021 B1 | 3/2003 | Yu et al. |
| 6,530,148 B1 | 3/2003 | Kister |
| 6,538,336 B1 | 3/2003 | Secker et al. |
| 6,566,898 B2 | 5/2003 | Theissen et al. |
| 6,570,396 B1 | 5/2003 | Kister |
| 6,573,738 B1 | 6/2003 | Matsuo et al. |
| 6,575,767 B2 | 6/2003 | Satoh et al. |
| 6,576,485 B2 | 6/2003 | Zhou et al. |
| 6,586,955 B2 | 7/2003 | Fjelstad et al. |
| 6,615,485 B2 | 9/2003 | Eldridge et al. |
| 6,624,648 B2 | 9/2003 | Eldridge et al. |
| 6,633,176 B2 | 10/2003 | Takemoto et al. |
| 6,641,430 B2 | 11/2003 | Zhou et al. |
| 6,646,455 B2 | 11/2003 | Maekawa et al. |
| 6,676,438 B2 | 1/2004 | Zhou et al. |
| 6,677,245 B2 | 1/2004 | Zhou et al. |
| 6,690,185 B1 | 2/2004 | Khandros et al. |
| 6,701,630 B2 | 3/2004 | Humphrey |
| 6,707,311 B2 | 3/2004 | Hohenwarter |
| 6,727,719 B2 | 4/2004 | Liao et al. |
| 6,731,123 B2 | 5/2004 | Kimoto |

(56) References Cited

U.S. PATENT DOCUMENTS

| | | |
|---|---|---|
| 6,765,228 B2 | 7/2004 | Lin et al. |
| 6,768,331 B2 | 7/2004 | Longson et al. |
| 6,825,422 B2 | 11/2004 | Eldridge et al. |
| 6,842,023 B2 | 1/2005 | Yoshida et al. |
| 6,847,221 B2 | 1/2005 | Kimoto et al. |
| 6,853,208 B2 | 2/2005 | Okubo et al. |
| 6,881,974 B2 | 4/2005 | Wood et al. |
| 6,890,185 B1 | 5/2005 | Kister et al. |
| 6,891,385 B2 | 5/2005 | Miller |
| 6,897,666 B2 | 5/2005 | Swettlen et al. |
| D507,198 S | 7/2005 | Kister |
| 6,917,102 B2 | 7/2005 | Zhou et al. |
| 6,917,525 B2 | 7/2005 | Mok et al. |
| D510,043 S | 9/2005 | Kister |
| 6,945,827 B2 | 9/2005 | Grube et al. |
| 6,956,389 B1 | 10/2005 | Mai |
| 6,965,244 B2 | 11/2005 | Miller |
| 6,965,245 B2 | 11/2005 | Kister et al. |
| 6,970,005 B2 | 11/2005 | Rincon et al. |
| 7,015,707 B2 | 3/2006 | Cherian |
| 7,036,221 B2 | 5/2006 | Higashida et al. |
| 7,046,021 B2 | 5/2006 | Kister |
| 7,059,865 B2 | 6/2006 | Kister et al. |
| 7,061,257 B2 * | 6/2006 | Khandros et al. ........ 324/750.16 |
| 7,064,564 B2 | 6/2006 | Kister et al. |
| 7,068,057 B2 | 6/2006 | Tervo et al. |
| D525,207 S | 7/2006 | Kister et al. |
| 7,071,715 B2 | 7/2006 | Shinde et al. |
| 7,073,254 B2 | 7/2006 | Eldridge et al. |
| 7,078,921 B2 | 7/2006 | Haga et al. |
| 7,088,118 B2 | 8/2006 | Liu et al. |
| 7,091,729 B2 | 8/2006 | Kister |
| 7,108,546 B2 | 9/2006 | Miller et al. |
| 7,109,731 B2 | 9/2006 | Gleason et al. |
| 7,126,361 B1 | 10/2006 | Anderson et al. |
| 7,143,500 B2 | 12/2006 | Byrd |
| 7,148,709 B2 | 12/2006 | Kister |
| 7,150,658 B1 | 12/2006 | Chien |
| 7,173,441 B2 | 2/2007 | Kister et al. |
| 7,189,078 B2 | 3/2007 | Kister et al. |
| 7,202,682 B2 | 4/2007 | Cooper et al. |
| 7,217,138 B2 | 5/2007 | Kister et al. |
| 7,218,127 B2 | 5/2007 | Cooper et al. |
| 7,218,131 B2 | 5/2007 | Tanioka et al. |
| 7,225,538 B2 | 6/2007 | Eldridge et al. |
| 7,227,371 B2 | 6/2007 | Miller |
| 7,265,565 B2 | 9/2007 | Chen et al. |
| 7,274,195 B2 | 9/2007 | Takemoto et al. |
| 7,281,305 B1 | 10/2007 | Iyer |
| 7,285,966 B2 | 10/2007 | Lee et al. |
| 7,312,617 B2 | 12/2007 | Kister |
| 7,345,492 B2 | 3/2008 | Kister |
| 7,417,447 B2 | 8/2008 | Kister |
| 7,436,192 B2 | 10/2008 | Kister |
| 7,511,523 B2 | 3/2009 | Chen et al. |
| 7,514,948 B2 | 4/2009 | Kister |
| 7,649,367 B2 | 1/2010 | Kister |
| 7,659,739 B2 | 2/2010 | Kister |
| 7,667,471 B2 | 2/2010 | Kurotori et al. |
| 7,671,610 B2 | 3/2010 | Kister |
| 7,733,101 B2 | 6/2010 | Kister |
| 7,733,103 B2 | 6/2010 | Park et al. |
| 7,759,949 B2 | 7/2010 | Kister |
| 7,786,740 B2 | 8/2010 | Kister |
| 7,944,224 B2 | 5/2011 | Kister |
| 7,952,377 B2 | 5/2011 | Kister |
| 8,111,080 B2 | 2/2012 | Kister |
| 8,203,353 B2 | 6/2012 | Kister |
| RE43,503 E | 7/2012 | Kister |
| 8,230,593 B2 | 7/2012 | Kister |
| 8,299,394 B2 | 10/2012 | Theppakuttai et al. |
| 8,310,253 B1 * | 11/2012 | Mardi et al. ............ 324/754.01 |
| 8,324,923 B2 | 12/2012 | Kister |
| 8,415,963 B2 | 4/2013 | Kister |
| RE44,407 E | 8/2013 | Kister |
| 8,723,546 B2 | 5/2014 | Kister |
| 8,907,689 B2 | 12/2014 | Kister et al. |
| 8,988,091 B2 | 3/2015 | Kister |
| 9,097,740 B2 | 8/2015 | Kister |
| 9,121,868 B2 | 9/2015 | Kister |
| 2001/0012739 A1 | 8/2001 | Grube et al. |
| 2001/0040460 A1 | 11/2001 | Beaman et al. |
| 2002/0000815 A1 | 1/2002 | Fjelstad |
| 2002/0070743 A1 | 6/2002 | Felici et al. |
| 2002/0117330 A1 | 8/2002 | Eldridge et al. |
| 2002/0125584 A1 | 9/2002 | Umehara et al. |
| 2002/0153913 A1 | 10/2002 | Okubo et al. |
| 2002/0177782 A1 | 11/2002 | Penner |
| 2002/0190737 A1 | 12/2002 | Maekawa |
| 2002/0190738 A1 | 12/2002 | Beaman et al. |
| 2002/0194730 A1 | 12/2002 | Shih et al. |
| 2003/0016346 A1 | 1/2003 | Umeda et al. |
| 2003/0027423 A1 | 2/2003 | Zhou et al. |
| 2003/0116346 A1 | 6/2003 | Forster et al. |
| 2003/0218244 A1 | 11/2003 | Lahiri et al. |
| 2003/0218865 A1 | 11/2003 | Macias |
| 2004/0036493 A1 | 2/2004 | Miller |
| 2004/0046579 A1 | 3/2004 | Chraft et al. |
| 2004/0104737 A1 | 6/2004 | Haga et al. |
| 2004/0119485 A1 | 6/2004 | Koch et al. |
| 2004/0239352 A1 | 12/2004 | Mizoguchi |
| 2005/0012513 A1 | 1/2005 | Cheng |
| 2005/0179458 A1 | 8/2005 | Chen et al. |
| 2005/0184743 A1 | 8/2005 | Kimura |
| 2005/0189955 A1 | 9/2005 | Takemoto et al. |
| 2005/0189958 A1 | 9/2005 | Chen et al. |
| 2005/0258844 A1 | 11/2005 | Kister |
| 2006/0001437 A1 | 1/2006 | Kister |
| 2006/0006887 A1 | 1/2006 | Kister |
| 2006/0033516 A1 | 2/2006 | Rincon et al. |
| 2006/0040417 A1 | 2/2006 | Eldridge et al. |
| 2006/0073712 A1 | 4/2006 | Suhir |
| 2006/0082380 A1 | 4/2006 | Tanioka et al. |
| 2006/0170440 A1 | 8/2006 | Sudin |
| 2006/0171425 A1 | 8/2006 | Lee et al. |
| 2006/0186905 A1 | 8/2006 | Kohashi et al. |
| 2006/0189867 A1 | 8/2006 | Revie et al. |
| 2006/0208752 A1 | 9/2006 | Tanioka et al. |
| 2006/0261828 A1 | 11/2006 | Cram et al. |
| 2007/0132466 A1 | 6/2007 | Kister |
| 2007/0145989 A1 | 6/2007 | Zhu et al. |
| 2007/0152686 A1 | 7/2007 | Kister |
| 2007/0167022 A1 | 7/2007 | Tsai et al. |
| 2007/0216432 A1 | 9/2007 | Kister |
| 2007/0229100 A1 | 10/2007 | Miller |
| 2007/0229103 A1 | 10/2007 | Tani |
| 2008/0001612 A1 | 1/2008 | Kister |
| 2008/0001613 A1 | 1/2008 | Kister |
| 2008/0068035 A1 | 3/2008 | Kister |
| 2008/0074132 A1 | 3/2008 | Fan et al. |
| 2008/0088327 A1 | 4/2008 | Kister |
| 2008/0088331 A1 | 4/2008 | Yoshida |
| 2008/0111572 A1 | 5/2008 | Kister |
| 2008/0252325 A1 | 10/2008 | Kister |
| 2008/0258746 A1 | 10/2008 | Tran et al. |
| 2008/0265873 A1 | 10/2008 | Kister |
| 2009/0079455 A1 | 3/2009 | Gritters |
| 2009/0102495 A1 | 4/2009 | Kister |
| 2009/0201041 A1 | 8/2009 | Kister |
| 2009/0293274 A1 | 12/2009 | Kister |
| 2010/0109691 A1 | 5/2010 | Kister |
| 2010/0176832 A1 | 7/2010 | Kister |
| 2010/0182021 A1 | 7/2010 | Singer |
| 2010/0182030 A1 | 7/2010 | Kister |
| 2010/0182031 A1 | 7/2010 | Kister |
| 2010/0289512 A1 | 11/2010 | Kister |
| 2011/0006796 A1 | 1/2011 | Kister |
| 2011/0062978 A1 | 3/2011 | Kister |
| 2011/0273198 A1 | 11/2011 | Kister |
| 2011/0273199 A1 | 11/2011 | Kister |
| 2012/0242363 A1 | 9/2012 | Breinlinger et al. |
| 2012/0286816 A1 | 11/2012 | Kister |
| 2012/0313621 A1 | 12/2012 | Kister |
| 2012/0313660 A1 | 12/2012 | Kister |

(56) References Cited

U.S. PATENT DOCUMENTS

| | | |
|---|---|---|
| 2013/0082729 A1 | 4/2013 | Fan et al. |
| 2013/0093450 A1 | 4/2013 | Kister |
| 2013/0150696 A1 | 6/2013 | Han et al. |
| 2014/0043054 A1 | 2/2014 | Kister |
| 2014/0044985 A1 | 2/2014 | Kister |
| 2015/0091596 A1 | 4/2015 | Kister et al. |

FOREIGN PATENT DOCUMENTS

| | | |
|---|---|---|
| EP | 0402756 | 12/1990 |
| EP | 0544305 | 6/1993 |
| EP | 0681186 | 11/1996 |
| EP | 0764352 | 5/2004 |
| EP | 0893695 | 10/2005 |
| JP | 63-307678 | 12/1988 |
| JP | 01128535 | 5/1989 |
| JP | 7-021968 | 1/1995 |
| JP | 7-333232 | 12/1995 |
| JP | 10506238 | 6/1998 |
| JP | 10221374 | 8/1998 |
| JP | 10311864 | 11/1998 |
| JP | 11044727 | 2/1999 |
| JP | 11-241690 | 8/1999 |
| TW | 201109669 | 3/2011 |
| WO | WO 92/10010 | 6/1982 |
| WO | WO 87/04568 | 7/1987 |
| WO | WO 96/15458 | 5/1996 |
| WO | WO 96/37332 | 11/1996 |
| WO | WO 97/43653 | 11/1997 |
| WO | WO 00/54066 | 9/2000 |
| WO | WO 01/09623 | 2/2001 |
| WO | 2007/146186 | 12/2007 |
| WO | 2008/008232 | 1/2008 |
| WO | 2008/094223 | 8/2008 |
| WO | 2012/036922 | 3/2012 |

OTHER PUBLICATIONS

Sporck, "A New Probe Card Technology Using Compliant Microsprings", Proceedings 1997 IEEE International Test Conference, Nov. 1, 1997, 527-532.

* cited by examiner

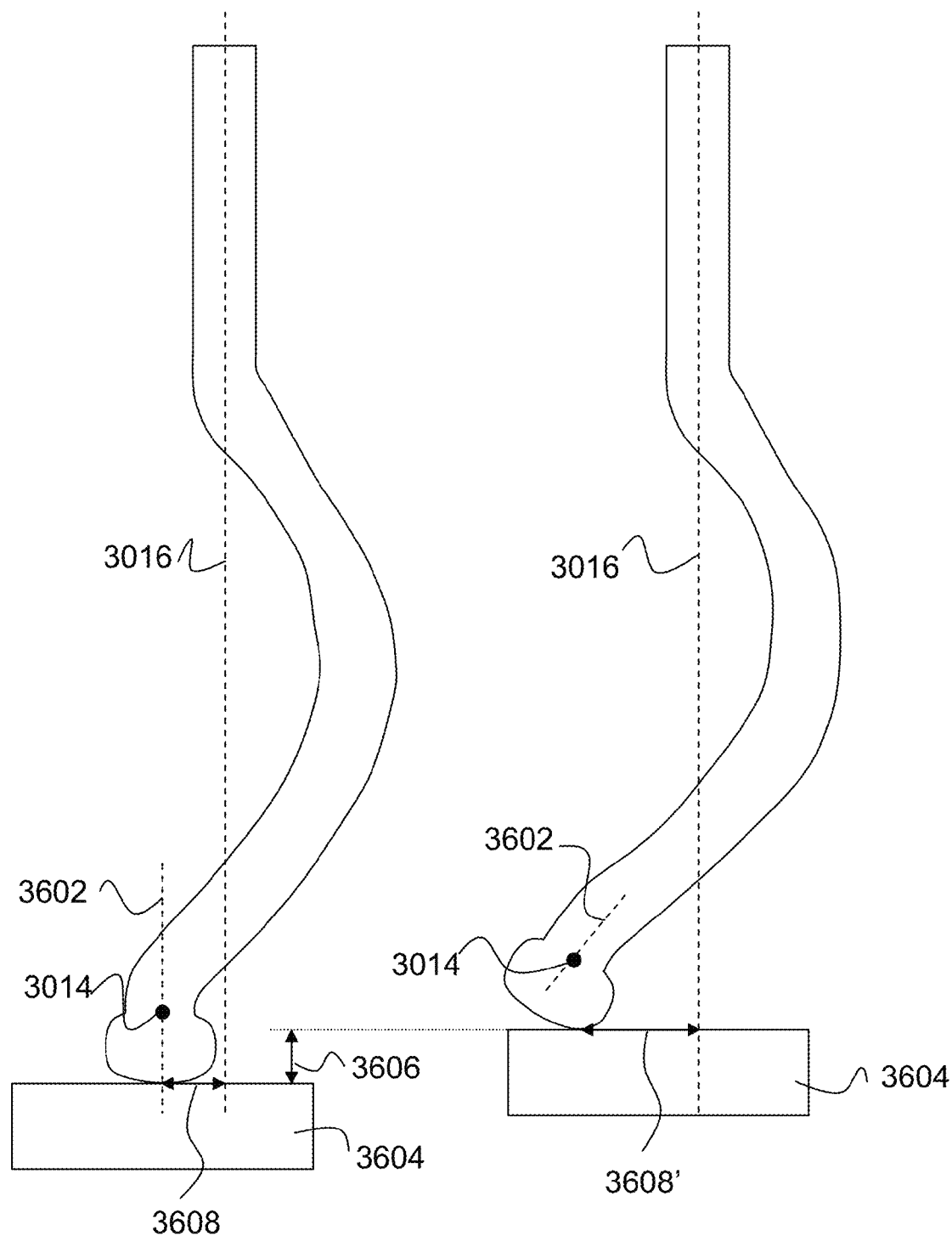

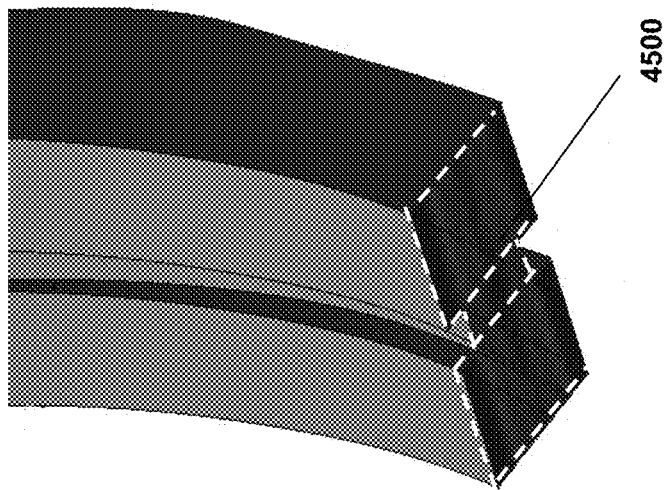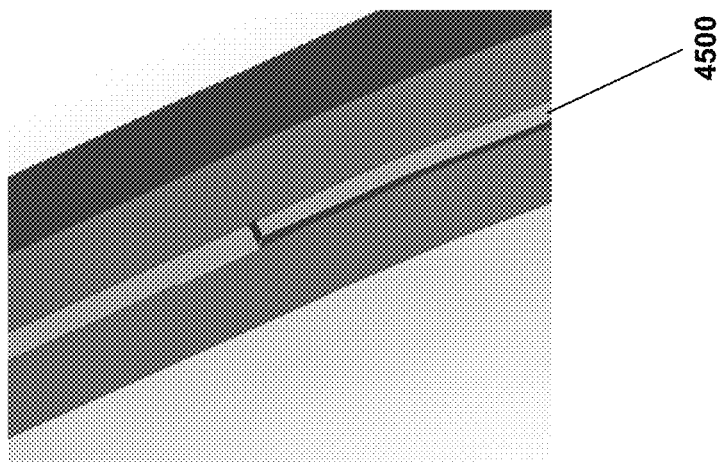
Fig. 45

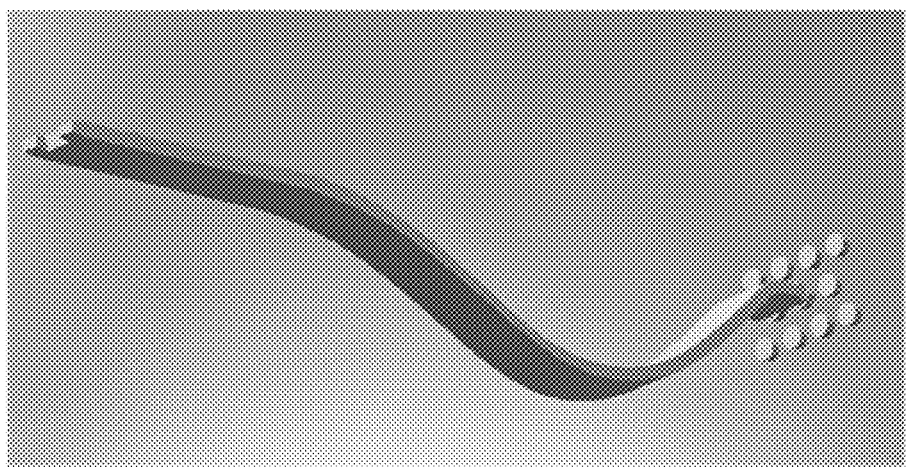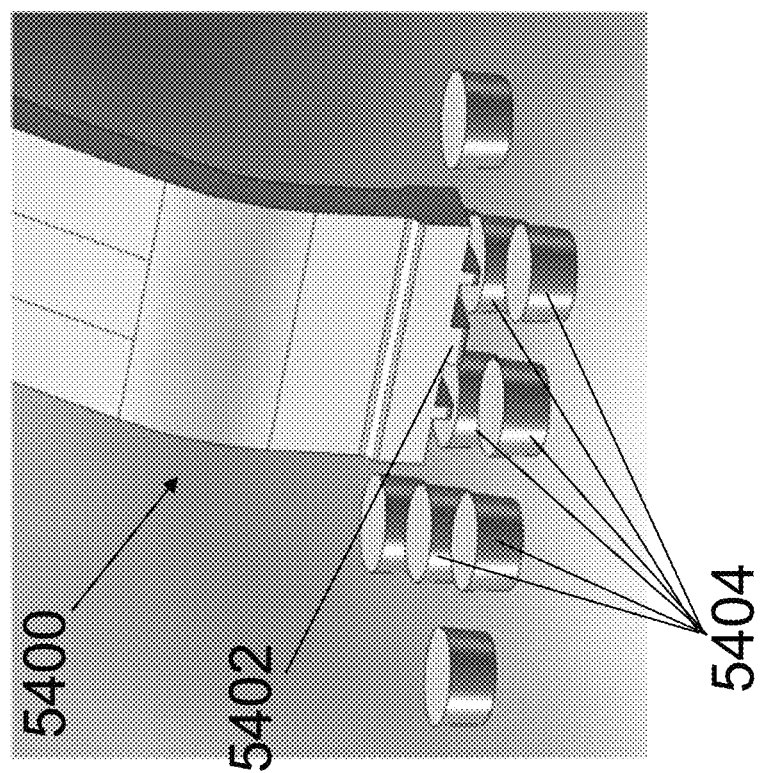
Fig. 54

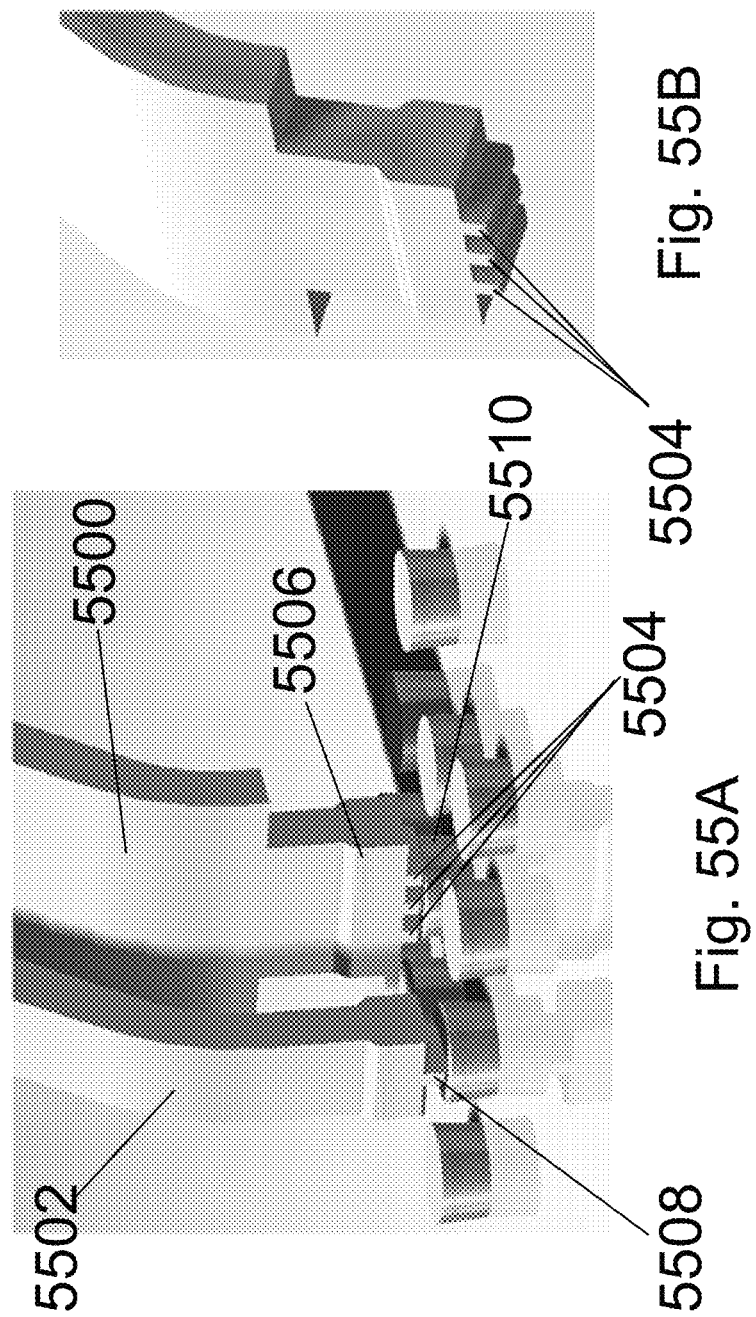

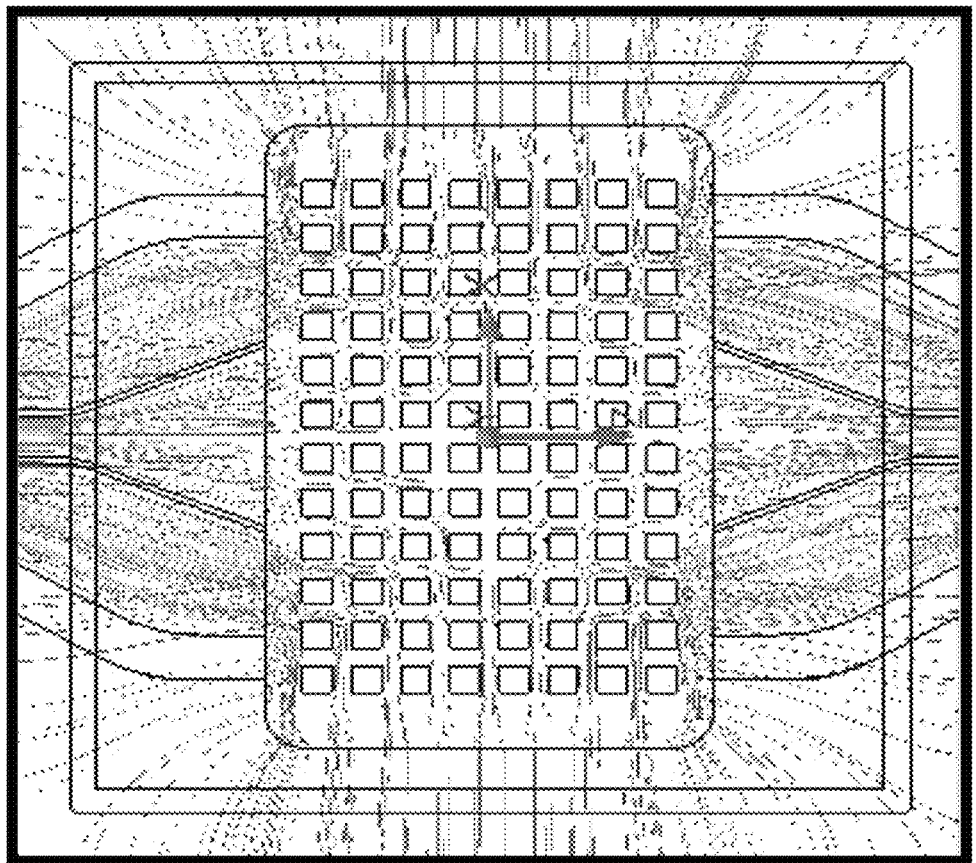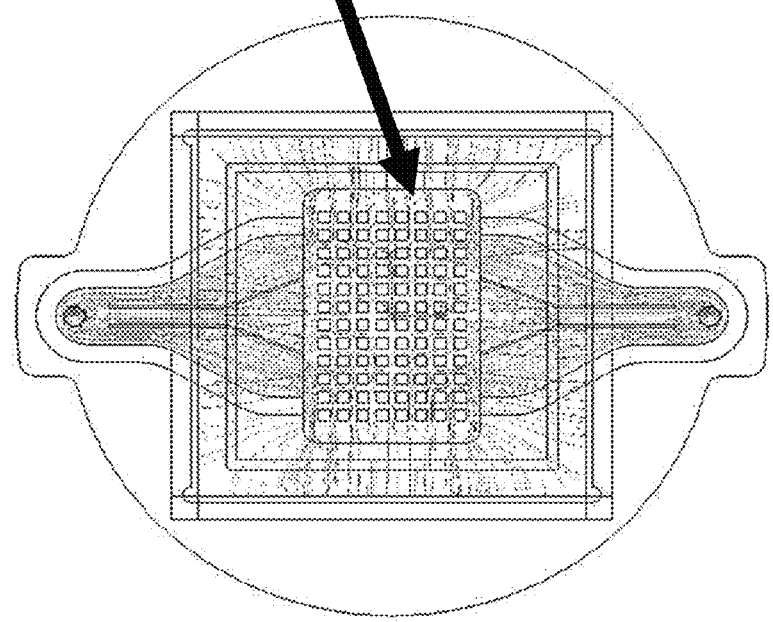
Fig. 63

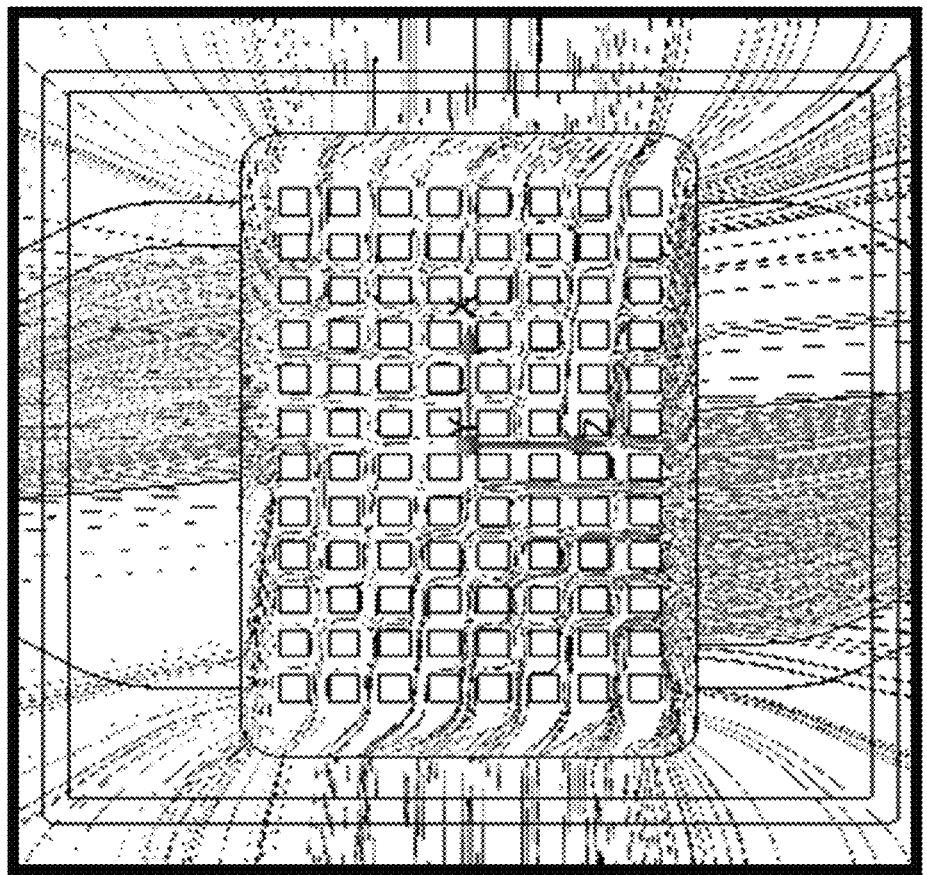
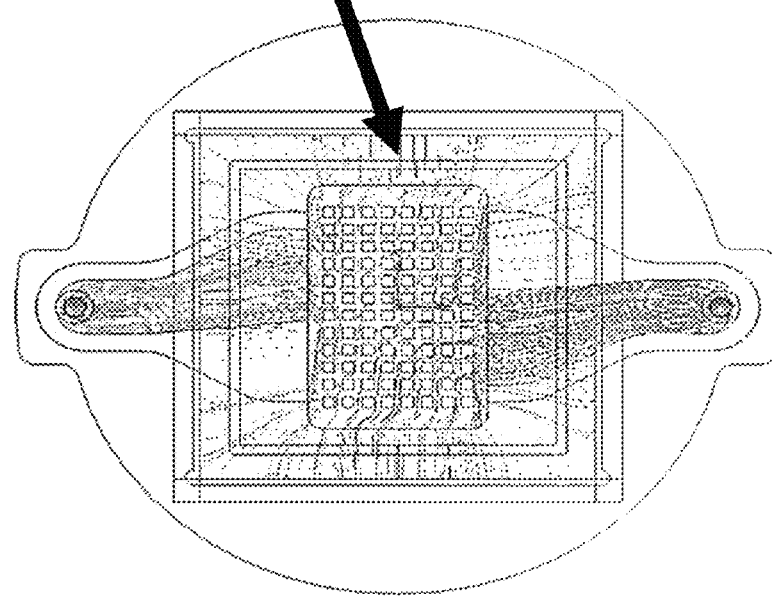
Fig. 64

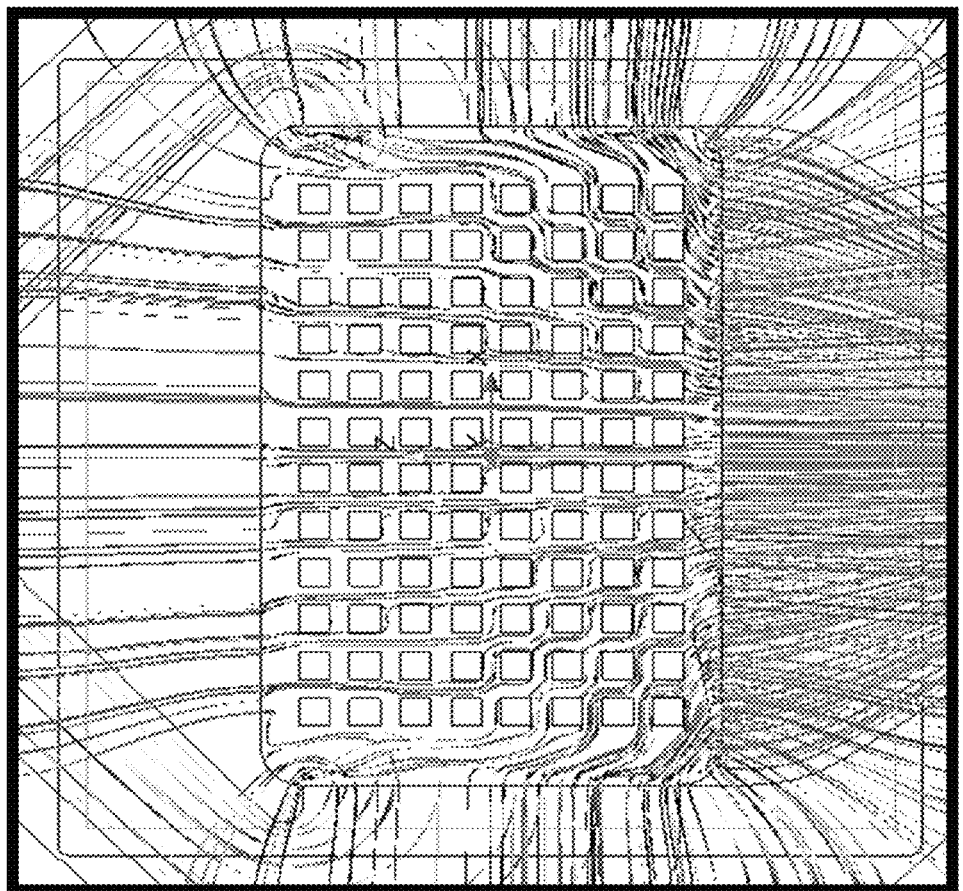
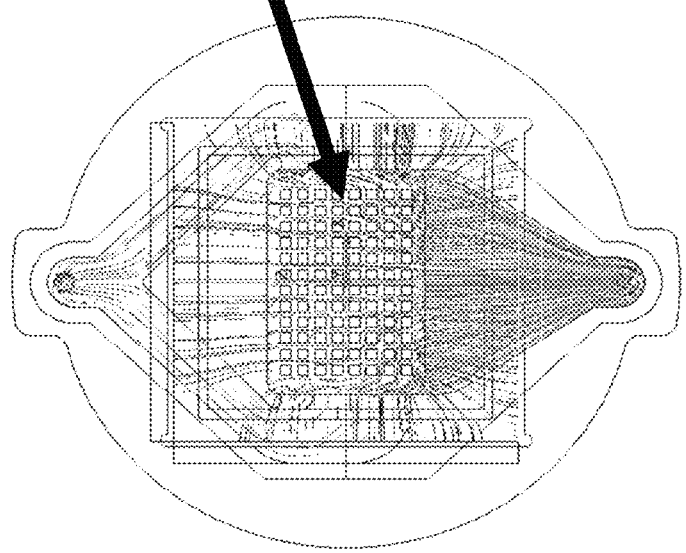
Fig. 65

MULTIPLE CONTACT PROBES

CROSS REFERENCE TO RELATED APPLICATIONS

This application is a divisional application of U.S. patent application Ser. No. 12/880,808, entitled "Multiple Contact Probes", filed on Sep. 13, 2010 and issuing as U.S. Pat. No. 8,988,091 on Mar. 24, 2015, which application is a continuation-in-part to U.S. patent application Ser. No. 12/703,063, entitled "Layered Probes with Core", to January Kister, filed on Feb. 9, 2010, and the specification and claims thereof are incorporated herein by reference, which is a continuation-in-part application of U.S. patent application Ser. No. 11/521,944 entitled "Knee Probe Having Reduced Thickness Section for Control of Scrub Motion", to January Kister, filed Sep. 14, 2006 which is a continuation-in-part application of U.S. patent application Ser. No. 11/450,977 entitled "Knee Probe Having Increased Scrub Motion", to January Kister, tiled on Jun. 9, 2006 which is a continuation-in-part application of U.S. patent application Ser. No. 10/850,921, entitled "Freely Deflecting Knee Probe with Controlled Scrub Motion", to January Kister, tiled May 21, 2004 (now U.S. Pat. No. 7,148,709), and all of the specifications and claims thereof are incorporated herein by reference.

This application claims priority to and the benefit of the filing of U.S. Provisional Patent Application Ser. No. 61/276,411, entitled "Forced Air Cooling", filed on Sep. 11, 2009, and the specification and claims thereof are incorporated herein by reference.

This application claims priority to and the benefit of the filing of U.S. Provisional Patent Application Ser. No. 61/314,492, entitled "Multiple Contact Probes", filed on Mar. 16, 2010, and the specification and claims thereof are incorporated herein by reference.

BACKGROUND OF THE INVENTION

1. Field of the Invention

This invention relates to electrical probes for automated circuit and device testing.

2. Description of Related Art

In the field of electronic circuitry testing, scrubbing and contact force is an important factor in establishing a low resistance electrical contact between a probe tip and the test contact. During scrubbing, an eventual insulating oxide layer is removed in the interface between the contact tip and the test contact. Scrubbing is a microscopic shear movement of the probe tip along the test contact surface while a certain pressure is exerted from the probe tip onto the test contact. As size and pitch of test contacts decrease, it becomes increasingly difficult to tune the scrub motion irrespective of friction influences in the tip/contact interface. Also, as the integrated circuit (IC) manufacturers incorporate designs with IC pads and bumps placed over chip's active circuitry it becomes important that the scrub of the probe does not cause damage to the underlying circuitry. The size of the window of acceptable probe operation therefore, is restrained from one side by the contact resistance requirements calling for a sizable scrub, smaller scrub size required by smaller targets that need to be probed as pitches decrease, and smaller scrub (including depth) to avoid damage to the underlying circuitry.

The new generation of IC chips has pads that are placed over active circuitry in order to maximize use of the real estate. These types of chips are commonly referred in the industry as chips with "low-K dielectric". The low-K dielectric refers to the fragile polymer-based insulator now placed between the pads and the underlying circuits for electrical purposes. it is not acceptable to damage the low-K dielectric during probing operations either.

Well known buckling beam probes have been utilized to provide a combined resilient deflection and scrubbing. In order for a buckling beam probe to operate properly with a well defined scrub motion it needs to be rigidly held on its peripheral shaft and additionally guided close to the contact tip. This makes the buckling beam probe's assembly increasingly challenging with ever decreasing scale. Therefore, there exists a need for a probe that may be easily assembled in large numbers and small scale white providing a well definable scrub motion. The present invention addresses this need.

The contact resistance issue has also been addressed by probes having separate parts for scrubbing and for making electrical contact. For example, US 2004/0239352 considers dual probes having a contact probe and a separate scrub probe, where the scrub probe moves in such a way as to clean the part of the contact pad that will end up under the contact probe during test. In some cases (e.g., copper deposition manufacturing), circuit fabrication processes provide contact pads which are covered with a protective dielectric film (e.g., a silicon dioxide film). U.S. Pat. No. 6,727,719 considers a probe having an inner contact needle and an outer hard layer, where the hard outer layer is adapted for penetrating such a protective film.

An important consequence of decreasing probe and contact pad dimensions is that the current density at the probe-pad contact increases. This increased current density also raises issues which have not come up before in connection with large probes on large pads. More specifically, the current density can be high enough to form micro-welds between the probe and the pad due to local heating. Breaking these micro-welds as the probe is removed from the contact pad can lead to degradation of the probe tip (e.g., by accumulation of non-conductive material), thereby reducing probe reliability and/or lifetime.

Testing of electrical devices and circuits has been an important component of electronic manufacturing processes for some time. Such testing typically entails probing a circuit with a fixture including multiple flexible probes, each probe making electrical contact to a contact pad on the circuit chip. Various practical issues that have arisen in this context have been addressed in the prior art, especially in connection with providing reliable, low-resistance electrical contact.

Electrical contact between the probe and the contact pad can also be hampered by the presence of non-conductive material on the pad and/or the probe (e.g., a thin oxide film). Accordingly, considerable attention has been devoted to details of how the tip of the probe moves relative to the contact pad in order to improve the resulting electrical connection. This relative motion is usually referred to as a scrub motion. For example, U.S. Pat. No. 5,923,178 considers a probe having a shape which provides a scrub motion which is primarily a rocking motion without appreciable sliding. U.S. Pat. No. 5,952,843 considers a probe having a canted tip portion to facilitate penetration of the passivation layer. U.S. Pat. No. 6,529,021 considers a probe arrangement where the probe tip can be made to move in a reciprocating manner to reduce contact resistance.

As circuit manufacturing technology continues to evolve to smaller critical dimensions, new practical issues relating to probing tend to arise which are not fully addressed by prior art approaches. For example, the decreasing size of contact pads as critical dimensions are reduced leads to increasingly demanding requirements on the ability to precisely control the probe scrub motion. Excessive scrub motion can cause loss of electrical contact, if the probe moves off the contact pad.

Accordingly, it would be an advance in the art to provide greater control of probe scrub motion.

A normally operating IC typically draws a current on the order of 100 mA through its probes. Providing this level of current carrying capacity is not problematic with present day technology. However, when probing ICs, it is possible to encounter a defective IC that draws far more probe current than normal (e.g., 1 A or more). In such situations, it is important to ensure that the probe is not permanently damaged by this over-current condition. The probe failure mode of most concern is typically inelastic probe deformation that causes the probe to go out of spec (e.g., to have an out-of-spec contact force), as opposed to catastrophic fusing of the probe. This inelastic deformation failure mode is thermally driven, and only arises as a current driven failure mode because of resistive heating of the probe by current passing through the probe. This problem has only become apparent recently, because earlier probe technology had probe dimensions such that probes were not damaged by this kind of over-current condition.

In embodiments of the present invention, this problem is addressed by providing forced gas cooling of the probe array and/or employing two different types of probes for probing an IC, namely power/ground probes and signal probes.

BRIEF SUMMARY OF EMBODIMENTS OF THE PRESENT INVENTION

One embodiment of the present invention preferably comprises a probe array for probing a device under test having a plurality of contact pads. The probe array of this embodiment preferably comprises at least one power/ground probe wherein the power/ground probe comprises one or more skates and at least one signal probe, wherein the power/ground probe comprises a width that is greater than a width of the signal probe. The power/ground probe can comprise a sacrificial substrate which is preferably disposed on the tip of the power/ground probe. The sacrificial substrate can make contact with a contact pad or optionally does not make contact with a contact pad. The power/ground probe can comprise at least two skates. A first skate preferably contacts a first power/ground IC pad and a second skate preferably contacts a second power/ground IC pad. The two skate can also contact the same IC pad. A sacrificial substrate is optionally disposed between the at least two skates. The width of the power/ground probe is preferably a multiple of a width of the signal probe. The power/ground probes can comprise one or more attachment points for connecting to a space transformer pad.

Another embodiment of the present invention comprises an apparatus for testing a device under test. This apparatus preferably comprises a probe array for probing a plurality of contact pads disposed on the device under test, at least one gas flow apparatus disposed on a side of the probe array, and the gas flow apparatus providing gas flow around and through the probe array. The gas flow apparatus preferably comprises a gas nozzle array. The gas nozzle array preferably comprises openings which can be slots. The gas flow apparatus can optionally comprise acoustic excitation to increase gas flow turbulence. The gas flow apparatus can also alternatively comprises pulsed gas flow. In an embodiment of the present invention, a first gas flow apparatus is disposed in one side of the probe array and a second gas flow apparatus is disposed on a second side of the probe array. The gas from the first gas flow apparatus preferably flows in an opposite direction of gas from the second gas flow apparatus. The gas from the first gas flow apparatus can optionally flow in a perpendicular direction to gas from the second gas flow apparatus. The first gas flow apparatus can operate at positive pressures while the second gas flow apparatus can operate at negative pressure. The gas flow is preferably turbulent. A cooler can be added to this embodiment of the present invention to cool the gas flow to substantially below room temperature. The cooler can comprise a Peltier cooler.

Another embodiment of the present invention comprises a method for testing a device under test. The method preferably comprises probing a plurality of contact pads disposed on the device under test, disposing at least one gas flow apparatus on a side of the probe array, and flowing gas from the gas flow apparatus around and through the probe array. The method also preferably comprises circulating the gas in a predetermined gas flow configuration. This method can also optionally comprise acoustically exciting the flowing gas to increase gas flow turbulence, and/or pulsing gas from the gas flow apparatus. The method preferably comprises disposing a first gas flow apparatus on a first side of the probe array and disposing a second flow apparatus on a second side of the probe array. The flowing gas from the first gas flow apparatus can be in an opposite direction from the gas flowing from the second gas flow apparatus. The flowing gas from the first gas flow apparatus can also be in a perpendicular direction from the gas in the second gas flow apparatus. The first gas flow apparatus can operate at a positive pressure or a negative pressure and the second gas flow apparatus can also operate at either a positive pressure or a negative pressure. The gas can also be cooled to substantially below room temperature. The gas preferably flows at a velocity of approximately 0.5 to 10 ft/s.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIG. 36 shows an embodiment of the invention in an initial contact configuration FIG. 37 shows an embodiment of the invention in an operating contact configuration.

FIG. 45 illustrates an embodiment of the present invention comprising a high-conductivity core that is trimmed to remove some of its highest-stress material.

FIG. 54 illustrates a probe comprising a sacrificial substrate in about the center of the probe;

FIGS. 55A-55D illustrate an embodiment of the present invention comprising a power/ground probe in mechanical contact with a singe contact pad;

FIG. 63 illustrates an embodiment of the present invention comprising two opposite gas flows without offset being circulated around and through a probe array;

FIG. 64 illustrates an embodiment of the present invention comprising two opposite gas flows with offset being circulated around and through a probe array; and FIGS. 65 and 66 illustrate embodiments of the present invention comprising one main gas flow and two lateral reinforced gas flows.

DETAILED DESCRIPTION OF THE INVENTION

Columnar Structure

Figure 1:
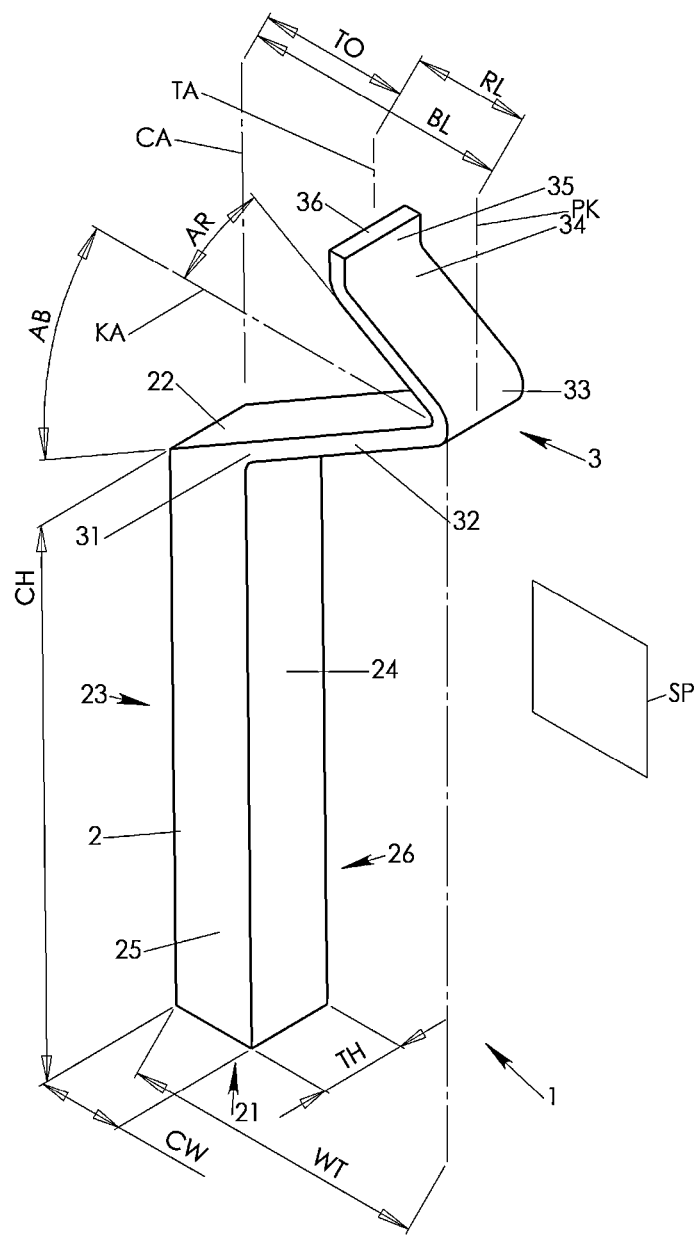
FIG. 1 is a first perspective view of an exemplary probe in accordance with a preferred embodiment of the invention.

Referring to FIG. 1, a probe 1 in accordance with a preferred embodiment of the invention features a rigid columnar structure 2 having a peripheral end 21, a connect end 22, a knee opposing face 23, a connect face 24, a front face 25 and a back face 26. The columnar structure 2 is preferably symmetric with respect to a central column axis CA. At the connect end 22, a suspension knee 3 is laterally connecting via its base arm 32, which propagates away from the column axis CA substantially up to a lateral knee extension PK. A reverse arm 34 continues from the base arm 32. The reverse arm 34 propagates away from the lateral knee extension PK in direction towards the column axis CA with a reverse length RL. At the end of the reverse arm 34 is a contacting tip 35. The contacting tip 35 has a contacting face 36 with a tip axis TA central with respect to the contacting face 36. The tip axis TA is offset from the column axis CA in a tip offset TO. The tip offset TO is smaller than the lateral knee extension PK such that during application of a contacting force preferably along the tip axis TA a first deflection of the base arm 32 and a second deflection of the reverse arm 34 counteract, resulting in a predetermined scrub motion of the contacting tip 35. The suspension knee 3 is connected to the rigid columnar structure 2 via a suspension connect 31.

The probe 1 is preferably symmetric with respect to a symmetry plane SP that coincides with the column axis CA and the tip axis TA. As a preferred result, the scrub motion is substantially in plane with the symmetry plane SP. The probe 1 may have a continuous profile in direction perpendicular with respect to the symmetry plane SP such that the columnar structure 2 as well as the elements of the suspension knee 3 have substantially rectangular cross sections.

The columnar structure 2 has a first pair of adjacent fixes and a second pair of adjacent faces, the first pair opposing the second pair. A first pair may be for example faces 24, 26 and a second pair may be faces 23, 25. The probe 1 may be fabricated in a layered fabrication technique such as well known electroplating in combination with negative shaped mask. Relevant dimensions of the probe 1 include probe thickness TH, total probe width WT, column width CW, column height CH, tip offset TO, lateral knee extension BL and reverse arm length RL. In the preferred case of substantially linearly protruding base arm 32 and/or reverse arm 34, relevant dimensions include also a base arm angle AB and reverse arm angle AR between a knee axis KA and their respective arms 32, 34. The knee axis KA is a geometric element coinciding with a center of a knee bent 33 referencing the orientation of the knee bent 33 with respect to the column axis CA. The knee axis may be utilized to characterize the displacement behavior of the suspension knee 3 as depicted in the spectral displacement plots of FIGS. 10, 12, 14, 16, 17, 19.

In the FIGS. 1-8, the arms 32, 34 as well as the knee bent 33 and contacting tip 35 are depicted as having constant cross sections. Nevertheless, arms 32, 34, knee bent 33 and contacting tip 35 may have tuned configurations to provide a scrub motion predetermined in direction and magnitude in response to a contacting force exerted onto the contacting face 36 during operational contacting of the probe 1 with a test contact as is well known in the art. Such tuned configurations and their influence on the scrub motion are described in more detail under FIGS. 9-18.

Figure 2:
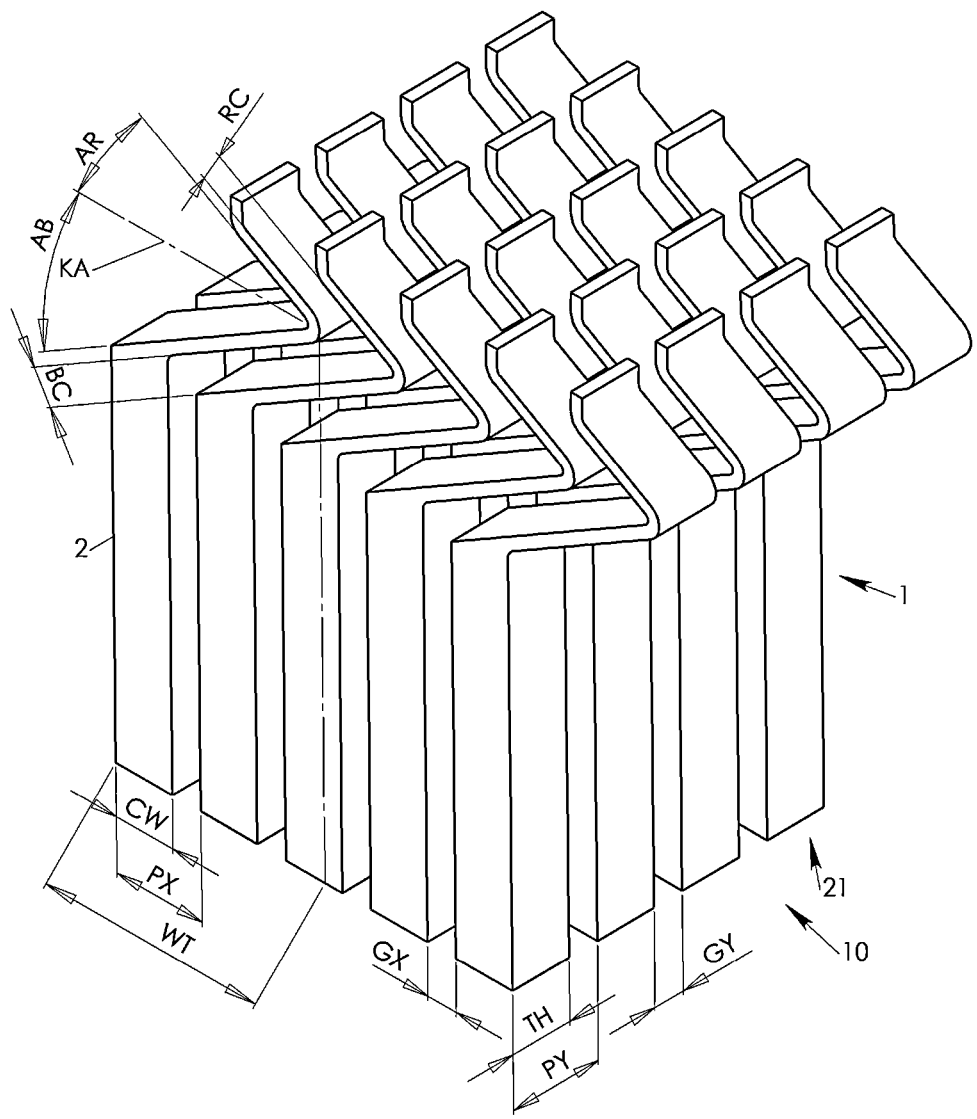
FIG. 2 is the first perspective view of a number of probes of FIG. 1 exemplary assembly array.
Figure 3:
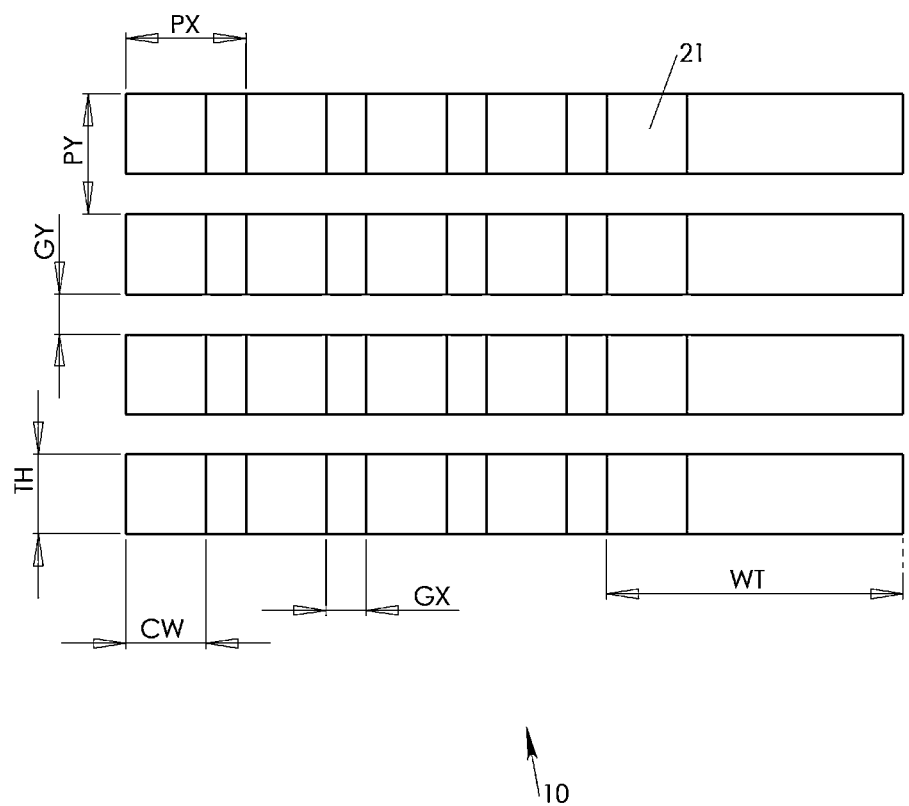
FIG. 3 is a top view of the probe array of FIG. 2.

Referring to FIGS. 2, 3, multiple representations of probe 1 may be arrayed with a first pitch PX that is substantially smaller than the total width WT. Base and reverse angles AB, AR are selected such that for a given first pitch PX sufficient base arm clearance BC and reverse arm clearance RC is established for an unimpeded deflection of each suspension knee 3 within the array. The first pitch PX may be selected in conjunction with the column width CW such that a first gap GX remains at a minimum required for an assembly for the arrayed probes 1.

Multiple representations of probe 1 may be arrayed in a two dimensional probe array 10 with the first pitch PX in a preferred direction parallel to the probes' 1 knee axes KA and a second pitch PY preferably perpendicular to the first pitch PX. The second pitch PY may be selected in conjunction with the probe thickness TH such that a second gap GY remains at a minimum required for an assembly for the arrayed probes 1. Providing the probes 1 in a configuration for a sole assembly via their rigid columnar structures 2 and for a scrub motion predetermined in direction and magnitude is highly advantageous for a tight interlaced array of the probes 1. For example, probes 1 having a probe thickness TH of about 2 mils, a total width WT of about 8 mils and a column width CW of about 2 mils may be assembled with a first pitch PX of about 4 mils and a second pitch of about 3 mils.

Referring to FIGS. 4-7, the probes 1 may be fixedly held in a probe assembly 100 including fixture plates 4 that may be combined and/or part of a well known probe apparatus for testing electronic circuitry. Each fixture plate 4 has a number of fixing cutouts 41 with a contour larger than the rectangular cross section of the columnar structure 2. Each fixing cutout 41 has two fixing faces 411, 412 that correspond to the first pair of adjacent faces 24, 25. The probe assembly further includes a clamping plate 5 having a number of clamping cutouts 51 also with a contour larger than the rectangular cross section of the columnar structure 2. Each clamping cutout 51 has two clamping faces 511, 512 that correspond to the second pair of adjacent faces 23. 26. Fixing cutouts 41 and clamping cutouts 51 are fabricated into their respective plates 4, 5 with pitches PX and PY.

Figure 4:
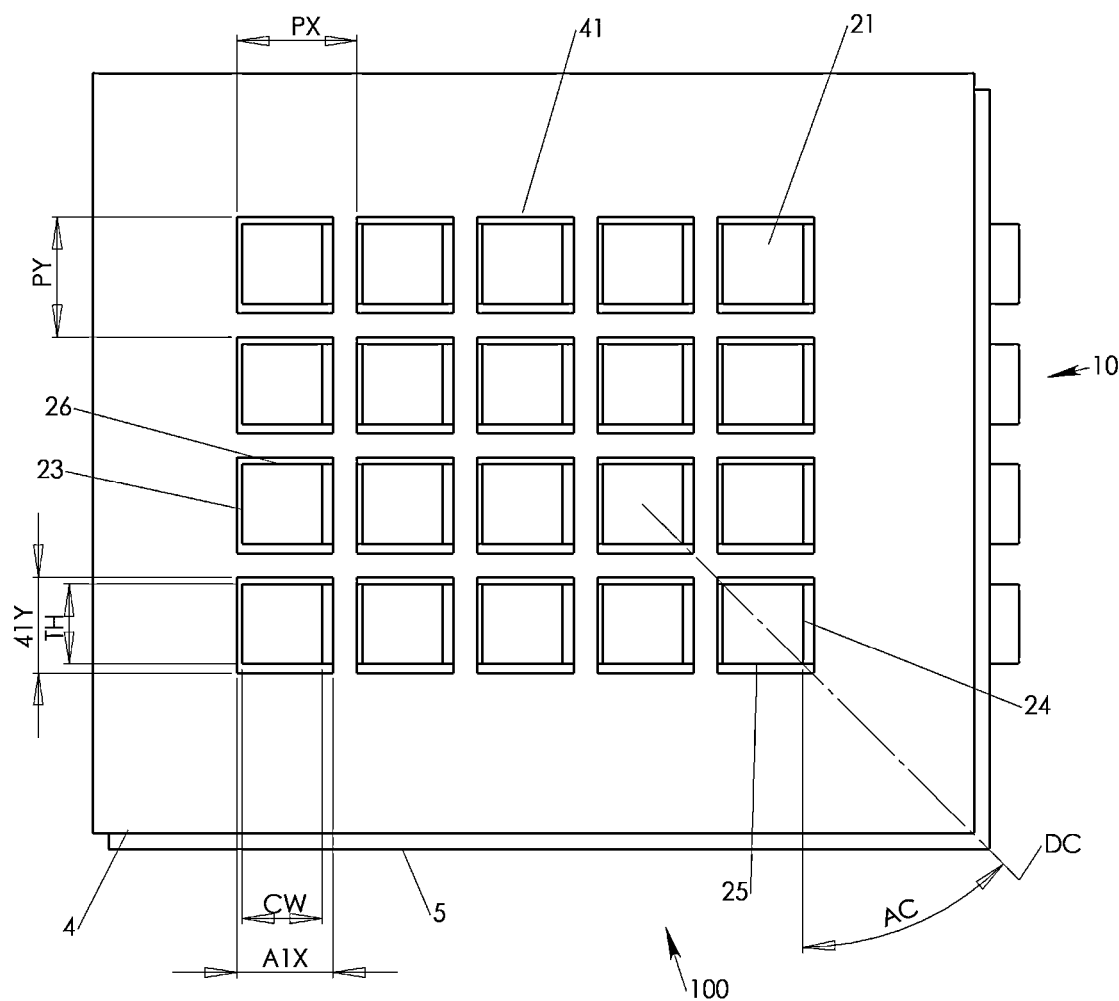
FIG. 4 is the top view of the probe array of FIG. 2 together with sandwiched fixture and clamping plate in aligned cutout position for probe insertion.
Figure 5:
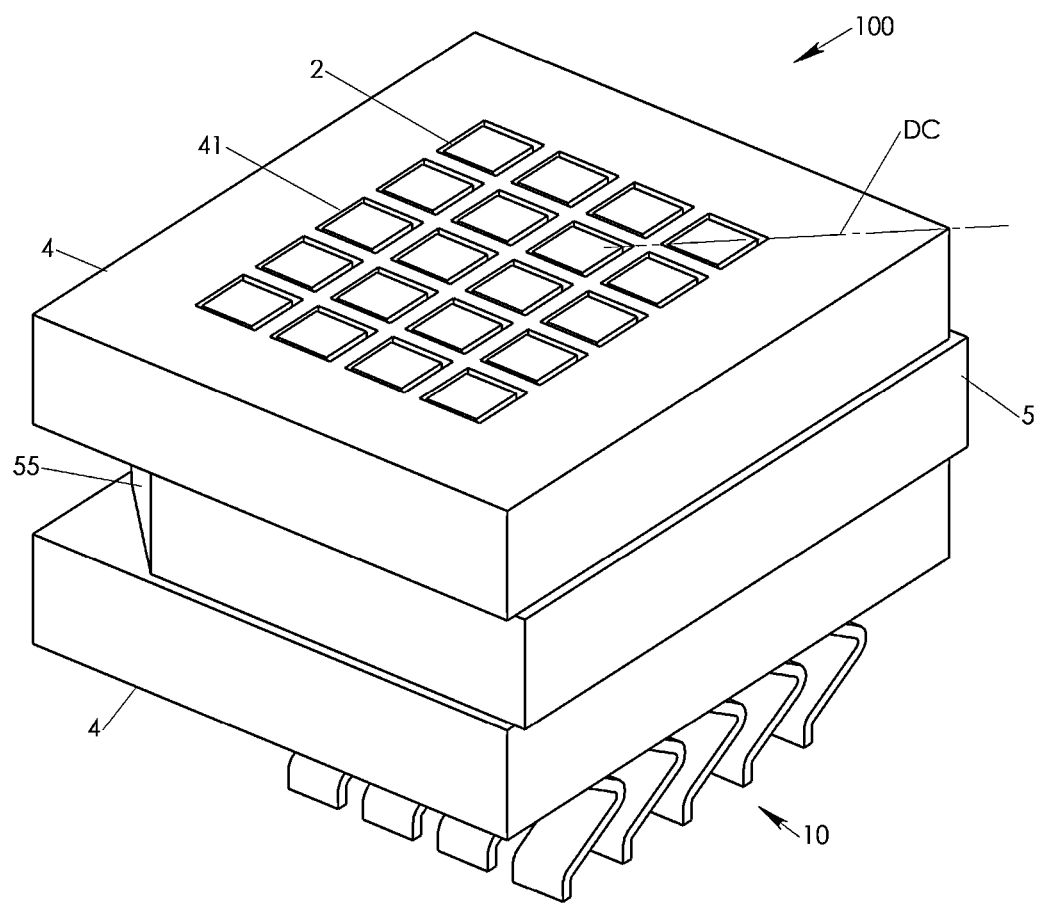
FIG. 5 is a second perspective view of the assembly of FIG. 4.
Figure 6:
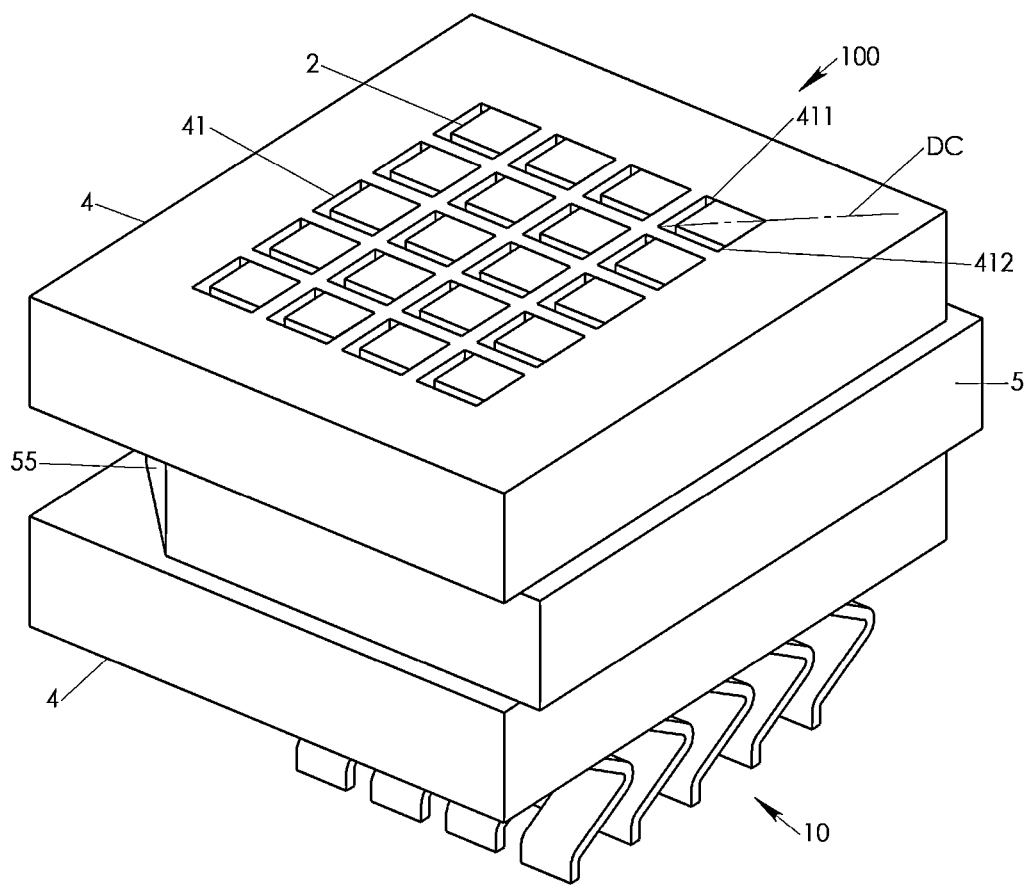
FIG. 6 is the second perspective view of the assembly of FIG. 5 in shear clamp configuration.
Figure 7:
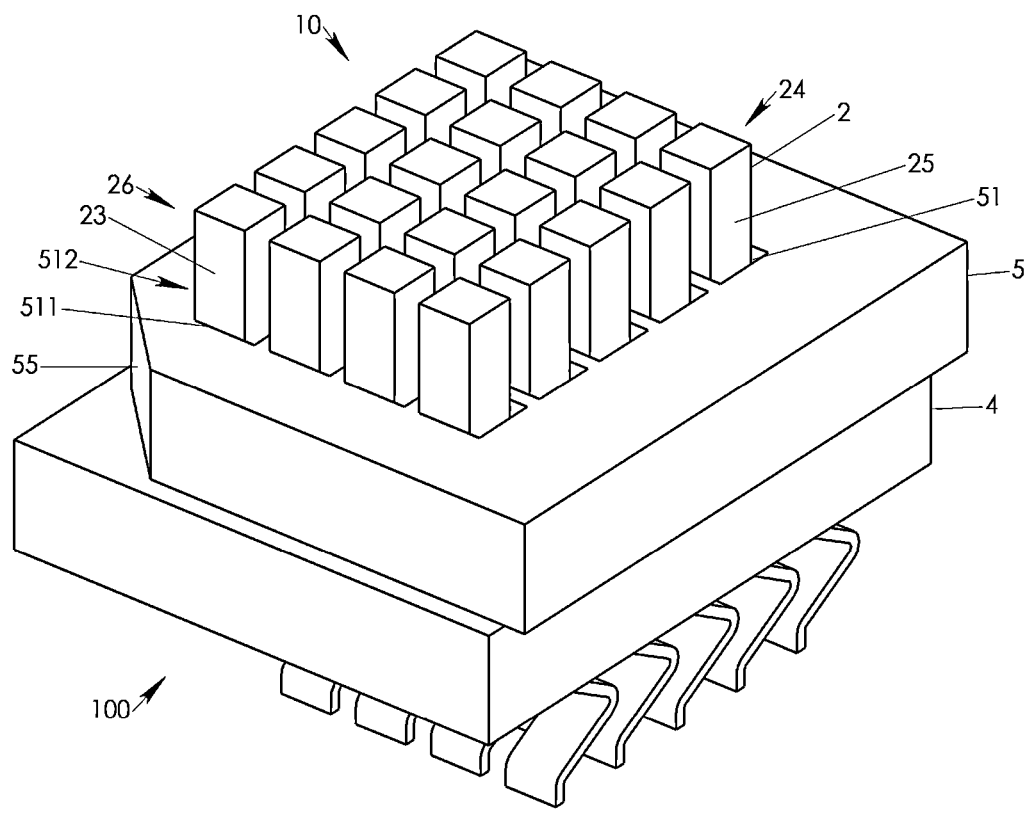
FIG. 7 is the second perspective view of the assembly of FIG. 6 with the top fixture plate being removed for illustration purpose.

The clamping plate may be held with respect to the fixture plates 4 in an assembly position as seen in FIGS. 4, 5 and a clamping position as seen in FIGS. 6, 7. In the assembly position, the clamping cutouts 51 align with the fixing cutouts 41 such that a columnar structure 2 may be inserted in the fixing cutouts 41 and the clamping cutouts 51. In the clamping position, the clamping plate 51 is offset in a clamp direction DC relative to its assembly position. The clamp direction DC is in a clamp angle AC which preferably corresponds approximately with a diagonal between the enclosed edges of the first pair of adjacent faces 24, 25 and the second pair of adjacent faces 23, 26. As a result of the angled clamping offset, the first pair of adjacent faces 24, 25 is forced into snuggle contact with the fixing faces 411, 412 and the second pair of adjacent faces 23, 26 is forced into snuggle contact with the clamping faces 511, 512 such that each probe is fixedly held in a predetermined pitch and orientation with respect to the fixture plates 4 and with respect to each other.

Plates 4, 5 may be fabricated from ceramic with the cutouts 41, 51 being deep trench etched as may be well appreciated by anyone skilled in the art. The clamping plate 5 may be forced into the clamping offset via any well known mechanical feature such as a screw pressing against a clamping access feature 55. The clamping direction DC is self adjusting as long as the clamping force is applied in direction approximately complying with the predetermined clamping direction DC as may be well appreciated by anyone skilled in the art. The clamping plate 5 may be actuated without particular guides. Assembly position stoppers may be provided for the clamping plate to warrant alignment of the clamping cutouts 51 with the fixing cutouts 41 in assembly position. Positioning of the probes 1 in direction along the column height CH may be provided via an auxiliary stop plate (not shown) temporarily placed adjacent opposite an insertion side of the plate assembly such that the peripheral ends 21 contact the stop plate once fully inserted into the cutouts 41, 51. After clamping, the stop plate may be removed. The probes 1 may be bonded in clamped position by an epoxy or other well known techniques. The cutouts 41, 51 may also be configured as conductively coated via holes conductively connected to peripheral terminals on the plates 41, and/or 51. The probes 1 may also be conductively accessed via well known wire bonding techniques bonding wires to the peripheral ends 21 as may be well appreciated by anyone skilled in the art The fully fabricated probe assembly 100 may be inserted and/or assembled in a well known probe apparatus.

Figure 8:
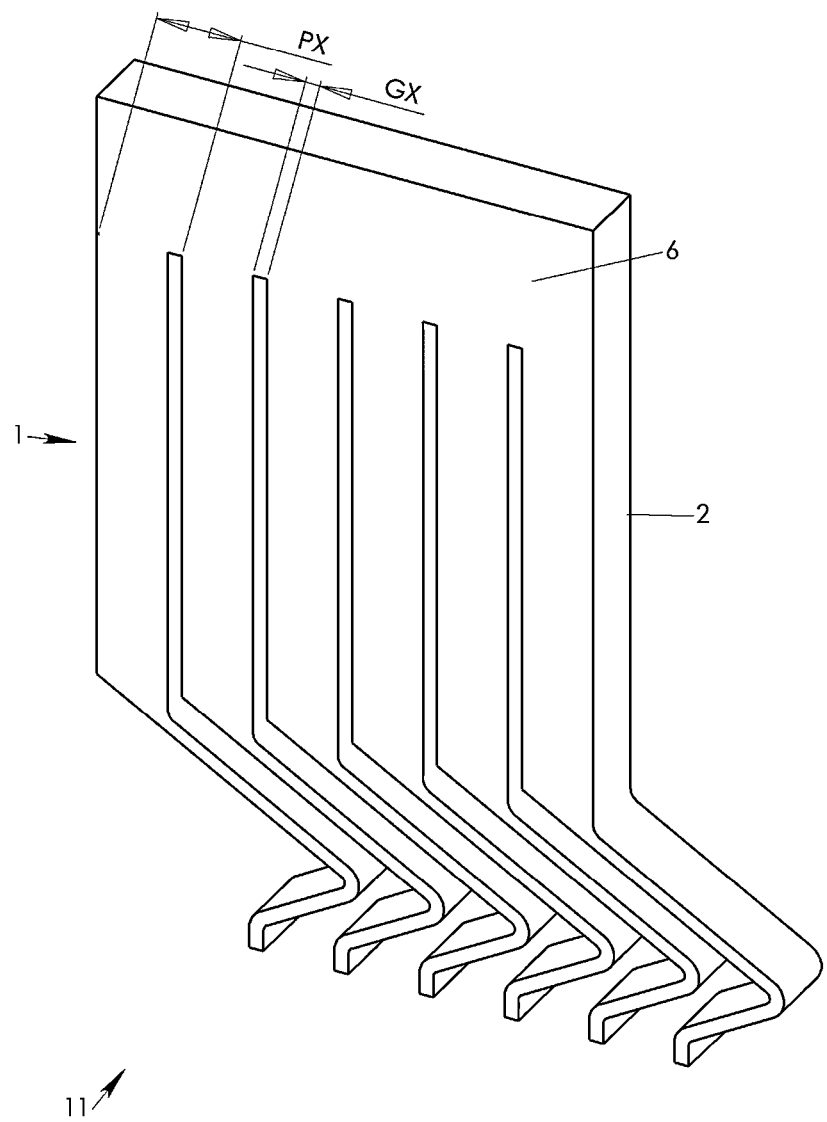
FIG. 8 is a third perspective view of an exemplary probe comb of a number of linearly arrayed probes combined by a bridge.
Figure 9:
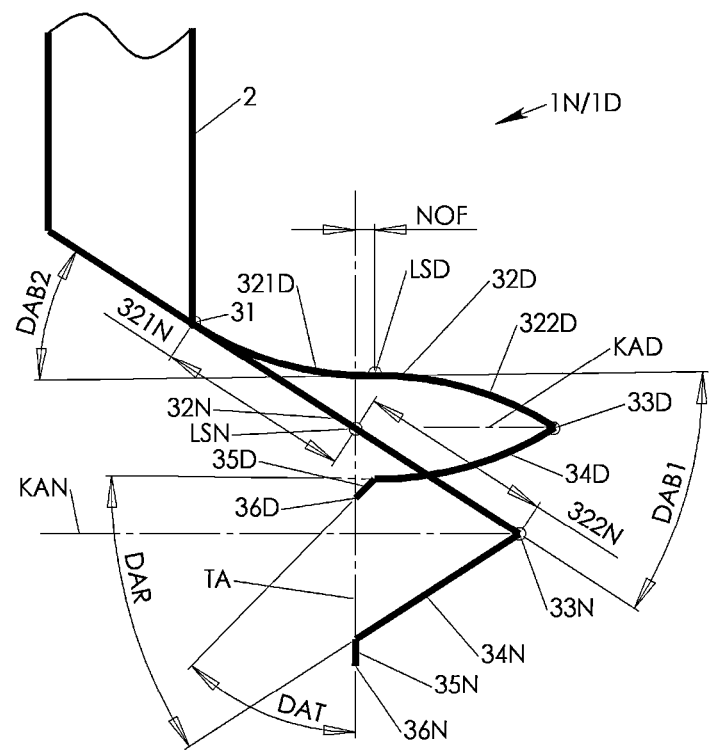
FIG. 9 is a schematic front view of a suspension knee in deflected and non deflected condition.
Figure 10:
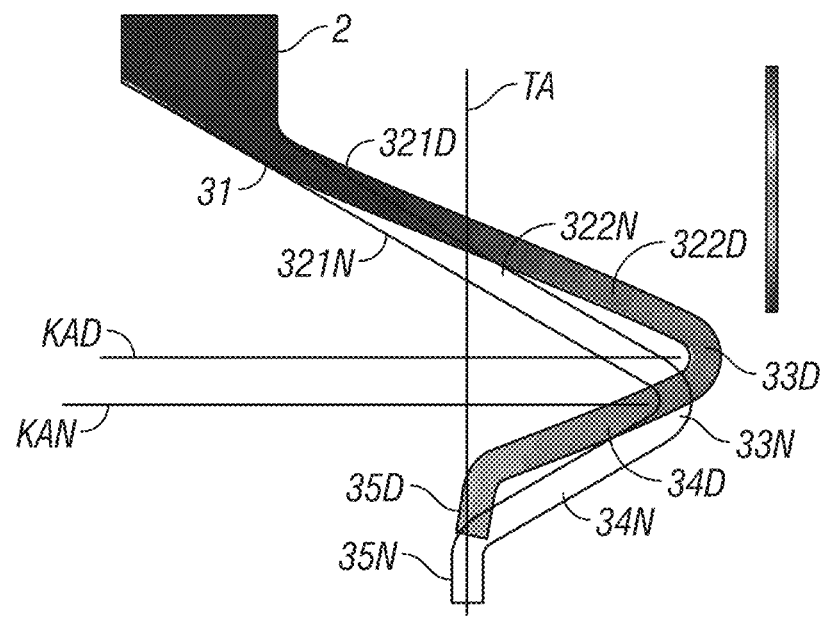
FIG. 10 is a front view of a spectral displacement plot of a configured suspension. knee.
Figure 11:
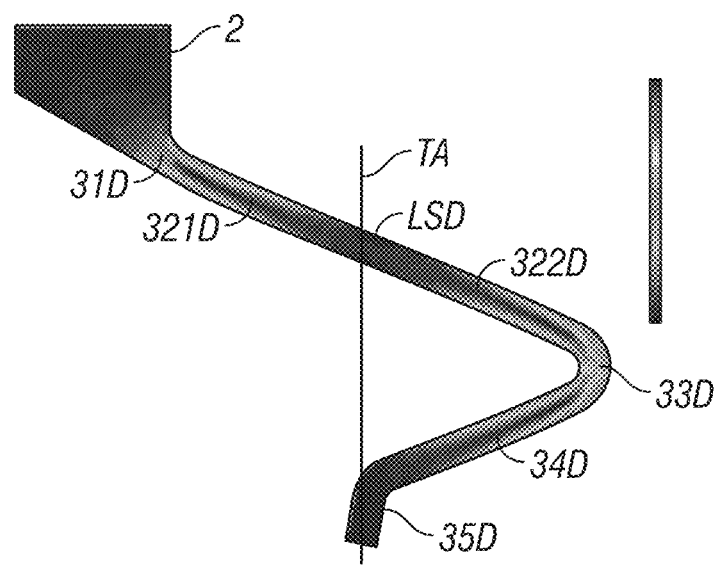
FIG. 11 is a front view of a spectral stress plot of the suspension knee of FIG. 10.

To facilitate the assembly of large numbers of probes 1, a number of probes 1 may be simultaneously fabricated as a probe comb 11 as is exemplarily illustrated in FIG. 8. The probe comb 11 is held together by a probe bridge 6 connected to each of the arrayed probes' 1 peripheral end 21. A number of probe combs 11 may be stacked with second pitch PY in protrusion direction of the probe comb 11, forming large two dimensional probe arrays. Individual probe combs 11 may be spaced apart by spacers that provide second gaps GY. The probe combs 11 may be held in alignment along second pitch PY direction by surrounding frame structures and/or by form features on both sides of the spacers. The form features may fit into the gaps GX. The probe combs 11 may alternately be assembled by inserting them with there probe bridges 6 in correspondingly shaped grooves of a template plate (not shown).

After the probe combs 11 are positioned with respect to each other, they may be fixed by use of a resin filled into the gaps between the probes 1. After curing of the resin, the probe bridges 6 may be removed and the individual probes 1 conductively accessed as described above.

Suspension connect 31, base arm 32, knee bent 33, reverse arm 34, and contacting tip 35 may have various tuned configurations resulting in varying scrub motions. Referring to FIGS. 9-13 a first tuned configuration is described in which a lateral scrub motion with respect to the tip axis TA is substantially zero. In FIGS. 9-19, numerals pertaining to the deflected elements of the suspension knee 3 have a suffix letter D, whereas numerals pertaining to non deflected elements of the suspension knee 3 have a suffix letter N. contacting force resulting from the operative approach of the contacting tip 35 on a test contact 210 (see FIGS. 20, 21) may act upon the contacting face 36N/36D along the tip axis TA. Where the tip axis TA crosses the base arm 32N/32D, the base arm 32N/32D has its local bending stresses at a minimum as can be seen in the spectral stress plots of FIGS. 11, 13 and 15, 18. At these tow stress regions LS, LSN/LSD, the central base arm portion 3211) has its maximum angular central base arm deflection DAB1 with respect to the central base arm portion's 321N natural orientation and the peripheral base arm portion 322D has its maximum angular peripheral base arm deflection DAB2 with respect to the peripheral base arm portion's 322N natural orientation. This is, because a first bending momentum acting on the central base arm portion 321N/321D is opposing a second bending momentum acting on the peripheral base arm portion 322N/322D. According to FIG. 9, the first bending momentum and the second bending momentum act counter clock wise or generally speaking in a direction away from the upper portion of the column axis CA. The first bending momentum hinges thereby on the suspension connect 31 and the second bending momentum hinges on the knee bent 33.

A third bending momentum acts on the reverse arm 34N/34D hinging on the knee bent 33 generally in direction opposite the second bending momentum. According to FIGS. 10, 11, the third bending momentum acts clock wise. First, second and third bending momentums result from the contacting force as may be well appreciated by anyone skilled in the art. The third bending momentum results in a maximum angular reverse arm deflection DAR with respect to the reverse arm's 34N natural orientation.

The first tuned configuration includes dimensional and structural configurations of suspension connect 31, central base arm portion 321, peripheral base arm portion 322, knee bent 33 and reverse arm 34 such that maximum local angular deflections DAB1, DAB2 and DAR are substantially equal. An indication for the first tuned configuration is that the natural knee axis KAN of the non deflected suspension knee 3 is substantially parallel to the deflected knee axis KAD of the operationally deflected suspension knee 3.

During deflection of the central base arm portion 321N/321D a lateral offset NOF may be introduced to the remainder of the suspension knee 3 due to the geometric conditions and geometric relations of the deflected and non deflected central base arm portion 321N/321D as may be well appreciated by anyone skilled in the art. The contacting tip 35 may be configured in length and deflection behavior such that the lateral offset NOF may be substantially compensated for. At the contacting face 36D, the contacting tip 35D may consequently have a maximum angular tip deflection DAT contributing to the scrub motion. Hence, in the first tuned configuration, the scrub motion includes substantially only angular movement of the contacting face 36.

Figure 12:
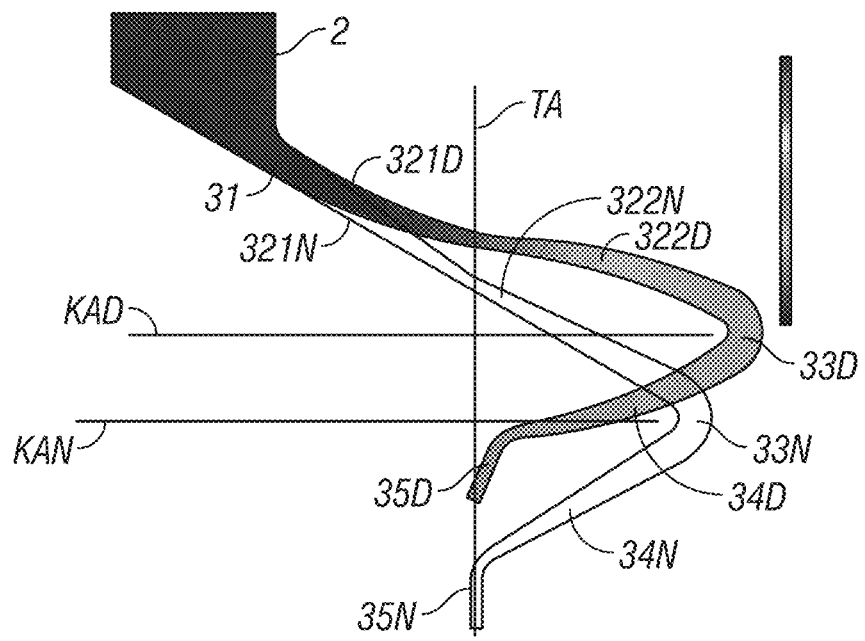
FIG. 12 is a front view of a spectral displacement plot of another configured suspension knee.
Figure 13:
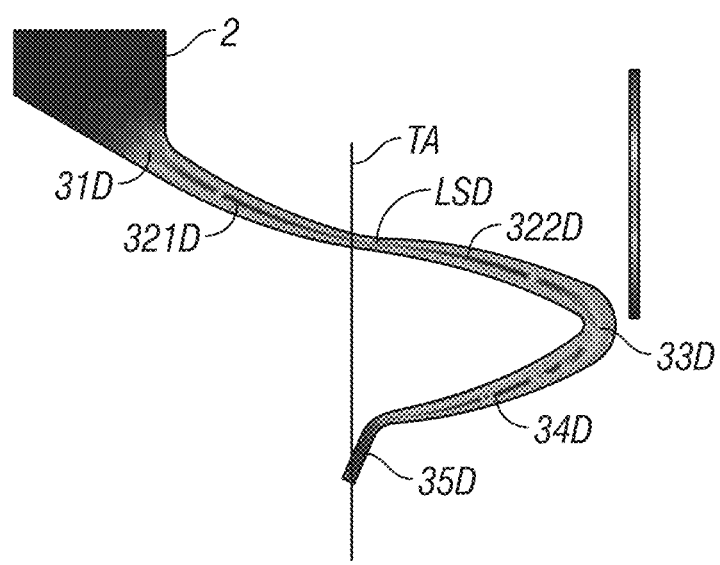
FIG. 13 is a front view of a spectral stress plot of the suspension knee of FIG. 12.

For a required contacting force, the operational deflection of the suspension knee 3 may be adjusted by configuring the elements of the suspension knee 3 for a leveled stress maxima as can be seen in the FIGS. 12, 13. There, the cross sections are adjusted with continuous thickness TH such that stress maxima propagate highly continuous along suspension connect 31, central and peripheral base arm portions 321, 322, knee bent 33, reverse arm 34 and contacting tip 35. Optimizing the suspension knee 3 with constant thickness TH is particularly preferred in combination with continuous profile of probe 1 and fabrication techniques layered in profile direction such as well known electroplating in combination with a negative mask corresponding to the contour of the probe's 1 continuous profile. Nevertheless, the suspension knee 3 may also optimized by varying the thickness TH as may be appreciated by anyone skilled in the art.

Figure 14:
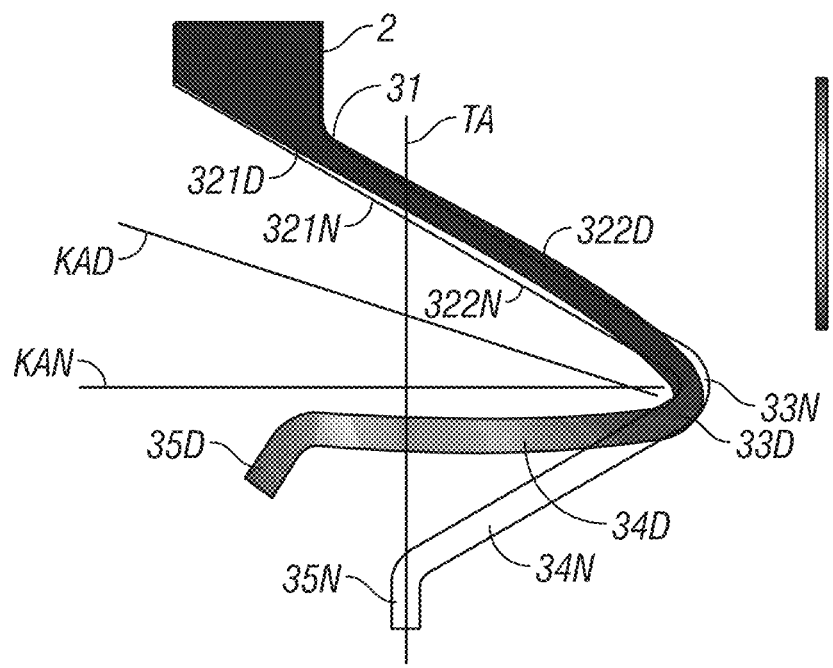
FIG. 14 is a front view of a spectral displacement plot of another configured suspension knee.
Figure 15:
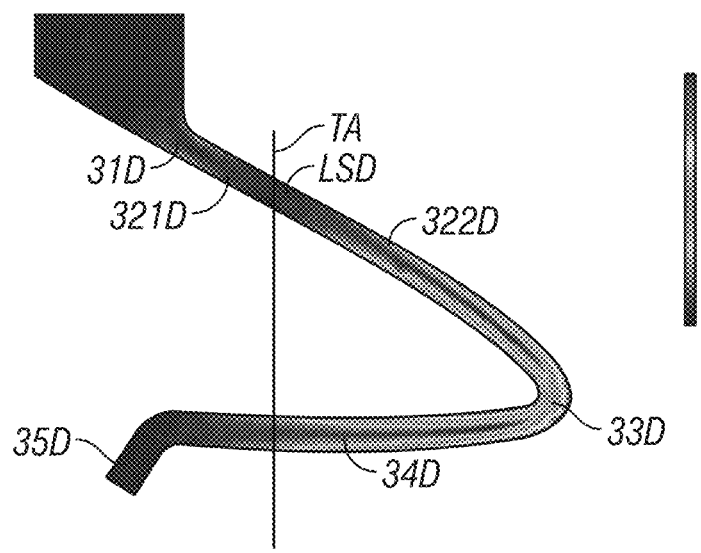
FIG. 15 is a front view of a spectral stress plot of the suspension knee of FIG. 14.
Figure 16:
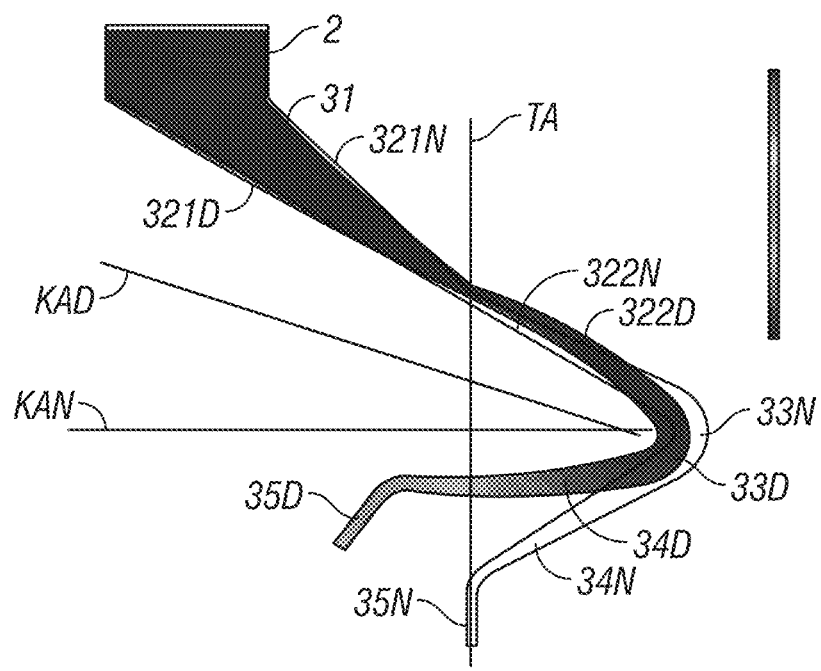
FIG. 16 is a front view of a spectral displacement plot of another configured suspension knee.

Referring to FIGS. 14-16, a second tuned configuration of the suspension knee 3 provides a scrub motion in direction towards the column axis CA. According to FIGS. 14 and 15, the second tuned configuration may be provided for a continuously shaped base arm 32 by extending the reverse arm 34 such that the tip axis TA divides the base arm into a central base arm portion 321 that is shorter than the peripheral base arm portion 322. Consequently, the maximum angular deflection DAB1 of central arm portion 321D is smaller than the maximum angular deflection DAB2 of the peripheral arm portion 322D. Since base arm 32 and reverse arm 34 have substantially equal and continuous cross sections, DAB2 is equal DAR. The summary of DAB1, DAB2 and DAR results generally in a tilt of the displaced knee axis KAD in direction away from the upper portion of the column axis CA. With respect to FIGS. 14 and 16, the displaced knee axis KAD is tilted in clockwise direction with respect to the natural non deflected knee axis KAN. The resulting lateral scrub motion is in direction towards the central axis CA. FIG. 15 depicts the corresponding stresses.

The same condition of DAB1 being smaller than DAB2 with DAB2 being equal DAR is depicted in FIG. 16. There, the central base arm portion 321 is configured with larger bending stiffness than the peripheral base arm portion 322. Even though the tip axis TA is at a distance to CA equal to the above described first tuned condition of FIGS. 9-13, the dissimilar structural configuration of both base arm portions 321, 322 is the prevailing condition determining the direction and magnitude of the scrub motion.

Figure 17:
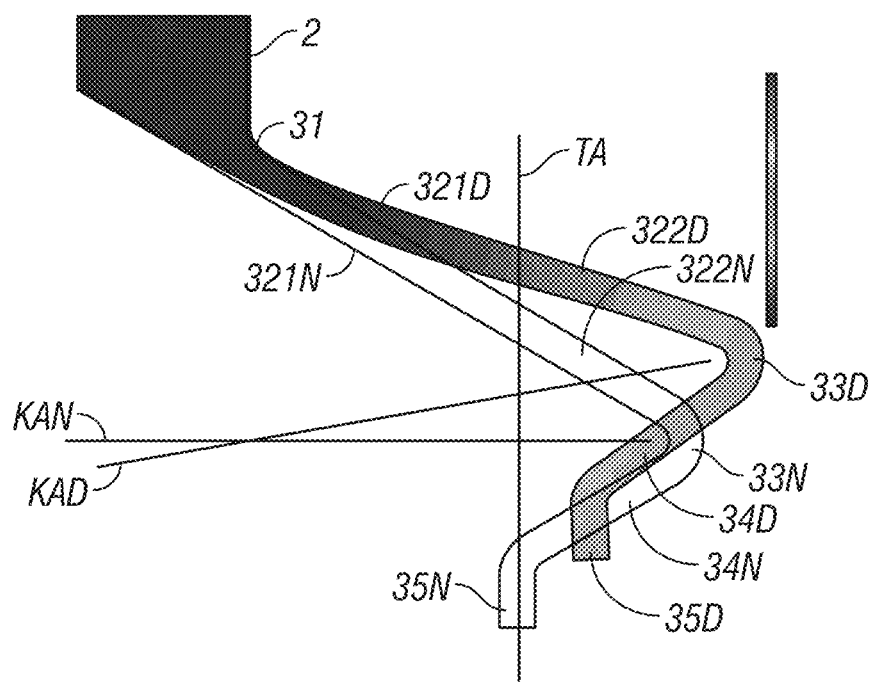
FIG. 17 is a front view of a spectral displacement plot of another configured suspension knee.
Figure 18:
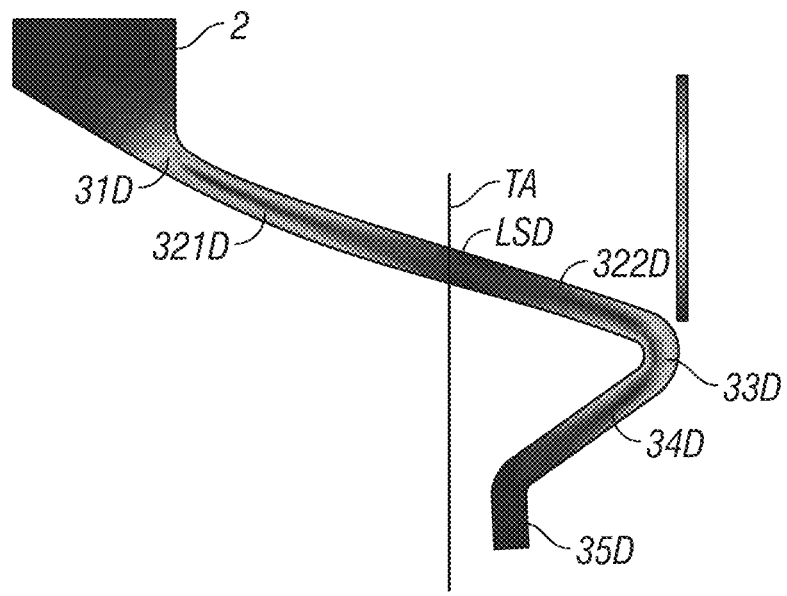
FIG. 18 is a front view of a spectral stress plot of the suspension knee of FIG. 17.

The teachings of FIGS. 14-16 may be inverted to obtain a third tuned configuration in which the scrub motion is in a direction away from the central axis CA as may be well appreciated by anyone skilled in the art. Accordingly and as shown in FIGS. 17, 18, the suspension knee 3 is configured with the tip axis TA dividing the base arm 32 in a central base arm portion 321 that is longer than the peripheral base arm portion 322. Despite continuous cross sections of base arm 32 and reverse arm 34, DAB1 being larger than DAB2 results in a scrub motion away from the central axis CA irrespective of DAB2 being equal DAR, which is illustrated in FIG. 17 by the deflected knee axis KAD being rotated in counter clockwise direction with respect to the natural knee axis KAN or generally speaking, in the third tuned configuration the deflected knee axis KAD is rotated with respect to the natural knee axis KAN in direction towards the upper portion of the column axis CA.

Figure 19:
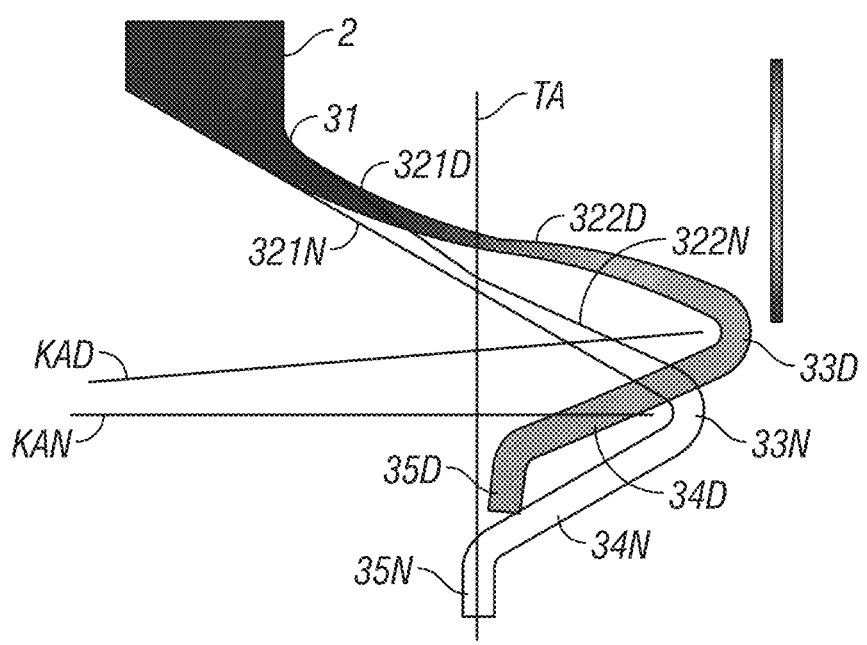
FIG. 19 is a front view of a spectral displacement plot of another configured suspension knee.

Second or third tuned configuration may be obtained also by adjusting the reverse arm's 34 deflection behavior in conjunction with the peripheral base arm portion's 322 deflection behavior as illustrated in FIG. 19. There, the base arm portions 321, 322 are configured with equal deflection behavior such that DAB1 equals DAB2. The reverse arm 34 on the other hand is stiffer than the peripheral arm portion 322 resulting in DAR being smaller than DAB2 and consequently a third tuned configuration with a linear scrub motion away from the central axis CA. In case, the reverse arm 34 would be less stiff than the peripheral base arm portion 322, the second tuned configuration would be established with the linear scrub motion towards the central axis CA.

As may be well appreciated by anyone skilled in the art, the teachings presented under the FIGS. 9-19 may be well applied to configure various shapes of the suspension knee's 3 elements. Further more, the contacting force represented in the Figures by the tip axis TA may be adjusted in angle with respect to the column axis CA. Consequently, for a given geometry of the suspension knee 3, first, second or third tuned configuration may be provided by assembling the probe 1 with its column axis CA in predetermined angle with respect to the contacting force defined by the probe apparatus in conjunction with the test contact 210 (see FIGS. 20, 21) as may be well appreciated by anyone skilled in the art. For example, the probe 1 may be provided with a first tuned configuration in case of the tip axis TA being parallel to the column axis CA. Tilting such probe 1 in direction towards its knee 33 may result in a second tuned configuration whereas a tilting of such probe 1 in direction away from its knee 33 may result in a third tuned configuration. Tilting the probe 1 may be a convenient technique of fine tuning the linear scrub motion in direction and magnitude without need to remanufacture the probe 1.

Figure 20:
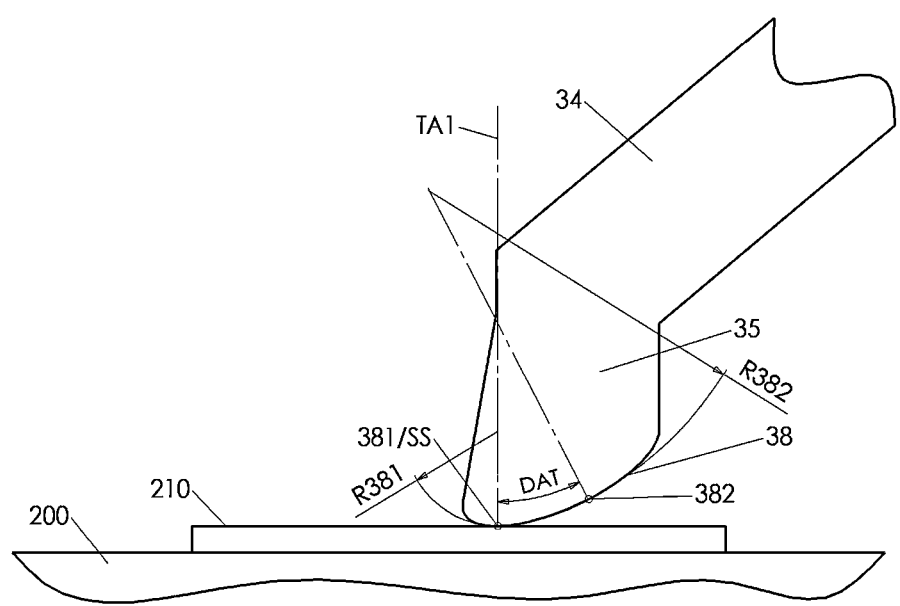
FIG. 20 is a front view of a multiradius contacting tip in initial contact with a test contact.
Figure 21:
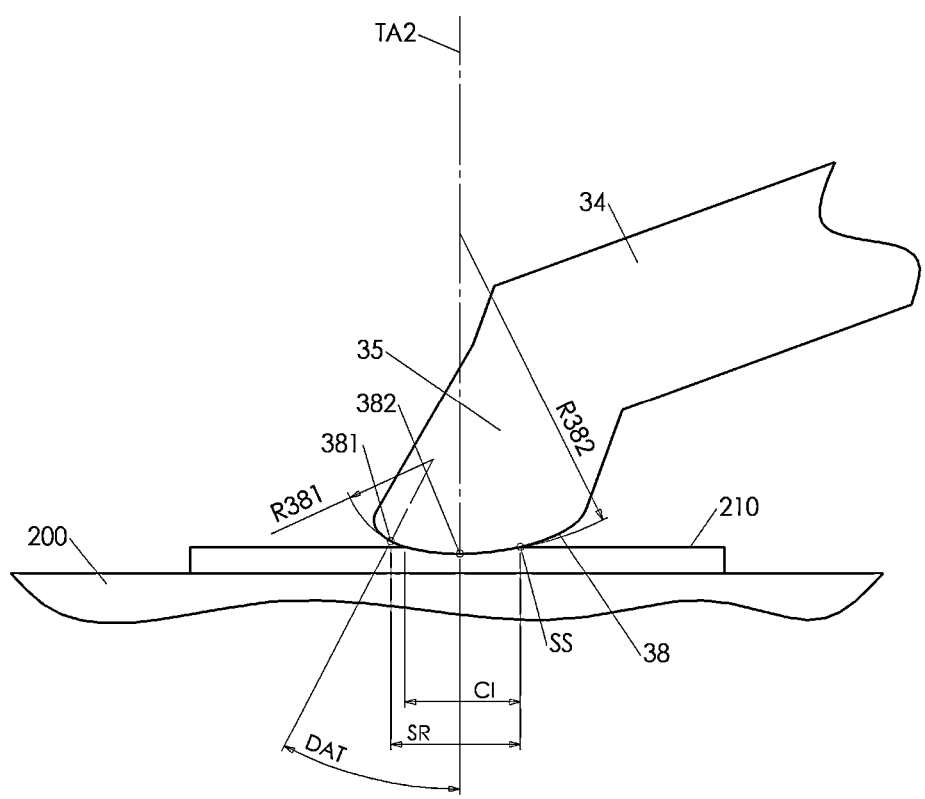
FIG. 21 is the front view with the multiradius contacting tip of FIG. 20 in operational contact with the test contact of FIG. 20.

As taught under FIGS. 9-19, scrub motion may be adjusted for its lateral movement component in direction and, magnitude and for its angular movement component in magnitude as may be well appreciated by anyone skilled in the art. The advantageous combination of angular and lateral scrub motion adjustability may be combined with a multi-radius contacting face 38 as illustrated in FIGS. 20, 21. The multi-radius contacting face 38 may have at least a first contacting radius R381 at the initial contacting region 381 where the multi-radius face 38 initially contacts the test contact 210 of a tested electronic device 210. An initial tip axis TA1 may origin in the initial contacting region 381.

As the probe 1 is brought into operational deflection with respect to the test contact 210, the multi-radius face 38 may be rotated with maximum tip deflection angle DAT such that an operational contacting region 382 comes into contact with the test contact 210. An operational tip axis TA2 may origin from the central interface between operational contacting region 382 and the test contact 210. Between initial contacting at scrub start location SS and operational contacting, the multi-radius face 38 prescribes a lateral scrub SL and an angular scrub equal DAT. Orientation of TA1 and TA2 may be affected by friction in the tip/contact interface CI as may be well appreciated by anyone skilled in the art.

The operational contacting region 382 has second contacting radius R382 substantially larger than first contacting radius R381. The multi-radius face 38 hence features at least two radii R381, R382 that contribute to a smooth and continuously curvature of the multi-radius face 38. The two radii R381, R382 may be selected in conjunction with the change of contacting force as a function of angular tip displacement such that contacting pressure in the tip/contact interface CI remains within a predetermined limit.

Multiple Layered Probes

Figure 22:
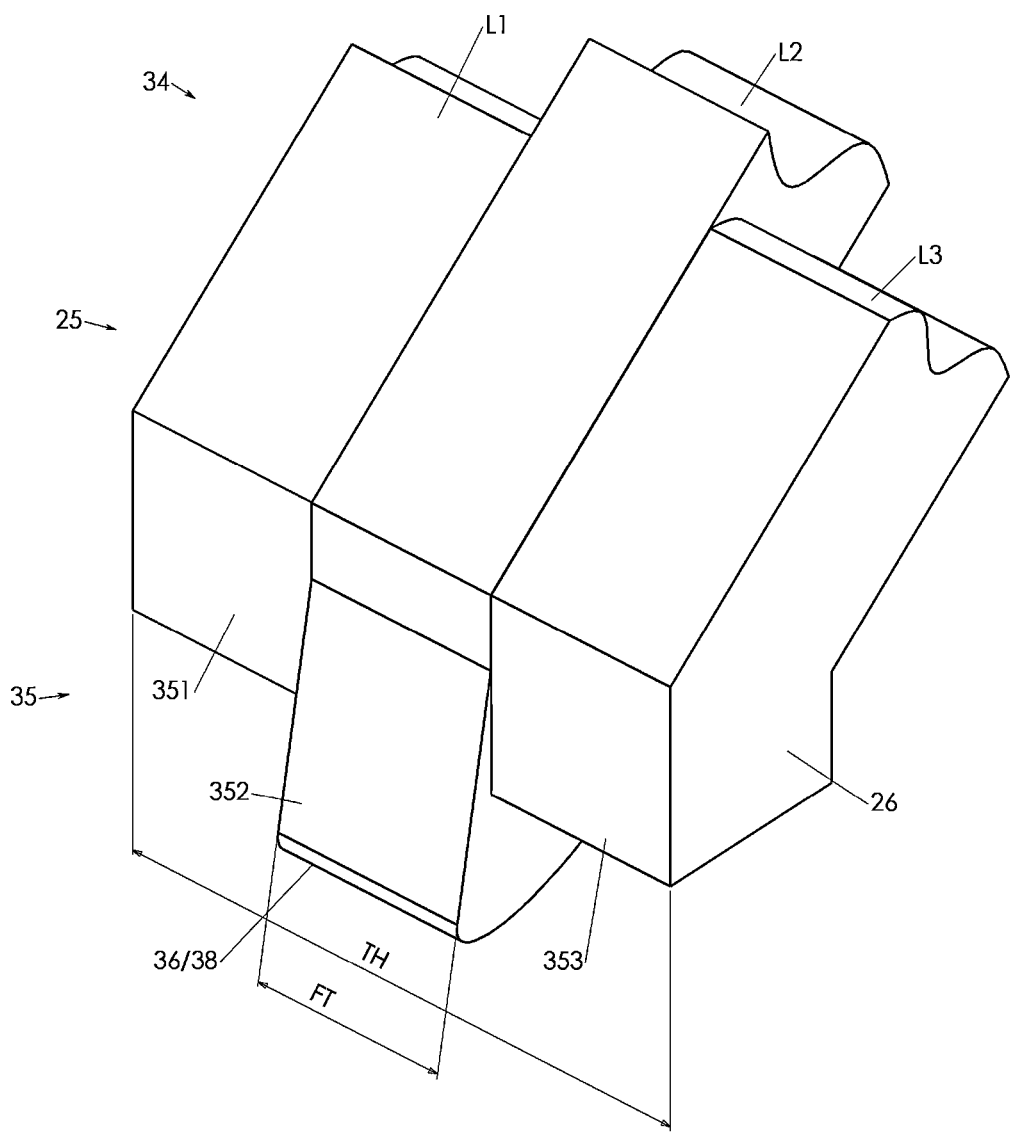
FIG. 22 is a fourth perspective view of a contacting tip with three tip segments.

Referring to FIG. 22, area of and pressure in the tip/contact interface CI may also be adjusted by varying the contacting face thickness FT to levels less than the probe thickness TH. Also, the contacting tip 35 may be split into tip segments 351, 352, 353 of which one or more may provide contacting face(s) 36 or 38. For that purpose, the probe 1 may be fabricated from a number of layers L1, L2, L3 deposited in multiple steps for example by electroplating in combination with multiple masks as may be well appreciated by anyone skilled in the art. The layers L1, L2, L3 may partially and/or fully extend across the probe's 1 profile contour and may be made of materials suitable for their particular task. For example, the layer L2 illustrated in FIG. 22 with the contacting face 36 may be fabricated from a material specifically suitable for probe tips such as rhodium. A single contacting thee 36 or 38 may be placed centrally as shown in FIG. 22. Alternatively, dual contacting faces 36 or 38 may be provided by tip segments 351, 353, one adjacent the front face 25 and the other adjacent the back face 26. This may also assist in stabilizing the suspension knee's 3 deflection behavior within the symmetry plane SP and to reduce the risk of inadvertent lateral scrub motion deviations.

The contacting tips 351, 352, 353 may be arranged in a tripod like fashion with each contacting segment having a contacting face 36 or 38 for providing a self centering contacting on a test contact in the well known spherical configuration. The suspension knee 3 may be layered in direction along the symmetry plane SP. The layer configuration may also be adjusted in view of low surface resistance for high frequency current flow from the contacting tip 36 or 38 to the peripheral end 21 or the column 2. Tip segments 351, 352 and 353 may also be fabricated from same material resulting in a monolithic structure.

The spectral plots of FIGS. 10-19 are generated with a commercially available FEA software.

Probes with a Shank and a Knee

Figures 23A, 23B:
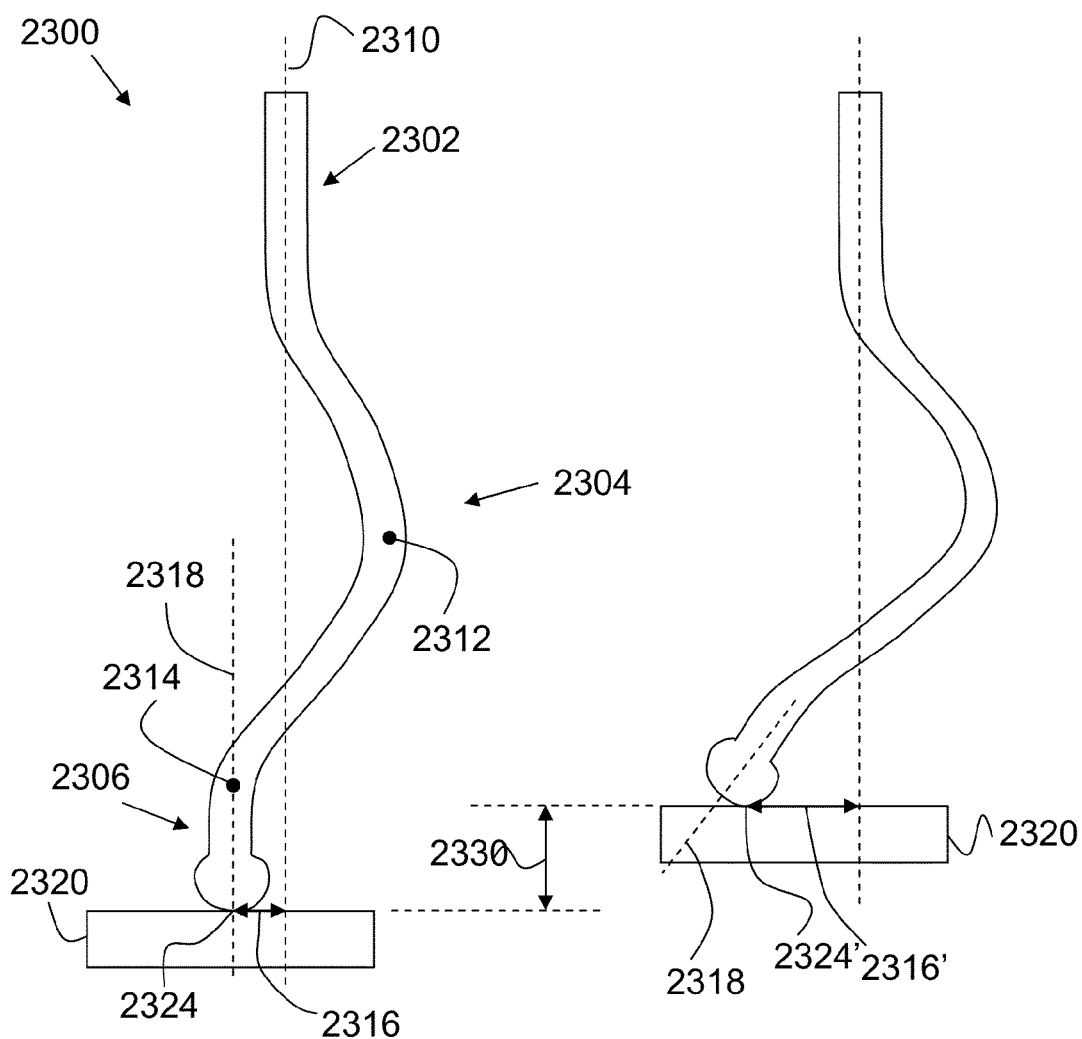
FIG. 23a shows a first contact probe configuration according to an embodiment of the invention.
FIG. 23b shows an operational probe configuration according to an embodiment of the invention.

Referring to FIG. 23a, a "first contact" probe configuration is illustrated according to an embodiment of the invention. FIG. 23b shows a corresponding operational probe configuration. Here "first contact" refers to the situation where a probe is in contact with a contact pad, but no contact force is applied. in contrast, an operational probe configuration makes contact with the contact pad with a predetermined contact force. Since the probe deforms in response to the contact force, the shape of the probe differs in the two cases. In particular, how the probe moves from the first contact configuration to the operational configuration is a key aspect of the invention.

A probe 2300 includes a shank 2302, a knee section 2304 and a probe tip 2306 as parts of a single structure, as shown. Shank 2302 is straight and does not deflect appreciably during contact, so it is convenient to regard shank 2302 as defining a probe axis 2310 with which it is aligned. Knee section 2304 extends from shank 2302 to probe tip 2306, and includes two parts. A first part of knee section 2304 starts at shank 2302 and extends outward from probe axis 2310 to reach a knee point 2312. Knee point 2312 is a point of maximum separation from probe axis 2310. A second part of knee section 2304 starts at knee point 2312 and extends to a tip location 2314, such that probe axis 2310 is between knee point 2312 and tip location 2314. A lateral tip offset 2316 is thereby defined between the probe tip and the probe axis. Probe tip 2306 is in contact with a contact pad 2320 defining a contact point 2324.

Thus knee section 2304 can be regarded as extending outward for a certain distance D (the first part) and then curving back for a distance greater than D (the second part), thereby establishing the lateral offset 2316. The present inventor has found that this probe configuration can provide improved probing performance. For comparison, U.S. patent application Ser. No. 10/850,921 by the present inventor considers a knee probe having a knee which curves back by a distance less than D (i.e., it does not overshoot the probe axis).

FIG. 23b shows the corresponding operational probe configuration for the example of FIG. 23a. Here contact pad 2320 is moved toward probe shank 2302 by a vertical displacement 2330. Equivalently, a predetermined contact force is applied to the probe shank. For any particular probe design, there is a one to one relation (i.e., this relation is a mathematical function, which can be linear or nonlinear) between vertical displacement and contact force, as is well known in the art, so both ways of describing the operational configuration are employed interchangeably in the following description. Probe 2300 deforms under the contact force, and FIG. 23b shows key parameters of this deformation. More specifically, contact point 2324' on FIG. 23b is farther from probe axis 2310 than the corresponding contact point 2324 on FIG. 23a. Thus the probe tip slides along the contact pad for a certain distance (i.e., the difference between 2316' and 2316 on FIGS. 23a-b). In addition to this sliding motion, the probe tip also "rocks" relative to the contact pad. This rocking motion can be more clearly appreciated by defining a "tip axis" 2318 on FIG. 23a which is required to be parallel to probe axis 2310 and which passes through the contact point 2324. In the operational configuration of FIG. 23b, tip axis 2318 is no longer parallel to probe axis 2310. The angle between tip axis 2318 and probe axis 2310 on FIG. 23b is a measure of the amount of rocking motion provided.

Thus the scrub motion provided in this example includes both a sliding motion of the probe tip relative to the contact pad, and a rocking motion of the probe tip relative to the contact pad. A key aspect of the invention is that parameters of the scrub motion (e.g., slide length and rocking angle) can be predetermined, in part, by geometrical parameters of the probe and by the predetermined contact force (or equivalently, predetermined vertical displacement). More explicitly, a probing method according to the invention includes: providing a probe having the general configuration of FIG. 23a (i.e., having a knee section with an overshoot), making contact between the probe tip and a device under test, and applying a predetermined contact force to the probe shank, thereby providing a predetermined scrub motion of the probe tip on the contact pad. The scrub motion is predetermined in part by the contact force and by geometrical parameters of the probe.

The friction provided by the contact pad is also a relevant factor for determining the scrub motion, so probe designs and/or methods will typically need to account for variations in contact pad friction. The speed with which contact is made has also been found to be relevant. More specifically, the sliding motion length on the contact pad (also referred to as scrub length) tends to decrease as the relative contact velocity between probe tip and contact pad increases. Another method of further controlling the scrub length is by laterally moving the probe as contact is made. Lateral probe motion in the direction of the tip offset will increase the scrub length, and lateral probe motion in the opposite direction will decrease the scrub length. Such lateral probe motion can be provided by appropriate motion control of a chuck holding the probe (or probes), or by appropriate motion control of a stage holding the device under test. Further scrub length control can be provided by controlling relative velocity and/or lateral probe motion. Scrub length can be measured after probing has occurred by measuring the length of the mark left by the probe on the contact pad. Such measurements are important for verifying proper probe performance.

A scrub motion including both a sliding motion and a rocking motion has provided improved results in practice. Investigations indicate that the sliding motion acts to scrape non-conductive material from the contact pad to create an exposed area of the contact pad, and the rocking motion acts to bring a clean part of the probe tip into contact with the freshly exposed area of the contact pad. From FIGS. 23a-b, it is apparent that the rocking motion causes a different point of the probe tip to be in contact with the contact pad in the operational configuration than in the "first contact" configuration. Providing a scrub motion including both of these motions is therefore preferred.

Suitable materials for probe 2300 and probe tip 2306 are well known in the art, and any such materials can be employed in practicing the invention. Suitable tip materials are electrically conductive and wear-resistant, and include Rh and Cr.

Detailed design work in accordance with the above-identified principles of the invention has led to a point design as well as identification of some preferred parameter ranges. A point design for making contact to Cu or Al contact pads (or flat topped columns) has a tip offset (2316 on FIG. 23a) of approximately 0 to 0.3 mm and preferably approximately 0.1 to 0.2 mm and more preferably approximately 0.18 mm, a knee offset (distance between knee point 2312 and probe axis 2310 on FIG. 23a) of approximately 0 to 0.7 mm and preferably approximately 0.1 to 0.5 mm and more preferably approximately 0.31 mm, and a probe length (combined length of probe tip and knee section in Z direction on FIG. 23a) of approximately 0 to 5 mm and more preferably approximately 1 to 3 mm and more preferably approximately 1.95 mm. In this point design, the probe width is approximately 0 to 0.2 mm and more preferably approximately 0.05 to 0.1 mm and more preferably approximately 0076 mm, and the probe material is Nickel-Cobalt alloy. The tip offset is preferably in a range from about 0.05 mm to about 0.25 mm. The knee offset is preferably in a range from about 0.05 mm to about 0.5 mm. The probe length is preferably between about 0.5 mm and about 3.0 mm.

For a configuration with a small knee offset and large tip offset one can expect a longer scrub length. For a configuration with large knee offset and small tip offset, a shorter scrub length is expected. Large contact friction requires a probe design that generates larger horizontal reaction force typically produced with larger scrub length. Smoother, less frictional contact pad surfaces require a probe design producing a shorter scrub length.

As indicated above, for any particular probe, there is a predetermined relation between contact force and vertical deflection. As the probe stiffness increases, the amount of contact force required for a given vertical deflection increases. A typical vertical deflection in practice is about 75 µm (i.e. about 3 mils), and for this amount of deflection, the contact force is preferably between about 0.025 N and about 0.15 N (i.e., about 2.5 to 15 grams force), and is more preferably between about 0.08 N and about 0.10 N (i.e., about 8 to 10 grams force). The vertical deflection during contact is preferably between about 12 µm and about 125 µm and is more preferably between about 50 µm and about 75 µm.

Figure 29:
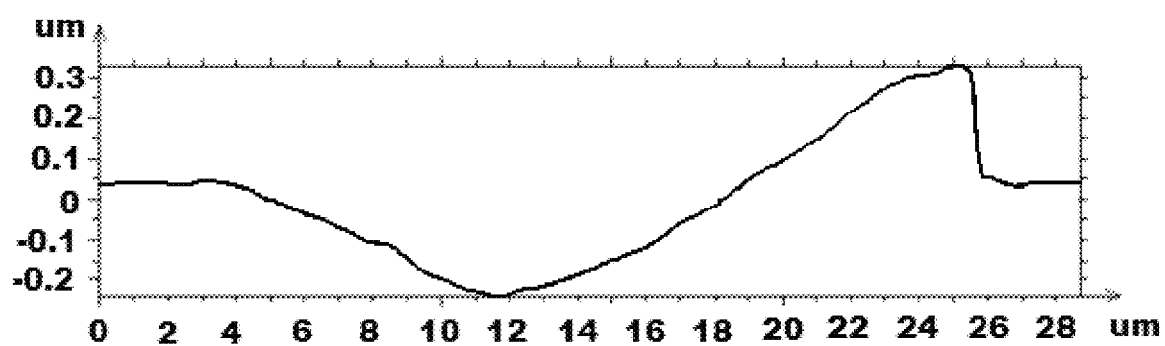
FIG. 29 shows a depth profile for a scrub mark made in accordance with an embodiment of the invention.

Another way to describe probing according to the invention is in terms of parameters of the scrub mark left on the contact pad by the probe. The scrub mark width is preferably between about 3.0 µm and about 15.0 µm and is more preferably about 7 µm wide. The scrub mark depth is preferably between about 0.1 µm and about 2.0 µm and is more preferably about 0.6 µm. FIG. 29 shows an example of a measured scrub mark depth profile. The scrub mark length is preferably between about 3.0 µm and about 44.0 µm and is more preferably about 10 µm. This description of scrub marks assumes Al or Cu contact pads.

Figure 24:
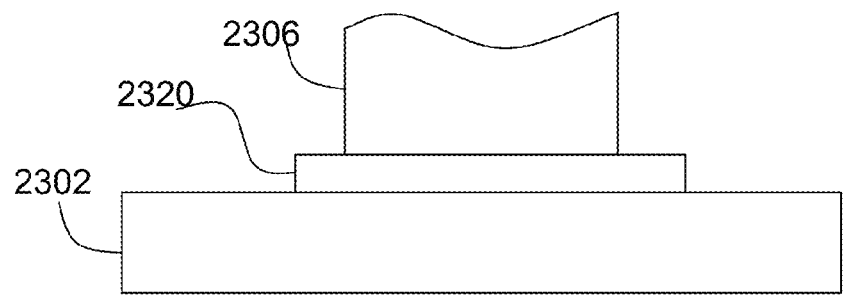
FIG. 24 shows a close up view of a probe tip making contact to a contact pad according to an embodiment of the invention.

FIG. 24 shows a close up view of a probe tip in contact with a contact pad. More specifically, probe tip 2306 makes contact with contact pad 2320 on a circuit (or device) 2402. Note that the view of FIG. 24 (and of FIGS. 25 and 26) differs from the view of FIGS. 23a-b by a 90 degree rotation about the Z-axis. Thus moving left or right on FIGS. 24-26 corresponds to moving into or out of the page of FIG. 23.

Probes with a Skate

Figure 25:
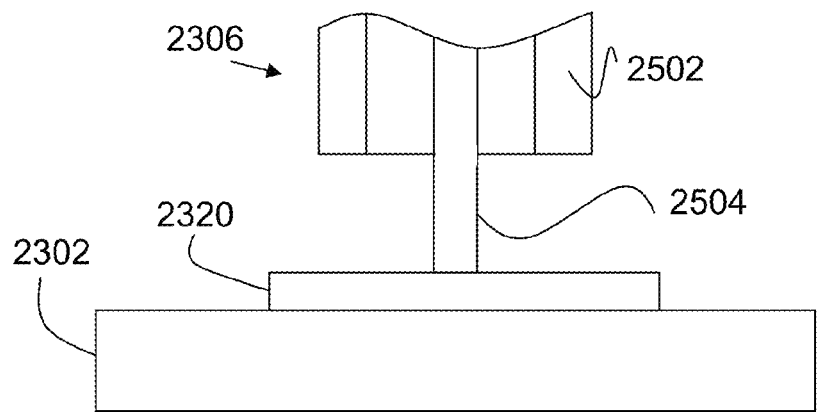
FIG. 25 shows a close up view of a probe tip making contact to a contact pad according to another embodiment of the invention.

FIG. 25 shows an alternative embodiment of the invention, where probe tip 2306 includes multiple layers (one of which is shown as 2502 and another of which is shown as 2504). Such a multilayer probe configuration provides several advantages. First, as shown on FIG. 25, one of the layers (2504 in this example) can extend past the others, thereby defining a "skate" having a width (i.e., y extent) substantially less than the width of probe tip 2306. Reducing the probe contact area can enhance scrub motion performance, because the force per unit area is thereby increased. However, decreasing the width of the entire probe can undesirably allow the probe to deflect in the y direction. A probe tip with a skate, as shown in FIG. 25, allows most of the probe to have a y-thickness sufficient to render y-deflection negligible, while also desirably reducing the contact area.

A further advantage of the multi-layer skate configuration of FIG. 25 is that only the skate layer (i.e., layer 2504) should be a material selected for suitability as a tip contacting material. The remaining layers (e.g., 2502) can be selected to optimize the overall probe performance without regard for their suitability as tip materials, since they never actually make contact with contact pad 2320.

Figure 26:
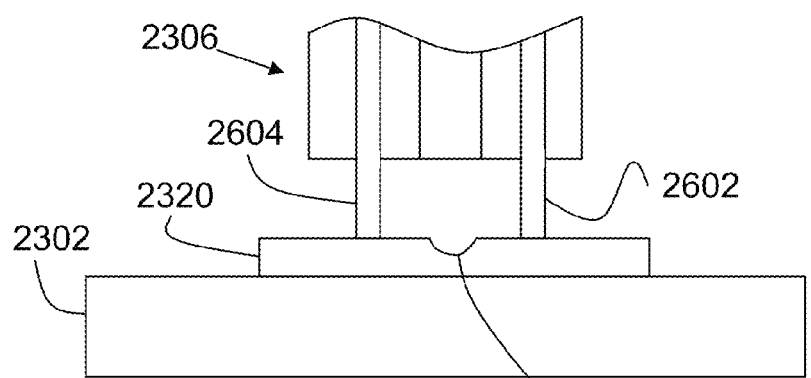
FIG. 26 shows a close up view of a probe tip making contact to a contact pad according to yet another embodiment of the invention.

FIG. 26 shows a dual-skate configuration, where probe tip 2306 includes two skates 2602 and 2604. This dual skate configuration is suitable for probing a contact pad 2320 having a dimple 2606 at its center. Such a dimple is characteristic of contact pads formed by metal plating (e.g. as in flip-chip wafers). Typical dimple dimensions are about 10 µm diameter on a contact pad having a 110 µm diameter, with the size of the dimple depending on the pitch of the contact pads. A single skate configuration as in FIG. 25 will undesirably require a choice between probing at the dimple location (which can degrade the electrical contact made by the probe), or off-center probing (which can be difficult to align). Probing at the dimple can also cause high mechanical stress on the probe if the probe tip gets caught by the dimple. In contrast, the dual-skate approach of FIG. 26 avoids probing the dimple, but still has the probe tip centered on the contact, thereby simplifying automatic probe alignment.

Figure 27A:
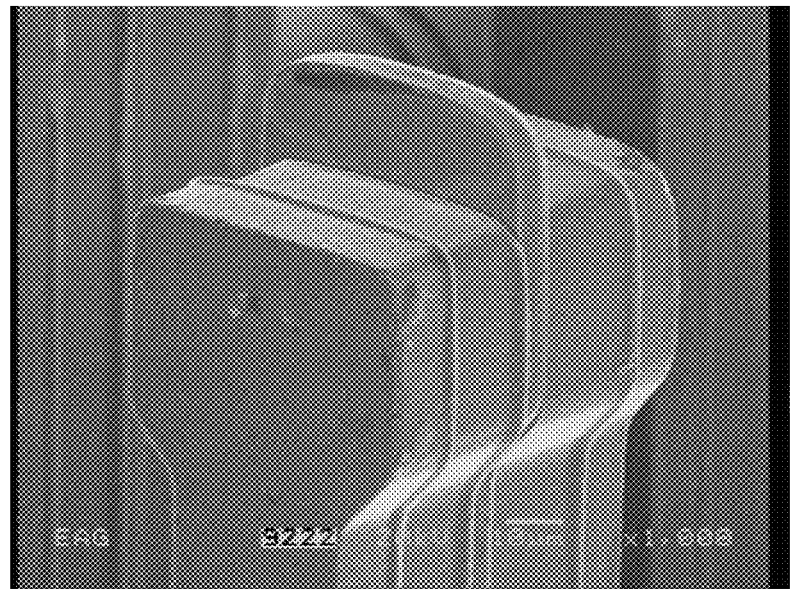
FIG. 27a shows a photograph of a probe tip.
Figure 27B:
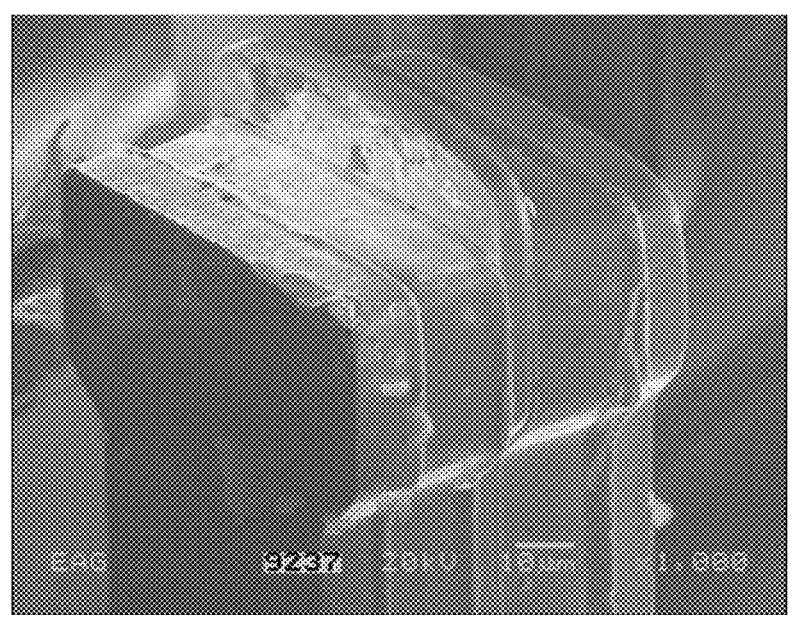
FIG. 27b shows a photograph of the probe tip of FIG. 27a after 1,000,000 probing cycles according to an embodiment of the invention.
Figure 28A:
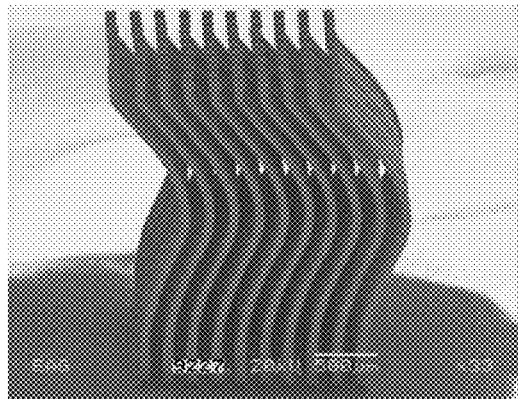
FIGS. 28a-d are photographs of probe array configurations suitable for use with embodiments of the invention.
Figure 28B:
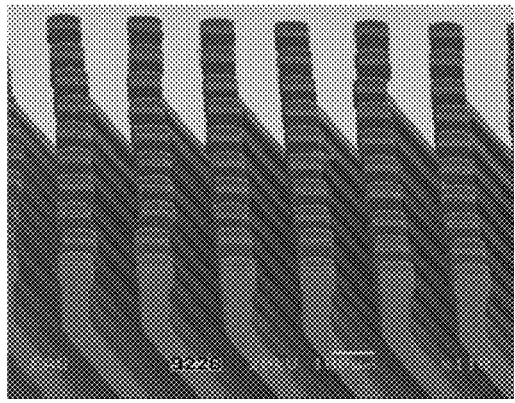
Figure 28C:
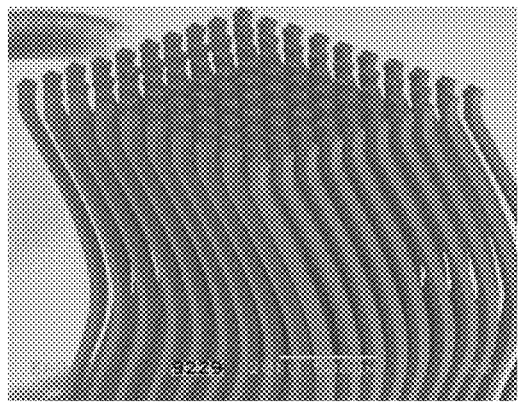
Figure 28D:
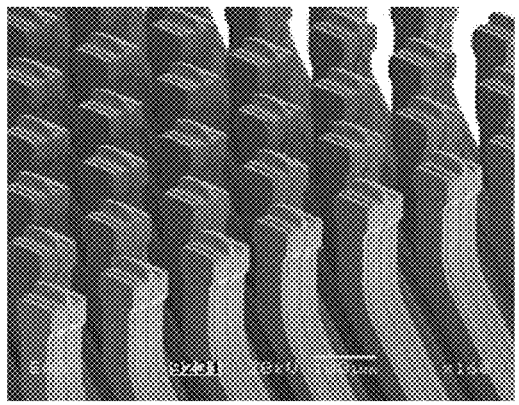

FIGS. 27a-b show results from an embodiment of the invention. More specifically, FIG. 27a is a photograph of a probe tip and FIG. 27b is a picture of the probe tip of FIG. 27a after 1,000,000 probing cycles according to the invention. The probe of this example is a mufti-layer single-skate configuration, as in FIG. 25. FIG. 27b shows no significant degradation of the probe tip, either by wear or by accumulation of debris.

FIGS. 28a-d are photographs of a probe array suitable for practicing the invention. Such arrays are often required in practice, since many circuits being tested have a large number of contact pads which must be probed. For probe arrays, it is important that each probe deform in a uniform and predictable manner when the contact force is applied, to prevent probe-to-probe contact resulting from probe deflection. Thus it is preferred for the probe configuration of FIGS. 23a-b to only deform in the X-Z plane responsive to the contact force, as also indicated above in connection with probe tip skates.

Probes with Variable Thickness

Figure 30:
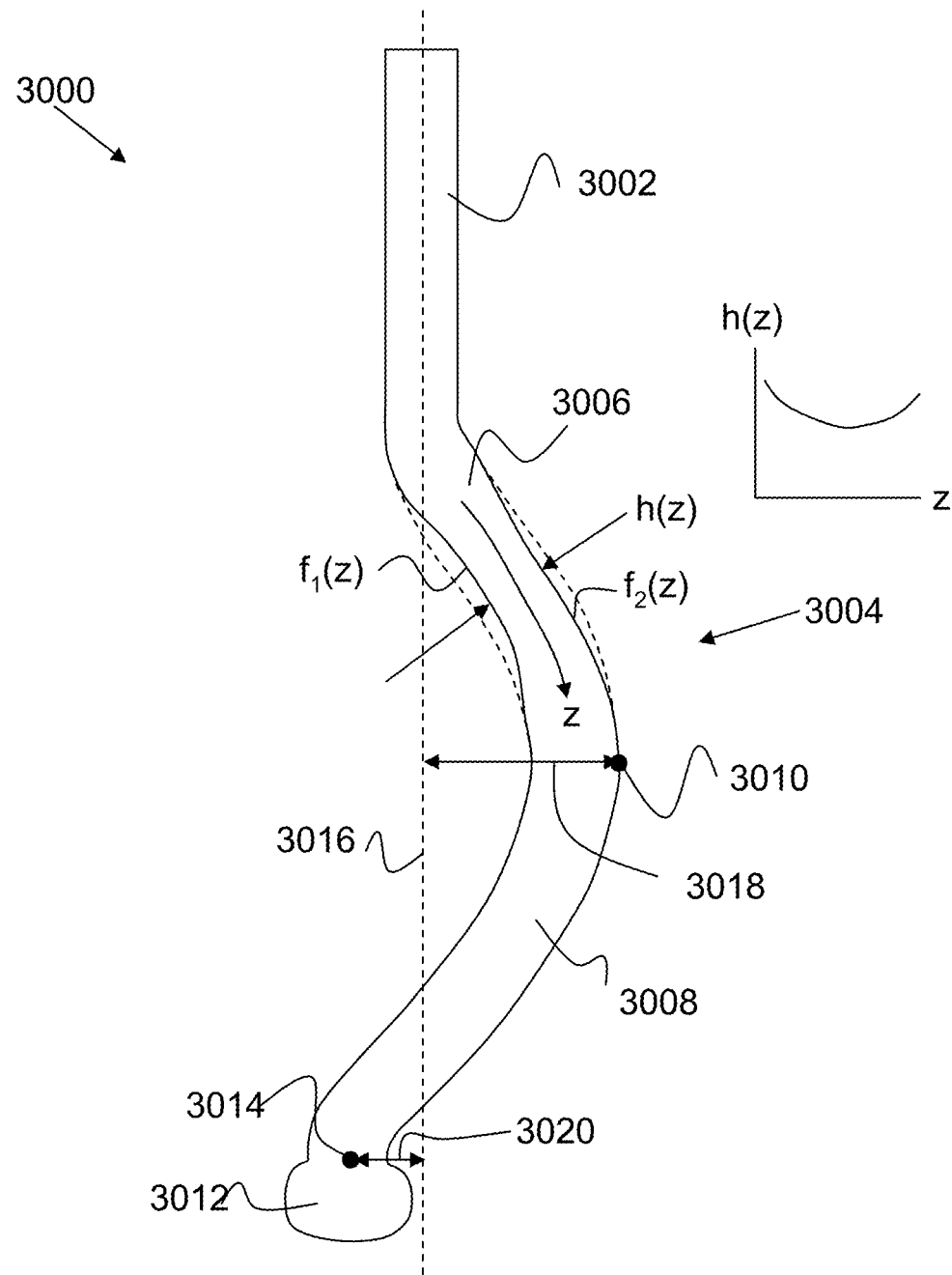
FIG. 30 shows a probe according to a first embodiment of the invention.

FIG. 30 shows a probe 3000 according to an embodiment of the invention. A shank 3002 defines a probe axis 3016. A curved knee section 3004 is connected to shank 3002 and includes an upper knee section 3006 and a lower knee section 3008. A probe tip 3012 is connected to an end of knee section 3004 opposite from the shank. Upper knee section 3006 extends outward from shank 3002 and reaches a knee point 3010 of maximum separation from probe axis 3016, thereby defining a lateral knee offset 3018 from the probe axis. Lower knee section 3008 extends from knee point 3010 toward probe axis 3016 and to a tip location 3014, thereby defining a lateral tip offset 3020 from the probe axis.

A probe plane includes and is thereby defined by probe axis 3016 and knee point 3010. In this example, the plane of FIG. 30 is the probe plane. A thickness of upper knee section 3006 in the probe plane varies along the length of the upper knee section according to a thickness function $h(z)$, where z is position along the probe. The upper knee section includes a reduced thickness section, as described above. More specifically, $h(z)$ has a local minimum located between shank 3002 and knee point 3010, as shown in the example of FIG. 30.

Suitable materials for shank 3002, knee section 3004 and probe tip 3012 are well known in the art, and any such materials can be employed in practicing the invention. Suitable tip materials are electrically conductive and wear-resistant, and include Rh and Cr. Known probe fabrication methods are applicable for fabricating embodiments of the invention. These methods include, but are not limited to, standard multi-layer metal deposition techniques such as plating, sputtering, photolithographic techniques and microelectromechanical systems (MEMS) techniques. No unusual fabrication difficulties due to the reduced thickness section arise in fabricating probes according to the invention.

Preferably, $h(z)$ varies smoothly (i.e., $h(z)$ is preferably continuous with a continuous first derivative) to avoid stress concentration at discontinuities and/or sharp corners of $h(z)$. It is also preferred for the minimum probe thickness (i.e., the local minimum of h(z)) to have a value between about 0.5 $h_{nom}$ and about 0.95 $h_{nom}$, where $h_{nom}$ is a nominal in-plane probe thickness. In some cases (e.g., as on FIG. 30), lower probe section 3008 has a roughly constant thickness $h_1$, and in such cases, $h_{nom}$ can equal $h_1$. In other cases, the nominal probe thickness $h_{nom}$ can be taken to be the maximum value of h(z) (i.e., the maximum thickness of the upper knee section). In either of these two cases, the nominal in-plane probe thickness $h_{nom}$ is typically between about 25 μm and about 55 μm, although the invention can also be practiced outside of this thickness range.

Preferably, h(z) varies smoothly along the entire length of upper knee section 3006, in order to minimize stress concentration for a given minimum thickness. it is also preferred for the probe thickness perpendicular to the probe plane to be somewhat higher than the nominal in-plane probe thickness, so that deformation of the probe is easiest in the probe plane. More specifically, the out of plane thickness is preferably between about 1.1 $h_{nom}$ and about 1.5 $h_{nom}$.

For a configuration with a small knee offset and large tip offset one can expect a. longer scrub length. For a configuration with large knee offset and small tip offset, a shorter scrub length is expected. Preferred probe design approaches depend on the friction between probe and contact pad. For large contact friction, probe designs that generate larger horizontal reaction force typically produced with larger scrub length are preferred. For smoother, less frictional contact pad surfaces, probe designs producing a shorter scrub length are preferred.

Preferably, the reduced thickness section is in the upper knee section as shown and described above, although the invention can also be practiced by having the reduced thickness section anywhere along the length of knee section 3004. Placing the reduced thickness section in the upper knee section tends to decrease scrub motion without appreciably decreasing the contact force, while placing the reduced thickness section in the lower knee section (e.g., as shown on FIG. 37) tends to decrease both scrub motion and contact force. More specifically, a negative tip offset probe having an upper knee section reduced thickness section tends to rotate toward the knee during deflection, thereby decreasing scrub motion. A probe having a lower knee section reduced thickness section tends to have increased flexibility (which reduces contact force). This reduced horizontal scrubbing force decreases the scrub motion. Probes having multiple reduced thickness sections can also be employed (e.g., one being in the upper knee section and the other being in the lower knee section) in practicing the invention.

Figures 31, 32:
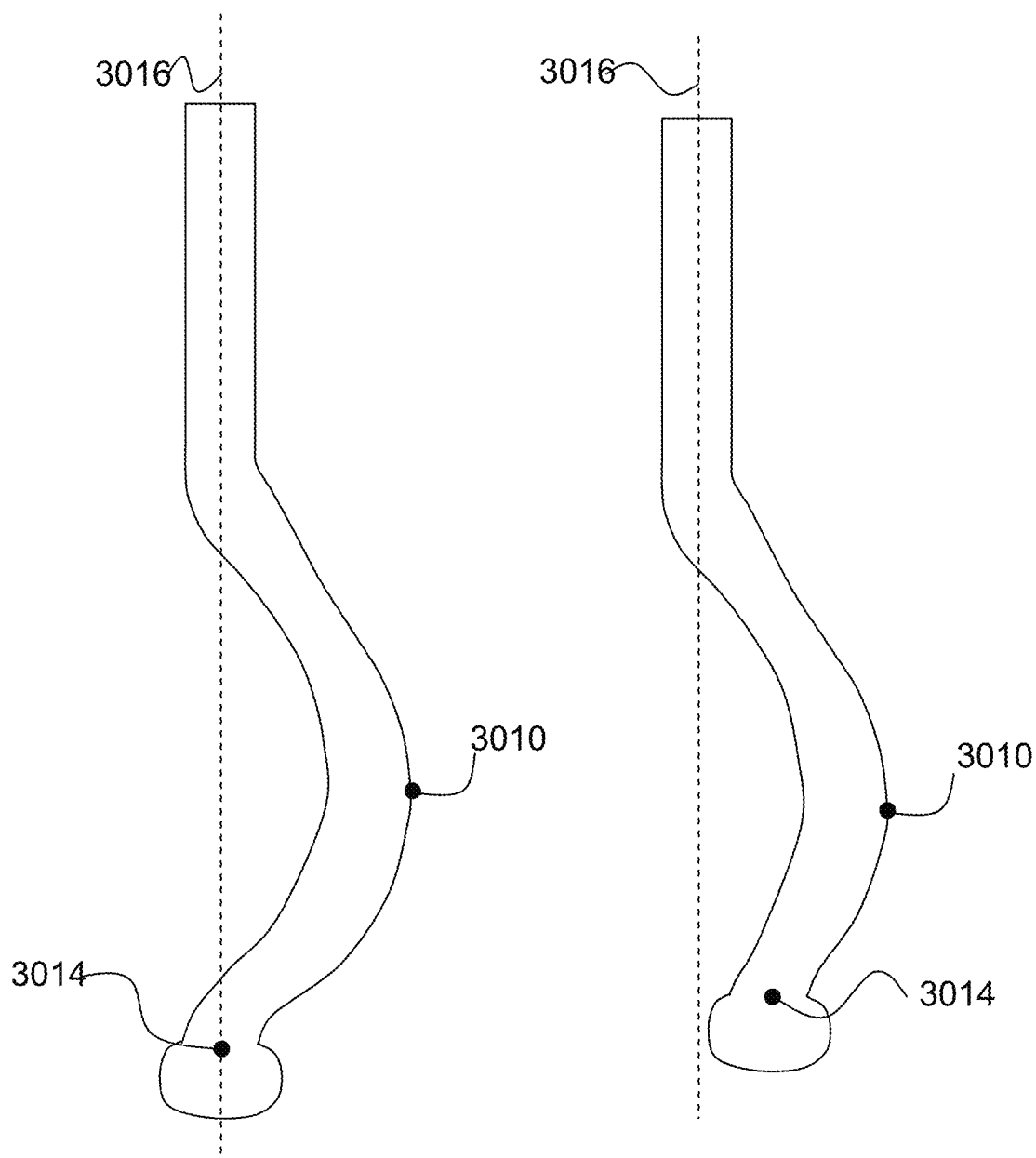
FIGS. 31-32 show alternate embodiments of the invention having different tip offsets.

As described above, the invention is applicable to probes having a positive tip offset, a negative tip offset, or no tip offset. The example of FIG. 30 shows a probe having a negative tip offset. Here probe axis 3016 is between knee point 3010 and tip location 3014. FIG. 31 shows an embodiment of the invention having no tip offset. Here tip location 3014 is substantially on probe axis 3016. FIG. 32 shows an embodiment of the invention having a positive tip offset. Here tip location 3014 is between probe axis 3016 and knee point 3010. For the probe of FIG. 32, the knee section does not cross the probe axis.

Figures 33, 34:
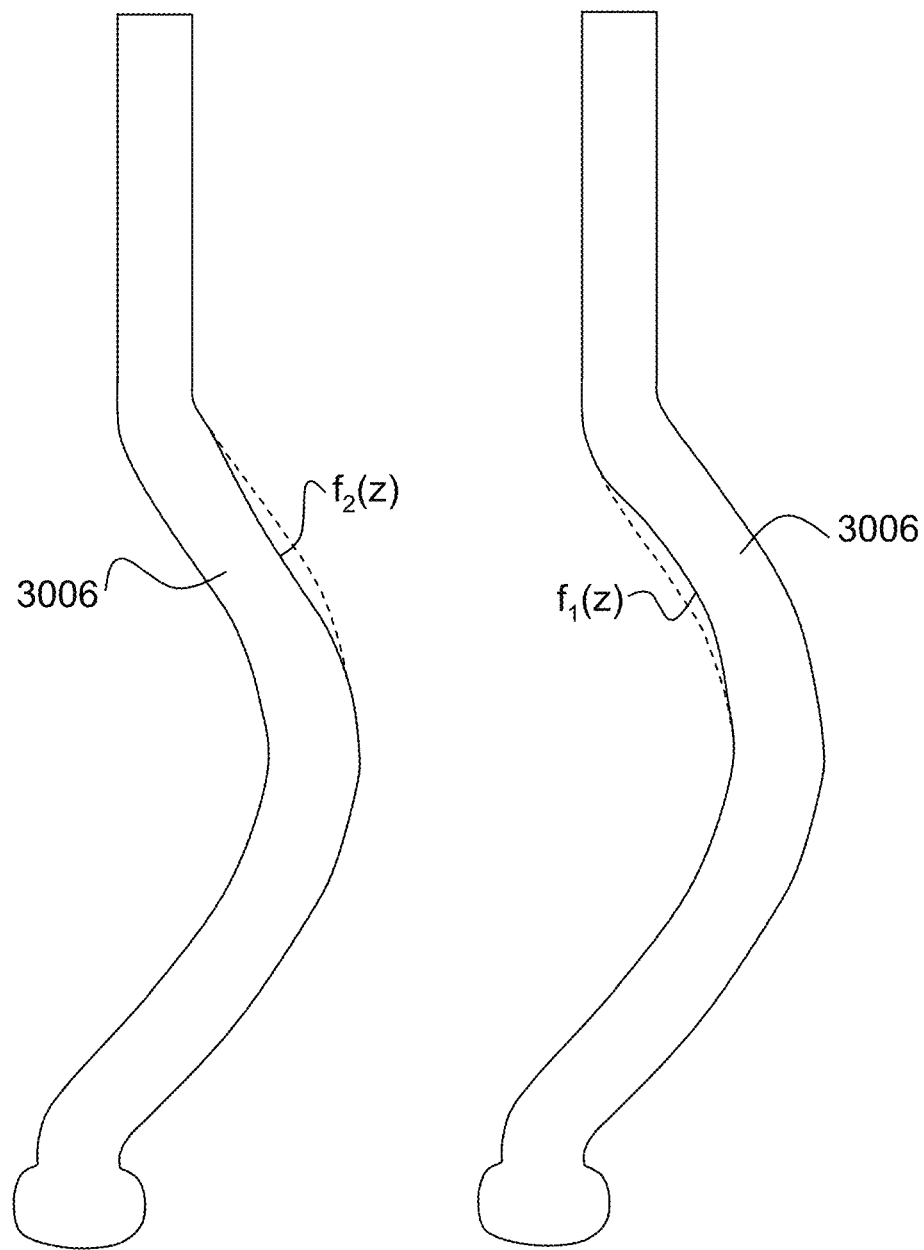
FIGS. 33-34 show alternate embodiments of the invention having different upper knee section thickness profiles.

Reduced thickness sections of probes according to the invention can be regarded as resulting from removing material from the left and/or right sides of a smooth, constant thickness probe profile. For example, FIG. 33 shows an embodiment of the invention where the reduced thickness section is formed by variation of a right probe boundary $f_2(z)$. FIG. 34 shows an embodiment of the invention where the reduced thickness section is formed by variation of a left probe boundary $f_1(z)$. FIG. 30 shows an embodiment oflhe invention where the reduced thickness section is formed by variation of both a left probe boundary $f_1(z)$ and a right probe boundary $f_2(z)$.

Figure 35:
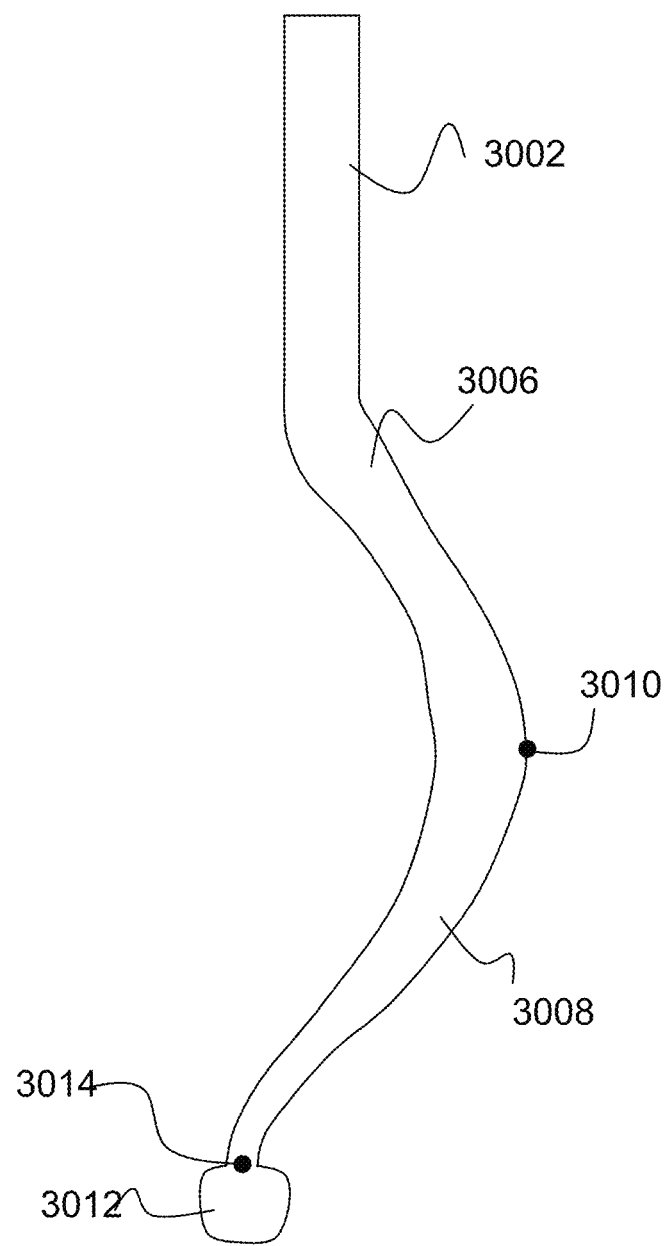
FIG. 35 shows an embodiment of the invention having a tapered lower knee section.

In the preceding examples, lower knee section 3008 has a roughly constant in-plane thickness. The detailed shape of lower knee section 3008 is not critical in practicing the invention, and any other lower knee section shape can also be employed in practicing the invention. For example, FIG. 35 shows an embodiment of the invention having a tapered lower knee section 3008. More specifically, the in-plane thickness of lower knee section 3008 decreases monotonically along the length of the lower knee section from knee point 3010 to the tip location 3014.

Operation of the invention can be appreciated in connection with FIGS. 36a-b, which show an embodiment of the invention in an initial contact configuration and an operating contact configuration respectively. On FIG. 36a a probe according to the invention makes initial contact with a contact pad 3604. It is convenient to describe the initial contact point between the probe and contact pad 3604 in terms of an initial contact offset 3608 defined with respect to probe axis 3016. In operation, the arrangement of FIG. 36a is vertically compressed by (e.g., by moving contact pad 3604 up by a vertical deflection 3606). Under this compression, the probe elastically deforms as schematically shown on FIG. 36b. As a result of this deformation, the probe tip moves relative to contact pad 3604. Typically this relative motion includes a translation (i.e., operating contact offset 3608' being different from initial contact offset 3608) and a rocking motion of the probe tip relative to the contact pad surface. The rocking motion can be appreciated by noting the different orientations of a tip axis 3602 on FIGS. 36a and 36b. The scrub mark length is the difference between offset 3608 and offset 3608'.

In one example, a reference probe (probe A) having a nominal in-plane probe thickness of 52 μm and a negative tip offset (as shown on FIG. 30), provided a 25 μm scrub length on an Al surface for 75 μm vertical deflection. A probe according to the invention (probe B) had the same shape as the reference probe, except that the upper knee section of probe smoothly varied to provide a local minimum thickness of 33 μm in the upper knee section. This local minimum was located about halfway between the knee point and the shank The thickness variation of the upper knee section was distributed over the entire length of the upper knee section. Probe B provided a 10 μm scrub length on the same Al surface used for testing probe A. For both probes A and B, the contact force was about the same (2 grams per 25 μm vertical deflection).

Figure 38:
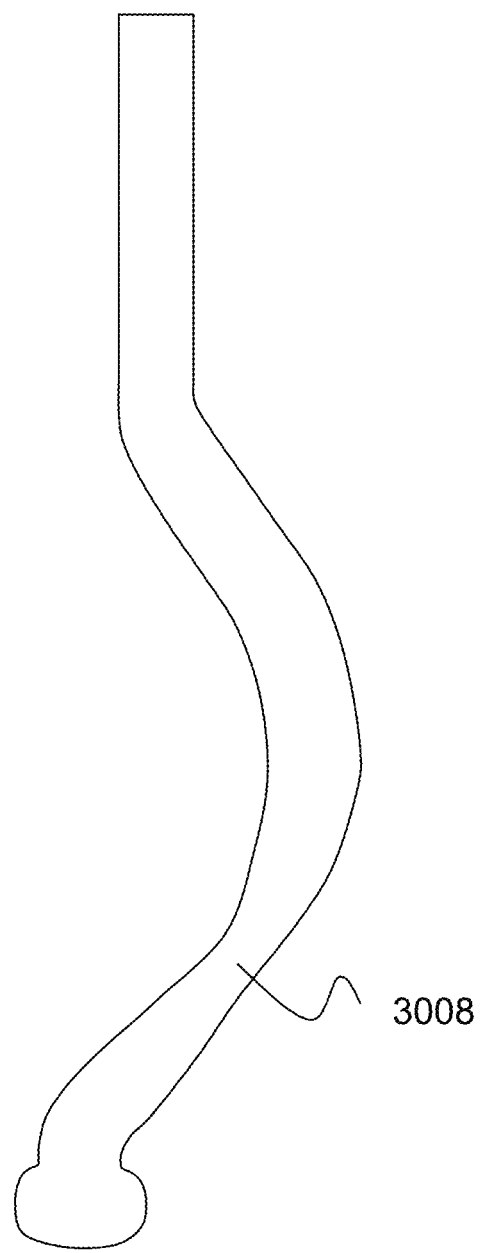
FIG. 38 shows a probe according to another embodiment of the invention.
Figure 39:
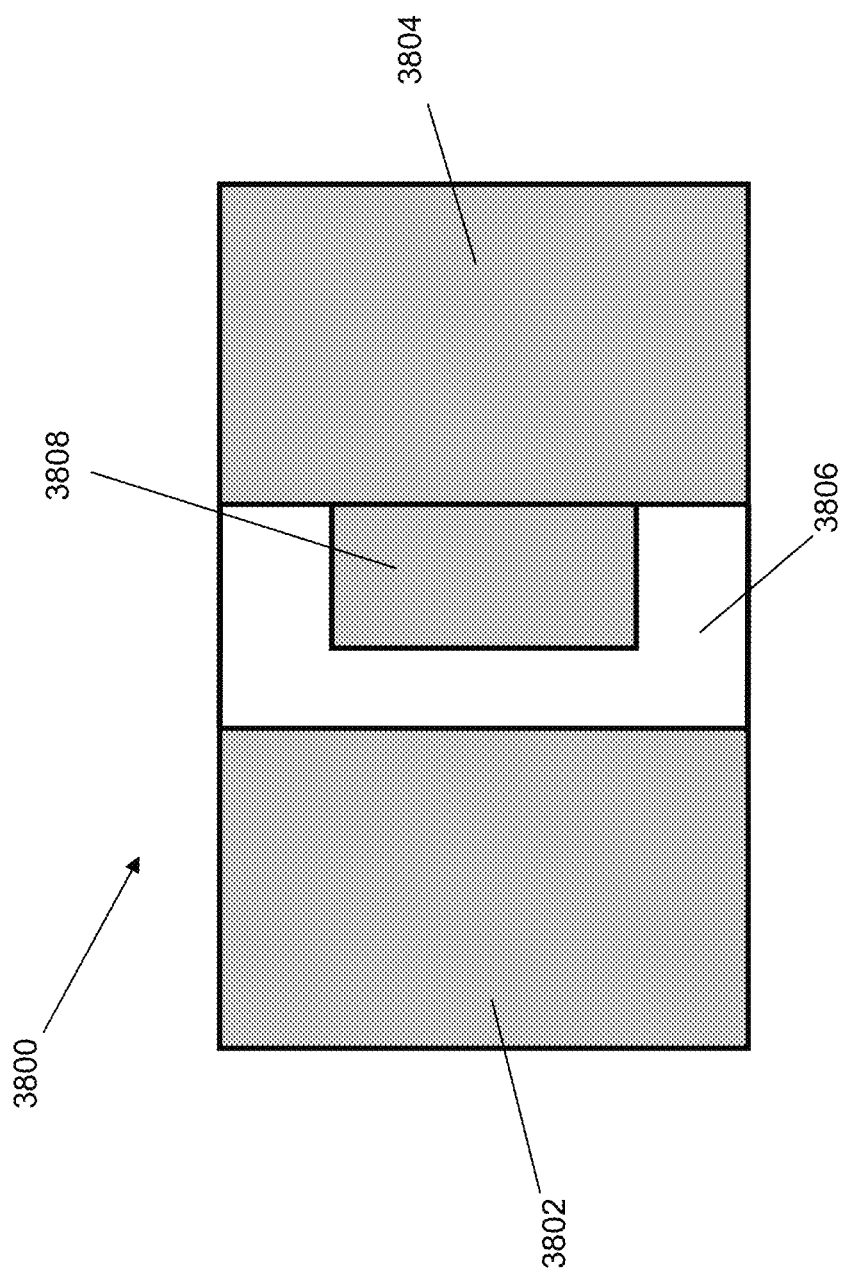
FIG. 39 illustrates an embodiment comprising a probe with at least two inner layers and two outer layers.

FIG. 38 illustrates another embodiment of the present invention comprising layered probe 3800. Layered probe 3800 of this embodiment preferably comprises at least two inner layers 3806, 3808 and two outer layers 3802, 3804. The layers can be the same or different materials. For example, layer 3806 can comprise Cu and layers 3802, 3804, and 3808 can comprise Rd or Cr. Segments along the length of the probe in FIG. 38 can be different material structures. One of the inner layers 3806 is preferably shaped like a C, although other shapes may be employed wherein one inner layer partially or fully surrounds the other inner layer. This embodiment of the present invention allows at least one of the inner layers to comprise a more conductive material than the outer layers.

Layered Probes with Core

Arrays of closely-spaced. probes have been extensively used for IC testing for many years. As integrated circuit technology progresses, circuit dimensions decrease, and it becomes desirable to probe at ever-decreasing spacings between probe pads. To keep up with this evolution, probe dimensions also tend to decrease as technology progresses. However, new technical problems can arise as probe dimensions are reduced.

One such new problem relates to probe current carrying capacity (CCC). Present day and projected probe dimensions are sufficient to provide normal device operating currents (on the order of 100 mamps) without compromising probe mechanical integrity. However, integrated circuits that are probed do not always operate normally, and probing a faulty circuit (e.g., a short) can lead to a current flow of about 2 amps or more through a probe.

Accordingly, this behavior can be characterized by measuring contact force as a function of current, and looking for irreversible changes in contact force as a result of high current operation. The probe current carrying capacity (CCC) can be defined as the maximum current at which no irreversible deformation of the probe occurs during normal mechanical over-travel.

Probes suitable for probing contact pads having relatively large spacing (e.g., earlier stage IC technology) naturally tended to have sufficiently large dimensions that probing a faulty circuit would not lead to probe damage. However, present day and projected IC contact pad spacings will require small probe dimensions and thus insufficient probe current carrying capacity becomes a pressing problem.

In embodiments of the present invention, two approaches alleviate this problem. Both approaches rely on introducing materials into the probes having a higher degree of electrical conductivity than typical probe materials, without compromising the mechanical performance of the probes. Increased electrical conductivity reduces resistive heating of the probes, thereby increasing the probe CCC.

Figure 40:
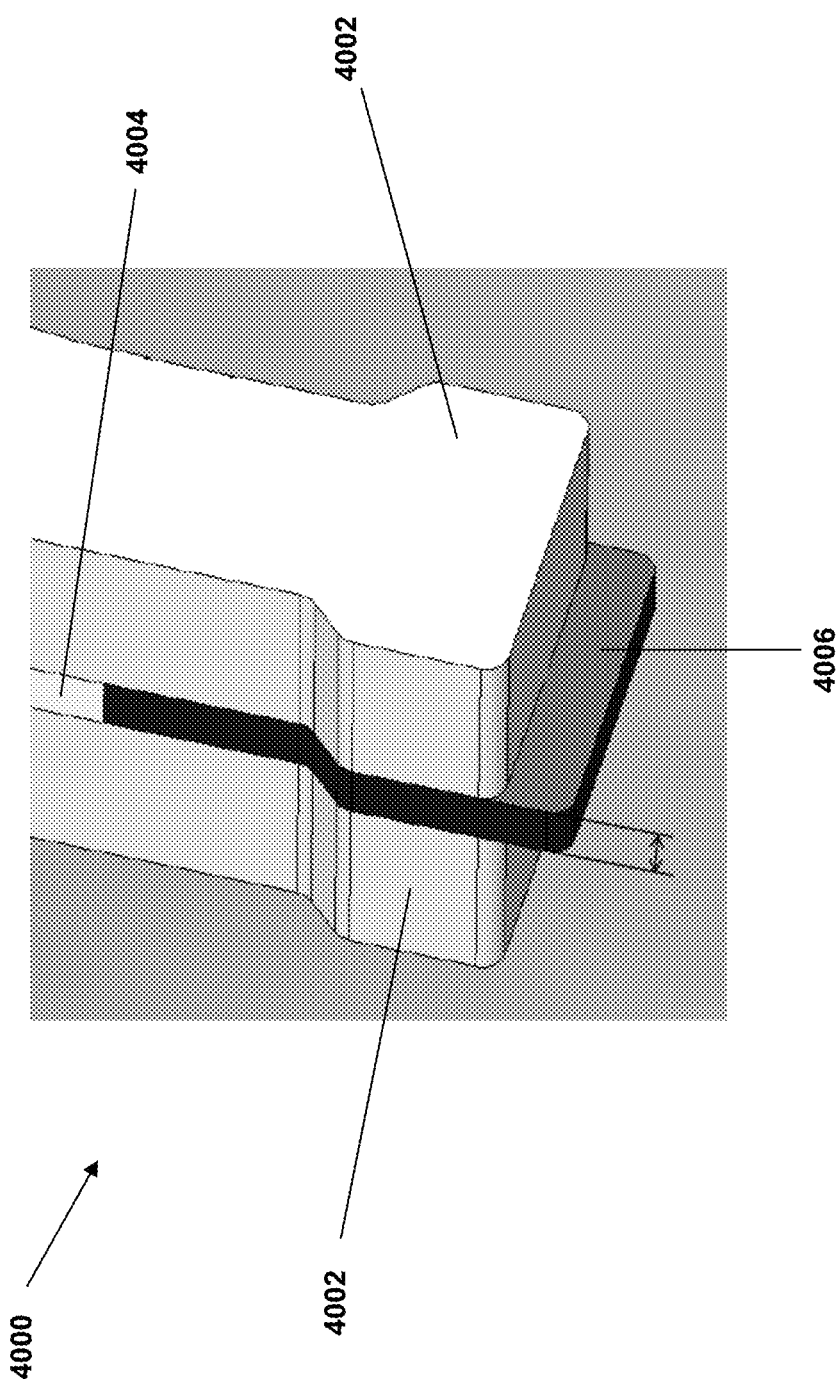
FIG. 40 illustrates an embodiment of the present invention comprising a multi-layer probe with a central layer comprising a high conductivity material and a tip comprising a harder material than the high conductivity material.

Referring to FIG. 40, one embodiment of the present invention comprises multi-layer probe structure 4000 where layers 4002 are preferably in the plane of probe deformation. Layers 4002 are preferably planar. Layers 4002 preferably comprise NiCo. Central or core layer 4004 of probe structure 4000 preferably comprises a high conductivity material (including, but not limited to, Cu), and at tip 4006 of probe structure 4000, a harder material (including, but not limited to Rd and/or Cr) is preferably used to make electrical contact to devices being probed. Methods for fabricating multi-layer probe structure 4000 are employed for making these probes. For example, central or core layer 4004 is deposited as the high conductivity, low strength layer (e.g., Cu). Patterning and etching opens up space for tip 4006 regions of core layer 4004, and tip 4006 material is then deposited into these opened up spaces. Core layer 4004 and tip 4006 can be either the same thickness as illustrated in FIG. 40 or different thicknesses. Core layer 4004 and tip 4006 can be approximately 1 to 30 μm thick, and more preferably approximately 5 to 20 μm thick and most preferably approximately 8-12 (preferably about 10 μm) thick. Layers 4002 can be different thicknesses or the same thickness as illustrated in FIG. 40. Layers 4002 are preferably approximately 10 to 80 μm thick, and more preferably approximately 20 to 50 μm thick and most preferably approximately 30-35 (preferably about 33) μm thick, The invention is further illustrated by the following non-limiting examples.

EXAMPLE 1

Figure 41:
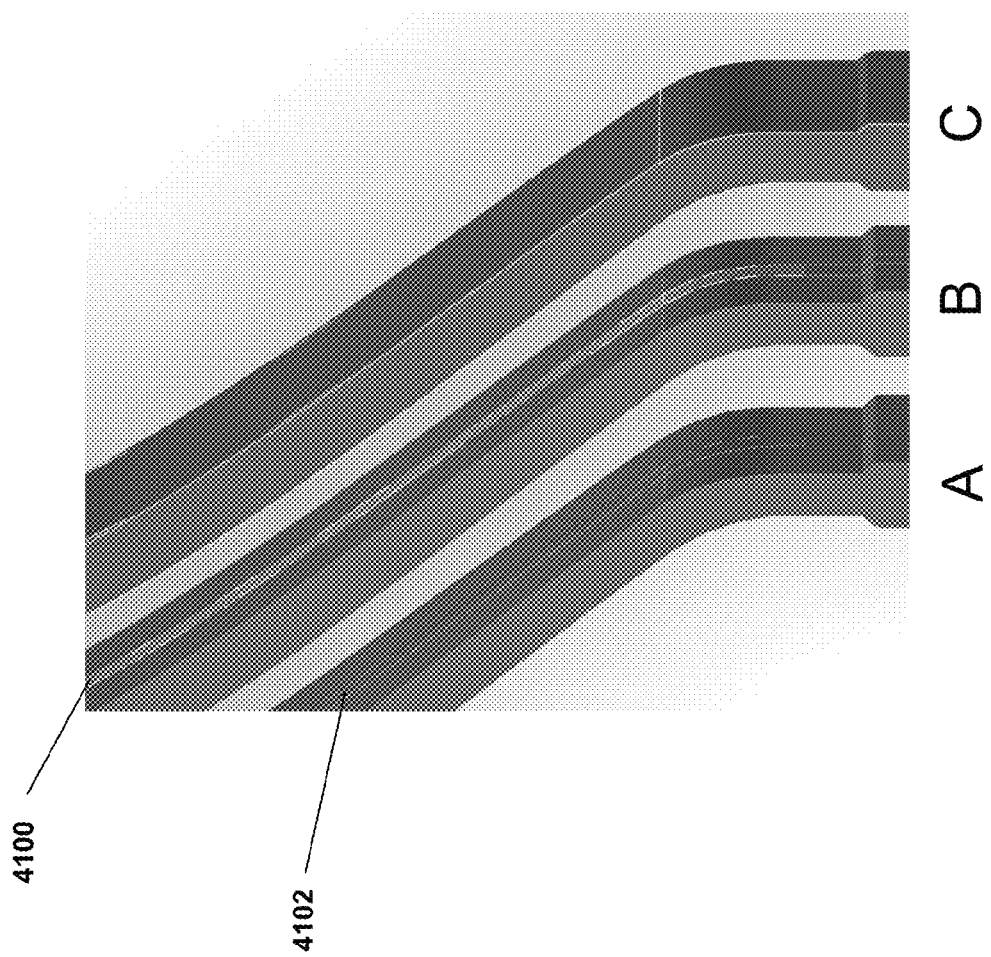
FIG. 41 illustrates examples of embodiments of the present invention comprising layered probes.

Three probe embodiments of the present invention were evaluated for increased CCC. The three embodiments are illustrated in FIG. 41. Probe B comprises highly conductive core 4100, e.g. an approximately 10 micron Cu core. Probe A is the same as Probe B except that core layer 4102 is made of NiCo (i.e., probe A is all NiCo). Probe C is the same as Probe A, except that the outer surface comprises a highly conductive material, e.g. an approximately 3 micron thick Cu layer deposited on the outer surface of Probe C.

Figure 42:
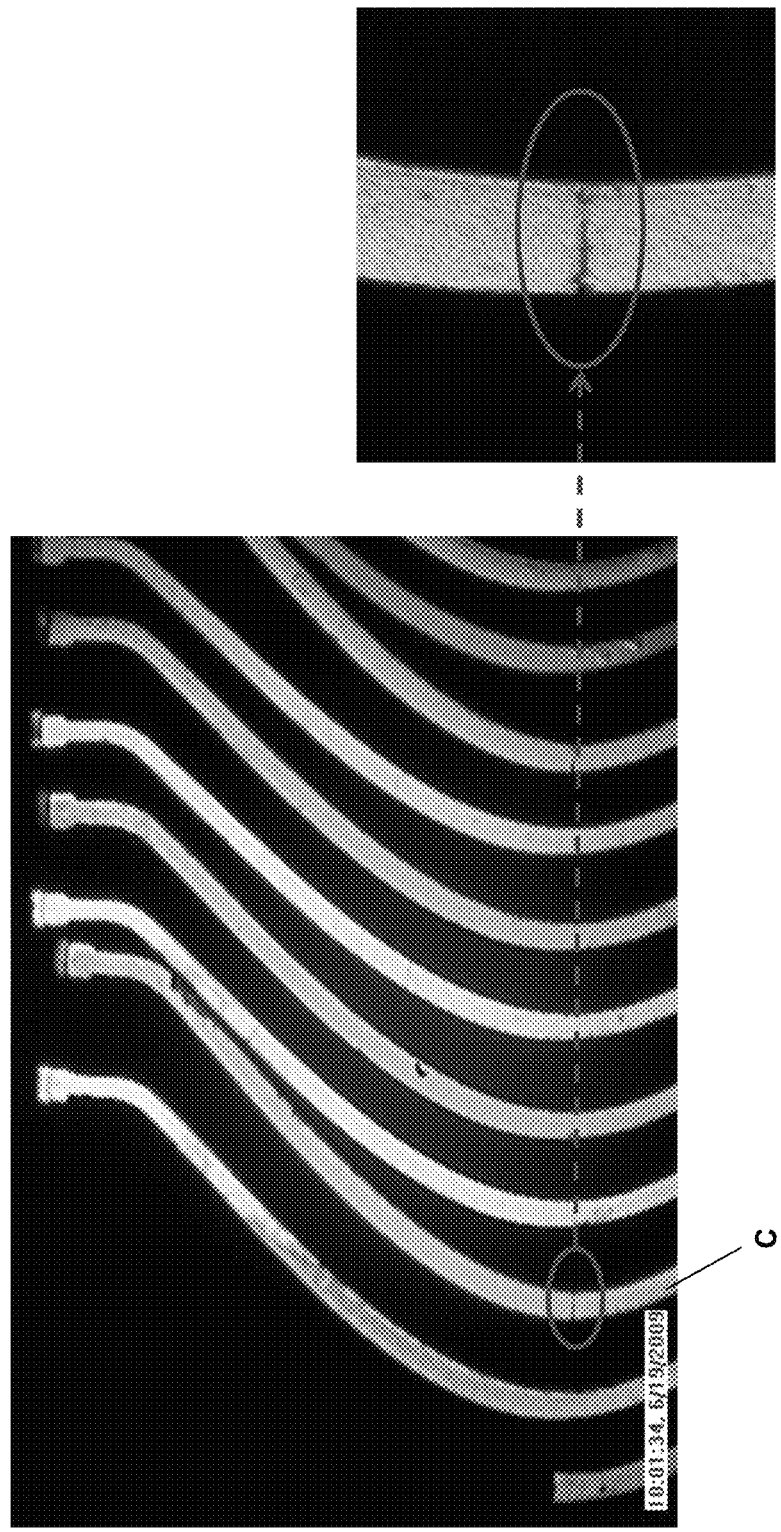
FIG. 42 illustrates a probe with a crack after operational testing was performed.
Figure 43:
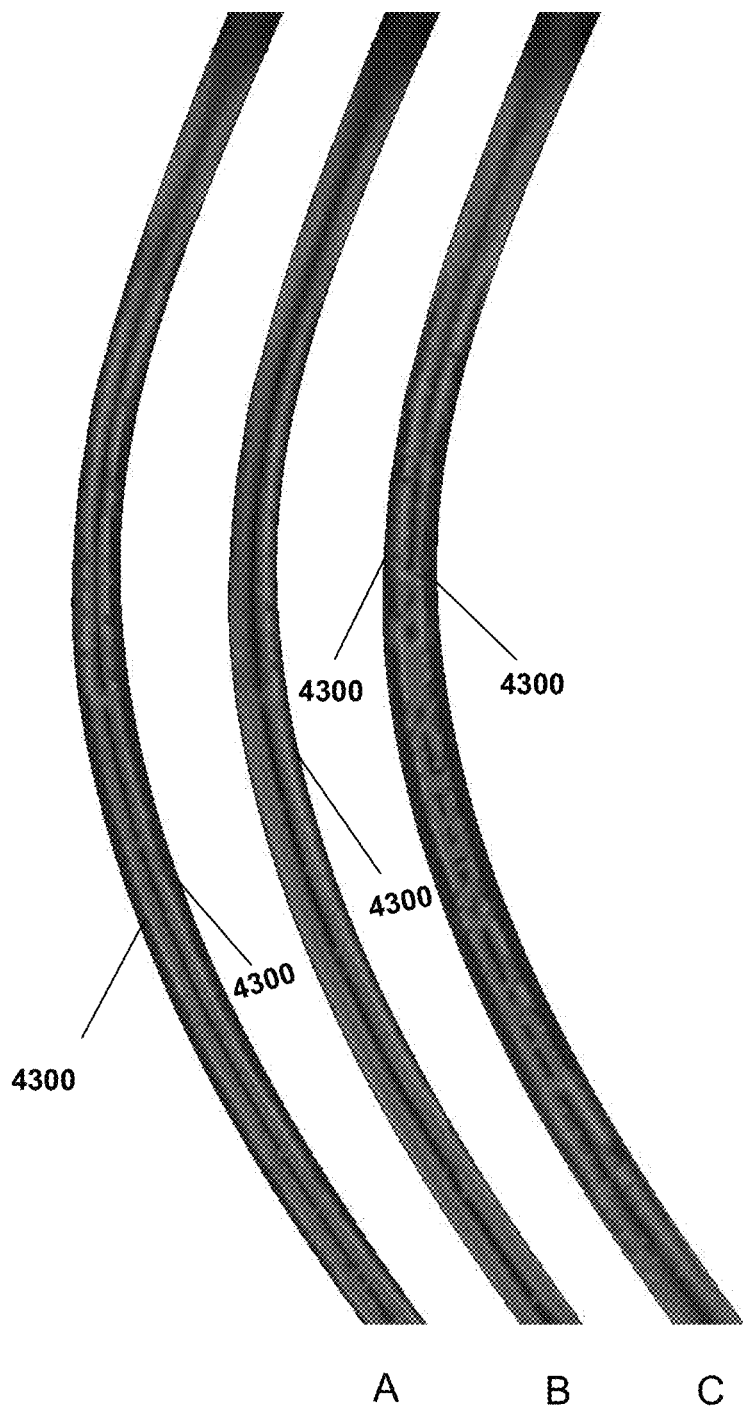
FIG. 43 illustrates stress distribution in three probe designs.

The Probe C embodiment showed unsatisfactory results because the Cu plating layer tended to crack in operational cycling tests, as seen in FIG. 42. Probe C cracked after 7 k/75 μm cycling. This cracking result can be better understood by considering the stress distribution in probe designs A, B, and C as illustrated in section view in FIG. 43. Red regions 4300 on the plots of FIG. 43 show regions of high stress, and it is apparent that the Cu plating of probe C experiences high stress, which when combined with the poor mechanical properties of Cu gives rise to the above identified cracking problem. The green/blue regions are low to no stress regions of probe designs A, B, and C.

EXAMPLE 2

Figure 44:
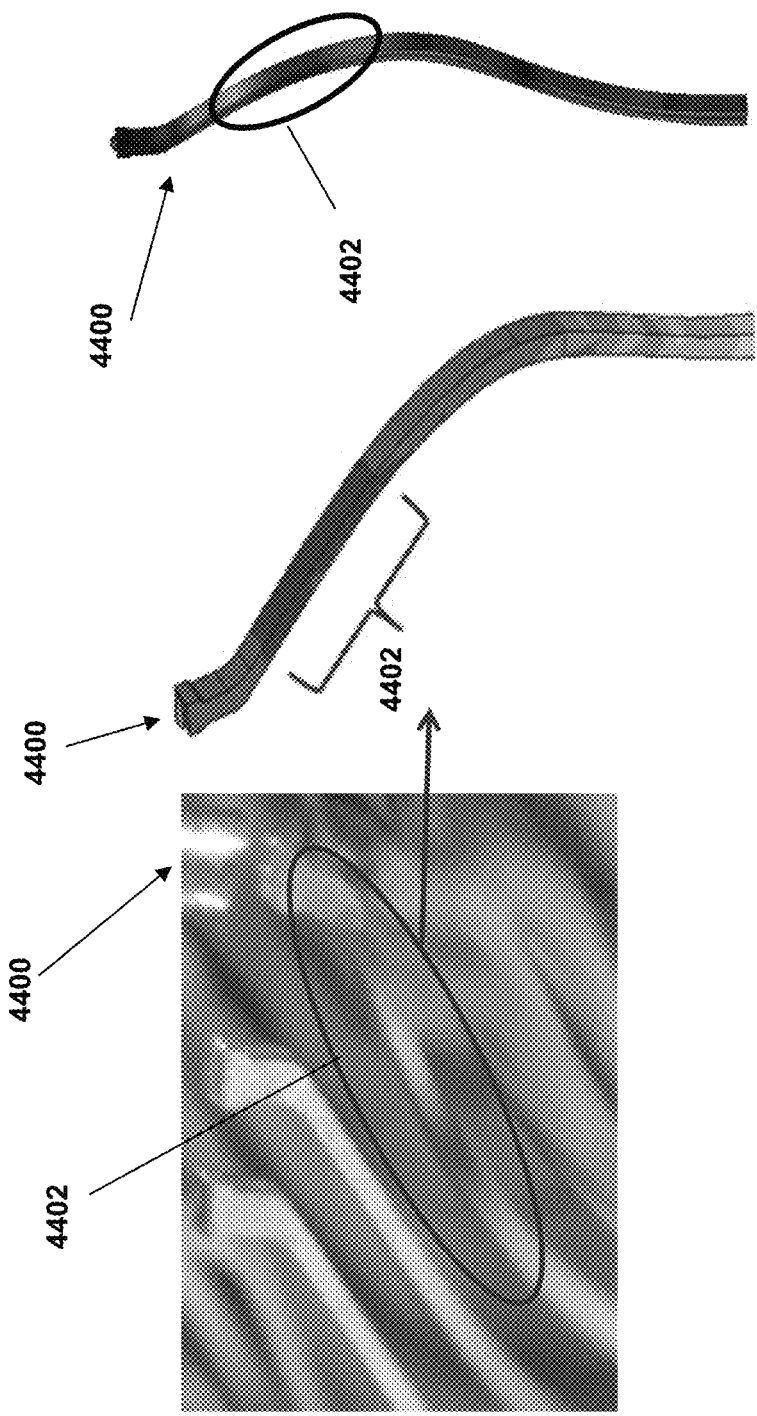
FIG. 44 illustrates an example of the correlation between high-temperature and high-stress regions of a probe.
Figure 47:
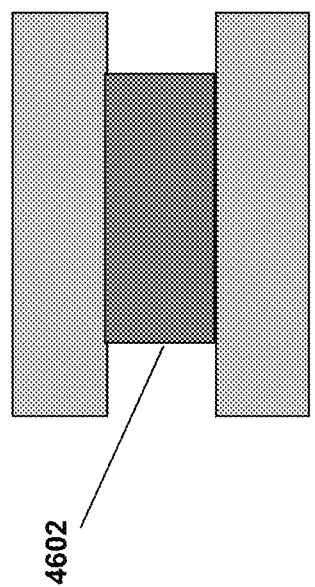
FIG. 47 illustrates an embodiment of the present invention comprising a different probe design.

Probe embodiments were further investigated by considering temperature and stress distributions within the probes. FIG. 44 illustrates an example of such investigations. Red region 4402 illustrates the high-temperature and high-stress region of probe 4400. Green to blue regions illustrate low stress and low temperature regions of probe 4400. Frequently, as in the example of FIG. 44, the high-temperature and high-stress regions of a probe coincide and determine the CCC of the probe. In this case, region 4402 of probe 4400 determined the CCC of probe 4400.

Figure 46:
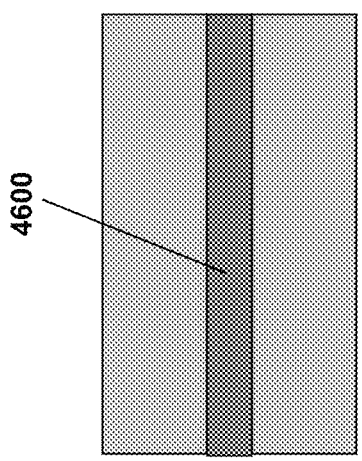
FIG. 46 illustrates an embodiment of the present invention comprising a probe design.

In a preferred embodiment of the present invention, the high-conductivity core in probe B of FIG. 41 is trimmed to remove some of its highest-stress material, as illustrated in FIG. 45. To compensate for the loss in electrical conductivity caused by this trimming, core layer 4500 can be made somewhat thicker. FIG. 46 illustrates two probe embodiments that were compared. In probe B1, core 4600 is, for example, approximately 10 microns of Cu, and no trimming of core 4600 is performed. In probe B2, core 4602 is, for example, approximately 20 microns of Cu, and the high-stress regions of core 4602 are trimmed away. The CCC of probe B2 (about 1.25 amps) is higher than the CCC of probe B1 (about 1.0 amp). Finite element analysis modeling, as employed above, is used to guide the configuration of further embodiments of the present invention comprising probes with highly conductive material. For example, the trimming of the high conductivity core can eliminate the regions of the core which are modeled as having stress that exceeds the yield strength of the conductivity core (at the relevant temperature).

EXAMPLE 3

In the examples above, two approaches for improving probe CCC were considered. The preceding description relates to a first approach of including a high-conductivity layer in a multi-layer probe. In a second approach, a high conductivity layer is also included in the probe, but the geometry is significantly different More specifically, as illustrated in FIG. 48, high conductivity core 4802 (e.g., Cu) is vertical with respect to the overall layer structure of probe 4800, as opposed to being horizontal as it was in the first two examples.

Figure 48:
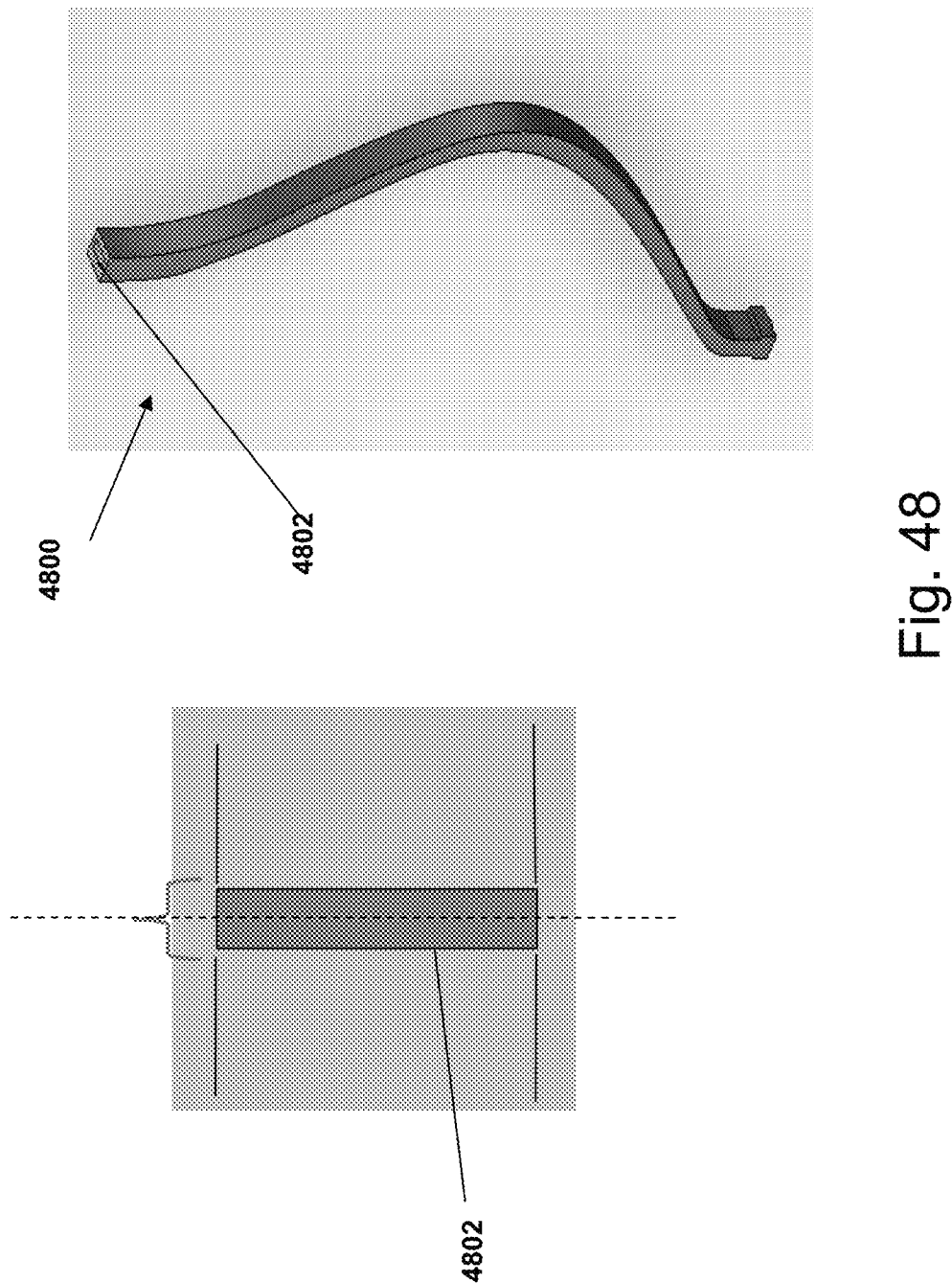
FIG. 48 illustrates an embodiment of the present invention comprising a vertical core layer with respect to the overall core structure.

The significance of this difference is shown when comparing the orientation of the cores in FIGS. 45 and 46 to the orientation of the core in FIG. 48. More specifically, the plane of probe deformation is horizontal in this geometry. When probe deformation occurs in this plane, the left side of the probe is in a state of compression and the right side of the probe is under tension for vice versa). As a result of this stress pattern, the center of the probe is a neutral axis for stress, where stress is relatively low compared to other regions of the probe. This stress pattern is clearly visible in the calculated results shown in FIG. 43. The point of core 4802 geometry shown in FIG. 48 is to align core 4802 with the neutral axis of probe stress. Thus the mechanically weak core material is placed in regions of the probe that experience the least stress, thereby improving probe CCC. In the example of FIG. 48, a CCC of about 1.3 amps was obtained, and the mechanical stress in the Cu core was about 2 times less than it was in the probe A example considered above. Another preferred feature of the example of FIG. 48 is that core 4802 is completely surrounded by the mechanically stronger material.

Surrounding core 4802 is preferred, although not required, for chemical isolation from environment as well as for fabrication purposes. It is preferable to etch a shallow trench in a Ni-Co layer and fill it with Cu, than creating a separate "mold" in which Cu is plated. Also, encapsulating Cu with stronger metal/material adds mechanical robustness, particularly in cases when "slender" probes are employed.

Figure 49:
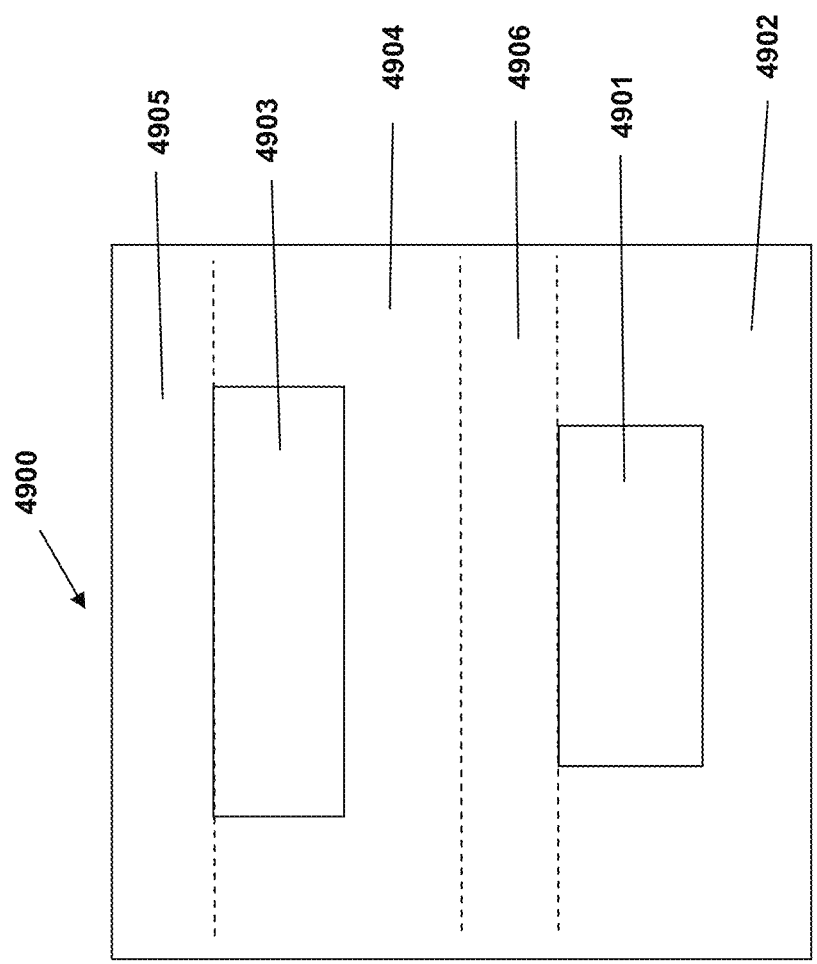
FIGS. 49-51 illustrate embodiments of the present invention comprising varying core geometries and varying layered probes.
Figure 50:
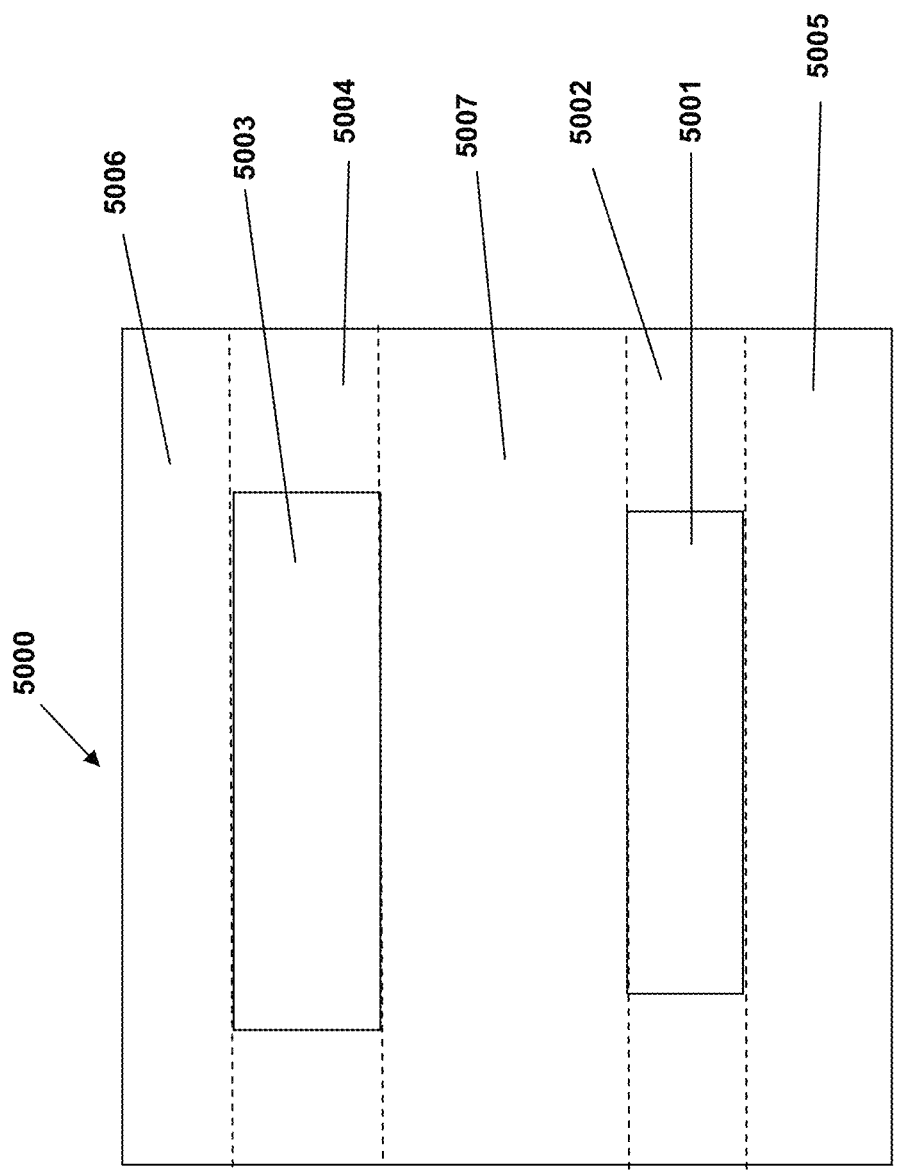
Figure 51:
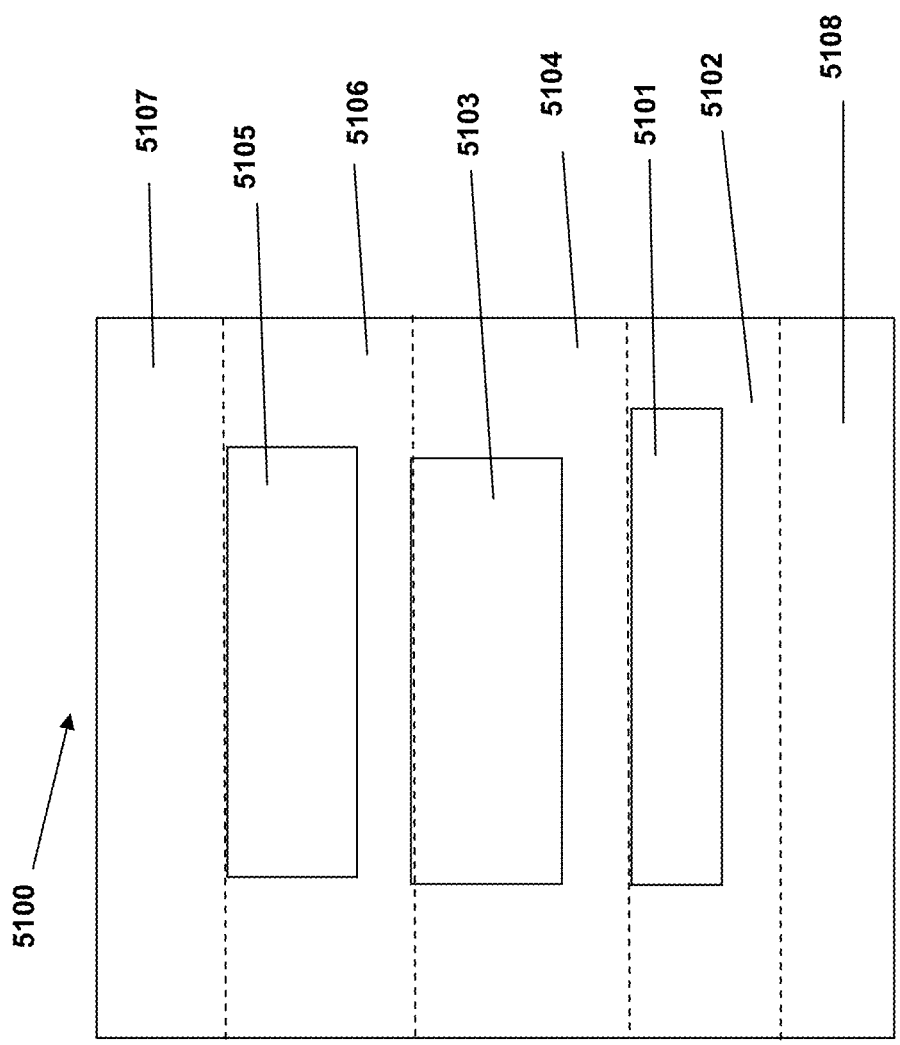

Preferred fabrication processes can entail formation of separate vertical cores in two or more metal layers, thereby creating multi-core geometries as illustrated in FIGS. 49-51. Such multi-core approaches can also be employed in connection with the horizontal geometry of FIG. 46. Referring to FIG. 49, cores 4901 and 4903 are a part of metal layer 4902 and 4904. Metal layer 4905 preferably caps core 4903. Layer 4906 comprises the tip of probe 4900. Referring to FIG. 50, cores 5001 and 5003 are part of layers 5002 and 5004. Layers 5005 and 5006 preferably cap cores 5001 and 5003. Layer 5007 comprises the tip of probe 5000. Referring to FIG. 51, cores 5101, 5103, and 5105 are part of layers 5102, 5104 and 5106. Layer 5107 preferably caps core 5105. Layer 5103 preferably comprises the tip of probe 5100.

The use of a vertical probe core requires different processing steps than for probes that have only horizontal layers. Various approaches can be employed to provide a vertical probe core. For example, the central horizontal layer can be fabricated first; then patterning followed by etching can be used to open up space for the vertical core material. Selective deposition of the core material into this opened up space, followed by deposition of the top probe horizontal probe layer, can complete the structure.

Power/ground Probes and Signal Probes

Embodiments of the present invention solve probe CCC issues as seen in practice. Contact pads on a device under test (MIT) (and the corresponding probes) can be divided into at least two categories, for example, power/ground pads and signal pads. Power/ground pads are for providing external power and ground connections to the IC, while the signal pads are for the IC inputs and outputs (I/O). Device failures that lead to high-current conditions at a pad tends to occur at power/ground pads, and not at signal pads. Power/ground pads are typically provided as several separate pads that are electrically connected to each other on-chip, and are contacted by separate probes (one for each pad) that are electrically connected to the relevant external power/ground. When a high-current device failure occurs for a set of power/ground pads, parasitic on-chip and off-chip resistances tend to force the high current to pass through a single one of the corresponding probes, which leads to a high risk of damage to the affected probe.

Figure 52B:
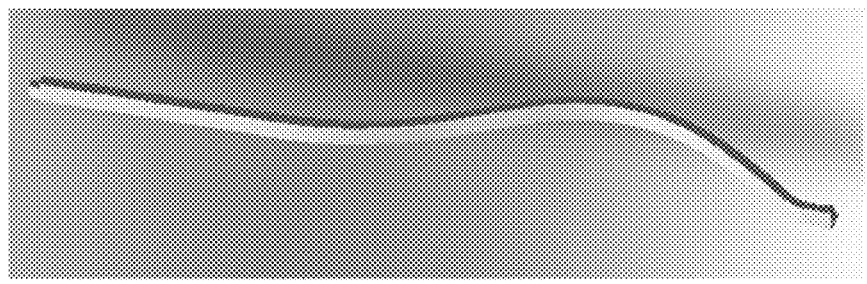
FIGS. 52A-52B illustrate example dimensions and shapes of a power/ground probe and a signal probe.
Figure 52A:
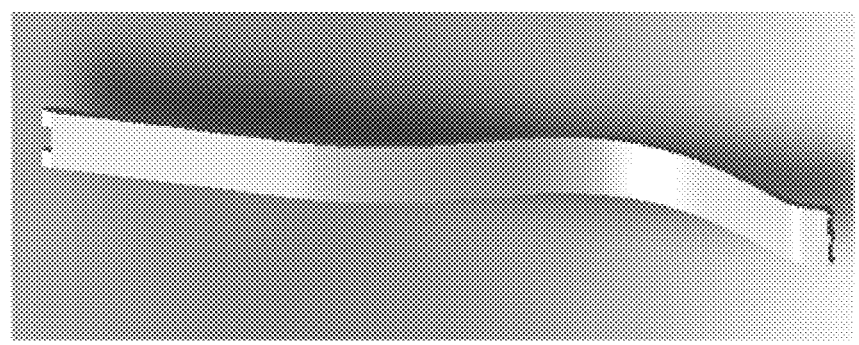

Based on these considerations, embodiments of the present invention address the probe CCC issues as follows:

1) At least two different kinds of probes are preferably employed in probing an IC—power/ground probes and signal probes. The power/ground probes are preferably larger in cross section than the signal probes. Preferably, the dimensions and shape of the power/ground probes are the same as for the signal probes, except that the width of the power/ground probes is a multiple of the width of the signal probes (e.g., 2×, 3×, etc.). An example of this geometry is shown in FIGS. 52A and 52B. FIG. 52A illustrates a power/ground probe having a wide body as compared to the signal probe illustrated in FIG. 52B. Certain features of such probes (e.g. the skates at the tips) preferably have a relatively small cross section, thus the current path through such sections is also short. In one embodiment of the present invention, the electrical resistance of the long current path that runs the length of the probe body is decreased by increasing the cross section area of the probe body.

2) A power/ground probe can make contact to multiple power/ground pads on a device under test. The wide body of the power/ground probe enables high CCC for power/ground probes. Since power/ground probes are preferably bussed, two or more bumps or skates can be bridged with one probe. Making such contact to multiple pads is a significant and surprising departure from the normally assumed requirement that each probe only contact a single pad. However, no problems arise by making such multiple pad contact if a power/ground. probe makes contact to multiple pads that are all connected to the same IC power or ground line. Single probe to multiple pad connections as discussed herein are preferably all of this type (i.e., all of the pads contacted by any one probe are also electrically connected on-chip). The result of allowing for multiple-pad contact is that probe cross section dimensions are no longer under a hard constraint determined by the IC contact pad pitch (i.e. separation), This allows for the use of large probes as in the power/ground probe of FIG. 52A even for small contact pad pitches.

In an embodiment of the present invention, a probe array comprises probes that have different cross sections (e.g. see FIG. 55). In this embodiment, it is possible for this non-uniformity to cause undesirable non-uniformity in probe life and/or performance. However, this problem can be avoided by providing a power/ground probe comprising a width that is a multiple of the width of a signal probe. The basic factor to consider is that probe elastic force scales linearly with probe width (e.g., if a power/ground probe has 3× the width of an otherwise similar signal probe, then the force it exerts in response to a deformation will be 3× that of the corresponding signal probe).

Figure 53:
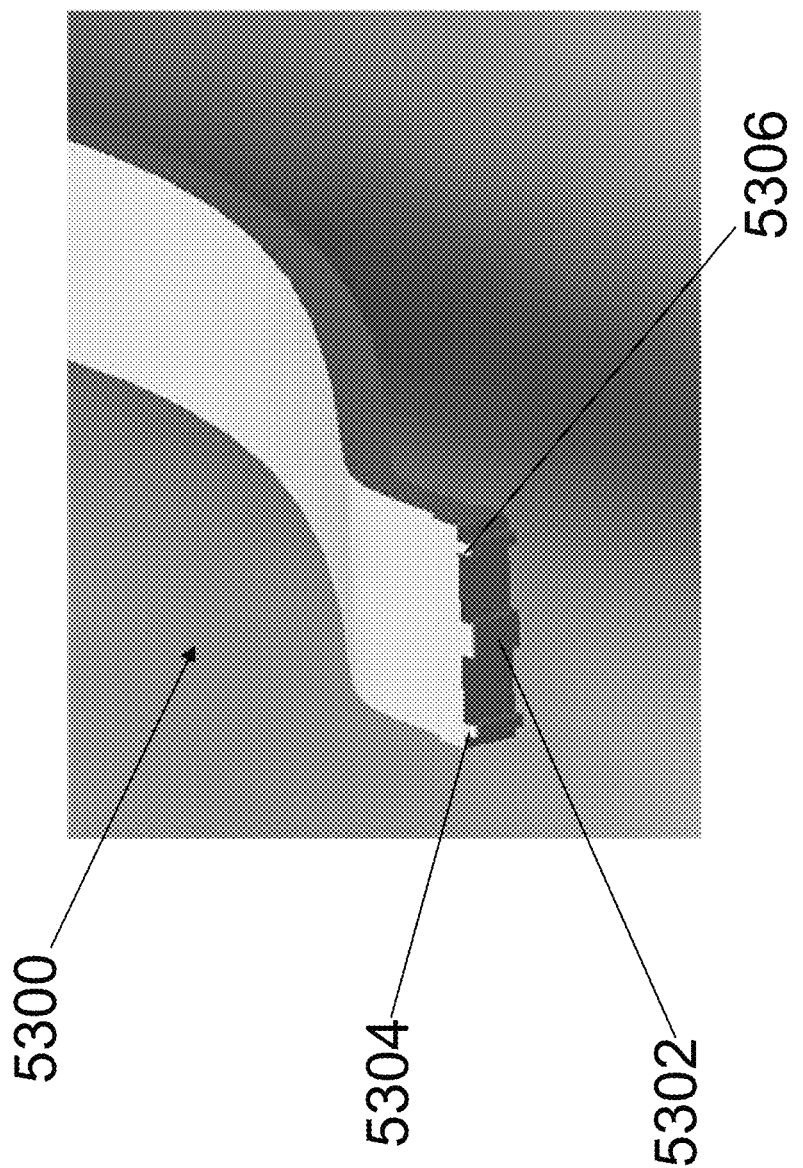
FIG. 53 illustrates an embodiment of the present invention comprising a probe tip having a sacrificial substrate in addition to the skate at which contact is made with a device under test.

One situation where non-uniformity can be troublesome is when cleaning the tips of a probe array. Tip wear due to cleaning can be greater for the larger probes because of their greater contact force. FIG. 53 illustrates an embodiment of the present invention that minimizes tip wear. In this embodiment, probe tip 5300 preferably comprises sacrificial structure 5302 in addition to skates 5304 and 5306 at which contact on a contact pad is made. The width and/or materials of the sacrificial structure can be designed as needed to even out and/or slow probe wear due to cleaning. As seen in FIG. 54, sacrificial structure 5402 is in the center of tip 5400 and does not make contact to IC contact pads 5404. However, sacrificial structure 5402 can optionally make contact with IC contact pads 5404. Sacrificial structure 5402 can be located anywhere on the probe tip, but is preferably located in the center.

Figures 55C, 55D:
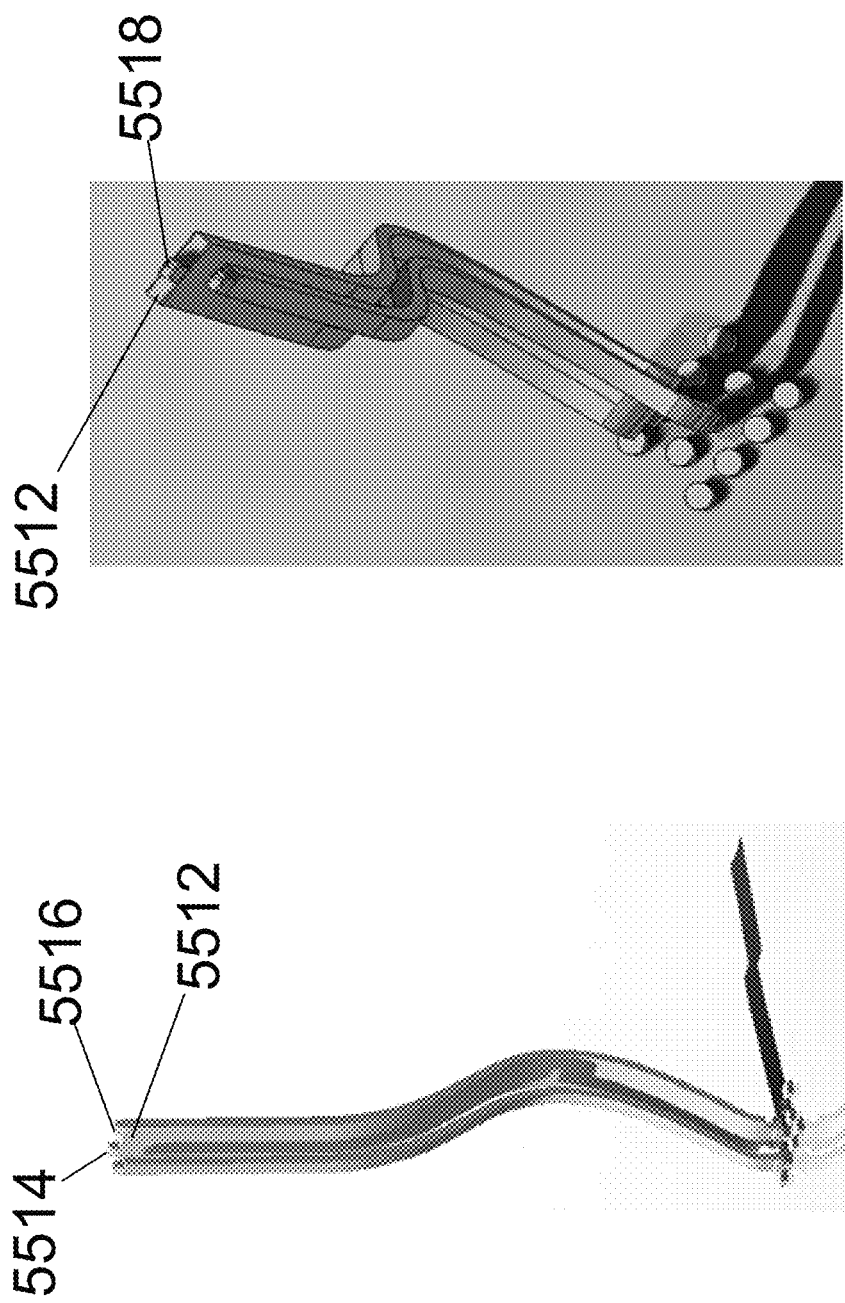

Another factor to consider is the desirability of having the same local contact force between probe and pad for each probe of a non-uniform probe array. One example for providing such contact uniformity is illustrated in FIGS. 55A and 55B. In this example, power/ground probe 5500 is about three times the width of signal probe 5502 width, and has triple skate 5504 on tip 5506 as opposed to single skate 5508 on signal probe 5502. With this example, the force per skate is about the same for both kinds of probes 5500 and 5502. Having the force per skate be about the same for all probes of a non-uniform probe array is beneficial because details of probe scrub motion tend to depend on the force per skate more than on the total force for the probe. Since contact pads of ICs tend to all be the same, it is preferred for each probe making contact to have the same scrub motion as contact is made. In the example of FIGS. 55A and 55B, power/ground probe 5501) is in mechanical contact with single contact pad 5510, and can be re-flow soldered to make electrical contact with other contact pads of the same IC power/ground line (e.g., the neighboring contact pads on the left and right of the wide probe). Also in the example of FIGS. 55A and 55B, only about one-third of the power/ground pads on the IC are probed. This provides sufficient physical room for the larger power/ground probes, and also results in about the same total force between probe array and wafer during testing (each power/ground probe is about three times stiffer than normal, but there are about three times less of these probes). Although triple skate 5504 is shown in FIGS. 55A and 55B, any multiple of skates may be utilized in accordance with embodiments of the present invention. The multiple skates preferably control probe-to-pad alignment and reduce wear during cleaning. Distal end 5512 of power/ground probe 5500 can be attached to space transformer pads using one or more attachment points. For example, FIG. 55C shows probe 5501) with attachment points 5514 and 5516. FIG. 55D shows probe 5500 with single attachment point 5518.

Figure 56:
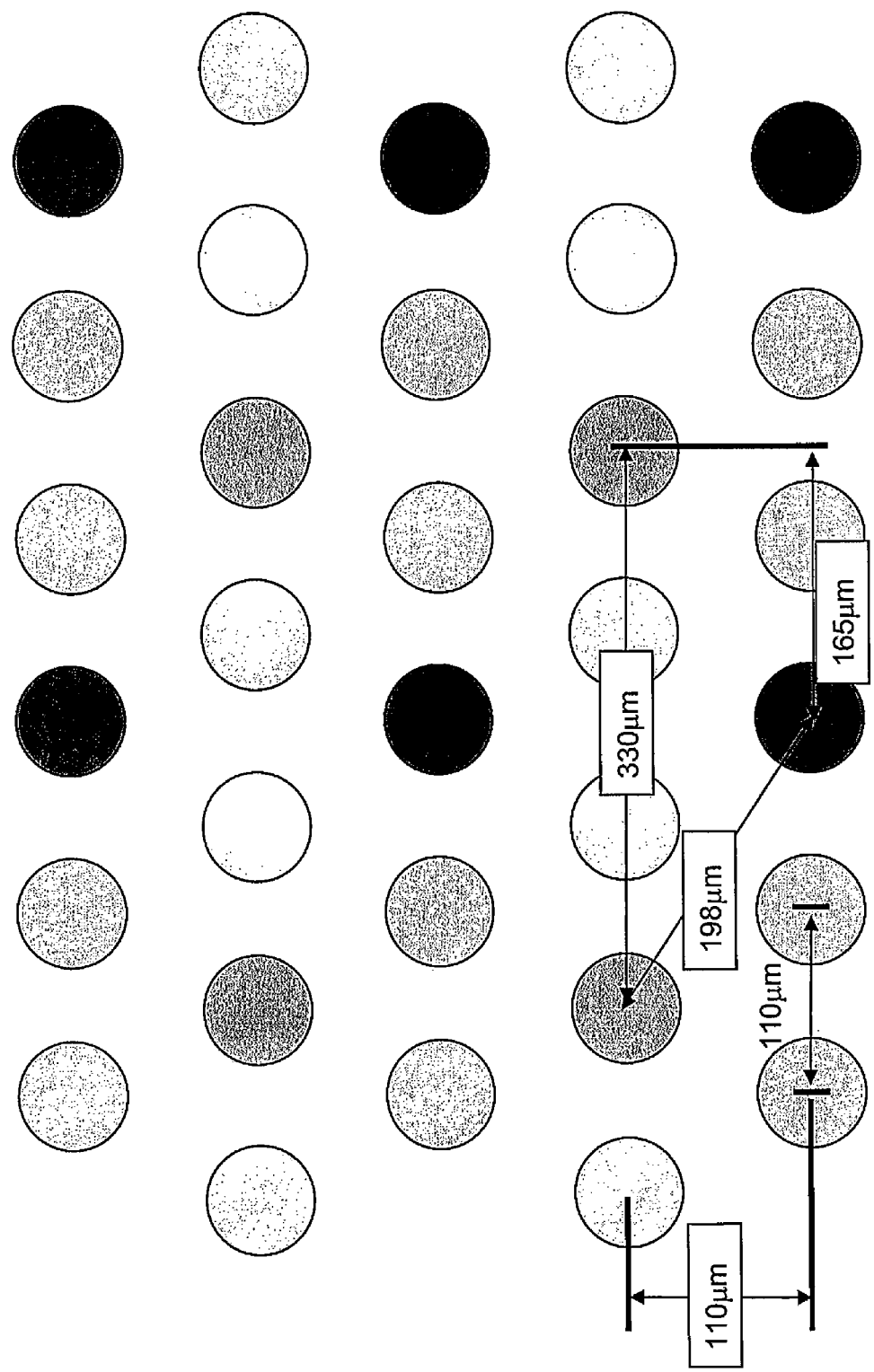
FIGS. 56 and 57 illustrate embodiments of the present invention comprising a set of contact pads wherein every third pad of the power/ground lines is probed.
Figure 57:
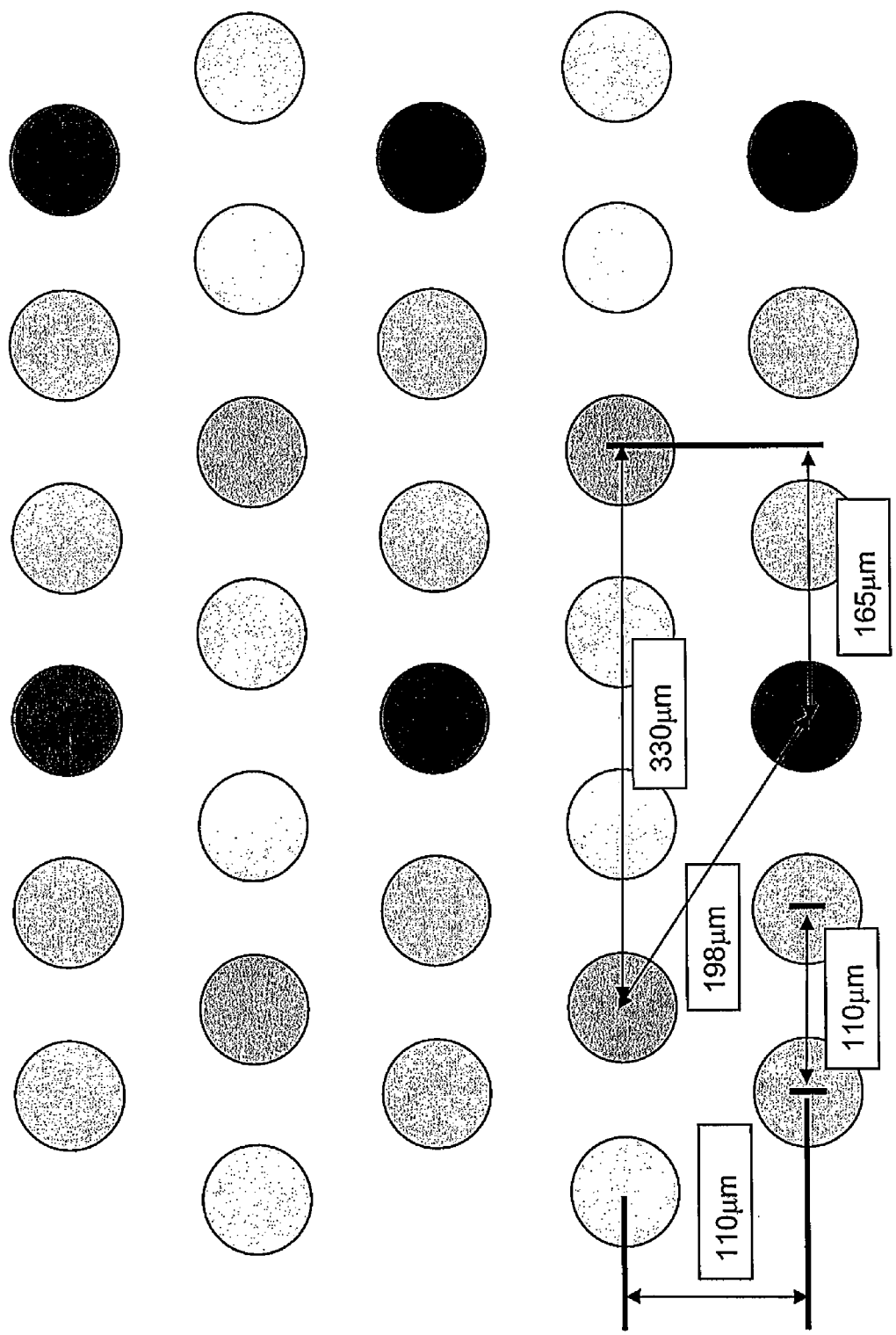

FIGS. 56 and 57 show examples of a top view of contact uniformity probing. Referring to FIG. 56, a set of contact pads having a horizontal pitch of about 110 µm is shown. The pads are arranged as a staggered set of rows, and the vertical separation between rows is also about 110 µm. FIG. 57 shows an example of a probing strategy for this array, where the signal probes have a width of about 55 µm and the power/ground probes have a width of about 165 µm. Every third pad of the power/ground lines is probed, as indicated with the darker disks. Embodiments of the present invention are not limited to these pitches, separations, and widths—the numbers above are for illustrative purposes.

Although the preceding discussion has focused on the geometry at the probe tips, these and similar ideas are also applicable to a space transformer which is typically present as the base of a probe array. Thus, a space transformer can use multiple contact points to make contact to each of the power/ground probes. Alternatively, the space transformer contact points can be larger for power/ground probes than for signal probes. FIGS. 55C and 55D show some examples of probe distal end configurations, specifically attachment points 5514, 5516, and 5518. Any combination of these approaches can also be employed.

Although some of the Figs. illustrate rectangular or substantially rectangular or rectangular with curved end, skate geometries, other possible configurations are useful, including curved configurations.

Embodiments of the present invention can also be practiced in combination with any other way of increasing probe CCC. in particular, in one embodiment of the present invention a multiple contact point probe can be combined with the use of electrically conductive cores and/or with the use of forced gas cooling. As an example, an I/O probe of NiCo gives a CCC of about 0.55 Amps, and when this probe is used as a base for the about 3× wide design, the CCC equals about 1.65 Amps. By adding a Cu-core to the about 3× probe design, the CCC equals about 2.0 Amps. Even higher CCC can be reached by further applying forced air convection including forced chilled air convection.

Gas Cooling

The probe failure mode that is of most concern today is inelastic probe deformation that causes a probe to go out of spec (e.g., to have an out-of-spec contact force). This inelastic deformation failure mode is thermally driven, and only arises as a current driven failure mode because of resistive heating of the probe by current passing through the probe. In embodiments of the present invention, this problem is addressed by providing forced gas cooling of a probe array.

Figure 58:
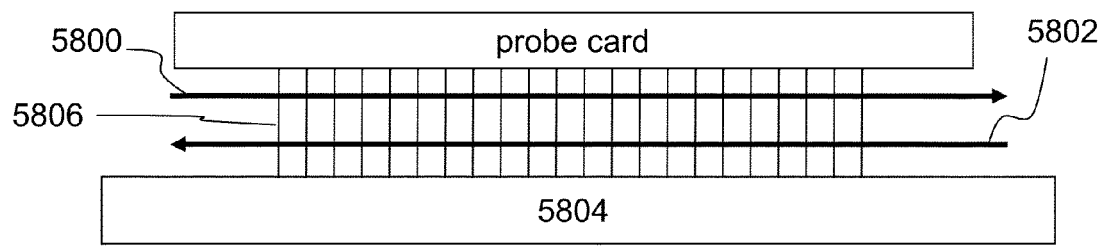
FIG. 58 illustrates an embodiment of the present invention comprising gas flows in opposite directions across a probe array.
Figure 59:
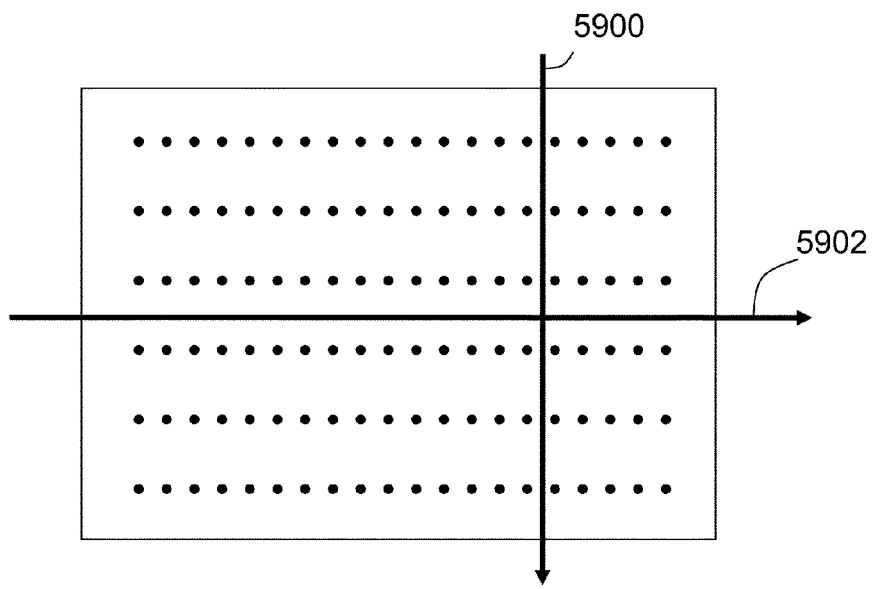
FIG. 59 illustrates an embodiment of the present invention comprising gas flows in perpendicular directions across a probe array.

In one embodiment of the present invention, gas preferably flows in a predetermined gas flow configuration. In another embodiment of the present invention, gas flows in a single direction through an array of probes, removing heat from the probes and thus lowering the temperature of the probes, which in turn prevents the inelastic probe deformation. In another embodiment of the present invention and shown in FIG. 58, vertically separated gas flows 5800 and 5802 comprising different flow directions. Here, the vertical direction is taken to be perpendicular to wafer 5804 under test. Vertical probes 5806 are preferably employed, so each probe is in the path of both gas flows. In one preferred embodiment (FIG. 58), gas flows 5800 and 5802 are in opposite directions. In another preferred embodiment and as illustrated in FIG. 59, gas flows 5900 and 5902 are in perpendicular directions. Gas flows 5900 and 5902 of the example of FIG. 59 are at different vertical positions (e.g., as shown on FIG. 58).

The use of two gas flows at different vertical positions increases the turbulence of the gas flow at probes of a probe array, and it is preferred for most or all of the probes of the probe array to be surrounded by gas in unsteady or turbulent flow. Heat transfer away from the probes is significantly enhanced by having unsteady or turbulent gas flow surrounding the probes. By increasing heat transfer away from the probes in this manner, the probe current carrying capacity can be significantly increased in situations where the current capacity of a probe is thermally limited, (e.g., as described above).

In alternative embodiments of the present invention, several features can be added to this basic scheme, individually or in any combination. A first such feature is cooling the gas flow to substantially below room temperature (e.g., −25° C., −15° C. etc.), preferably using Peltier coolers disposed in the gas flows at locations upstream of the probes being cooled. A second such feature is the use of a gas flow apparatus that provides substantially the same gas flow rate at the center and edges of the probe array being cooled. One way to accomplish this is to provide the gas flow with a suitable array of gas nozzles (e.g., having nozzles more closely spaced at the edges of the nozzle array than at the center of the nozzle array). Control of gas flow can be provided by altering nozzle shape and/or spacing (as in the examples of FIGS. 60-62). This is especially helpful in situations where the probe hot spots (where inelastic deformation/failure most easily occurs) are near the probe tips, which often occurs in practice.

A third such feature is to have some nozzles operating at positive pressures (i.e., blowing) and other nozzles operating at negative pressures (i.e., vacuuming). In this case, it is preferable that corresponding nozzles at opposite sides of the probe array have opposite operating pressures. A fourth such feature is the use of acoustic excitation to increase gas flow turbulence. A fifth such feature is to employ pulsed gas flow as opposed to a continuous steady state gas flow. These optional features preferably increases gas flow unsteadiness or turbulence, thereby improving heat transfer away from the probes.

Figure 60:
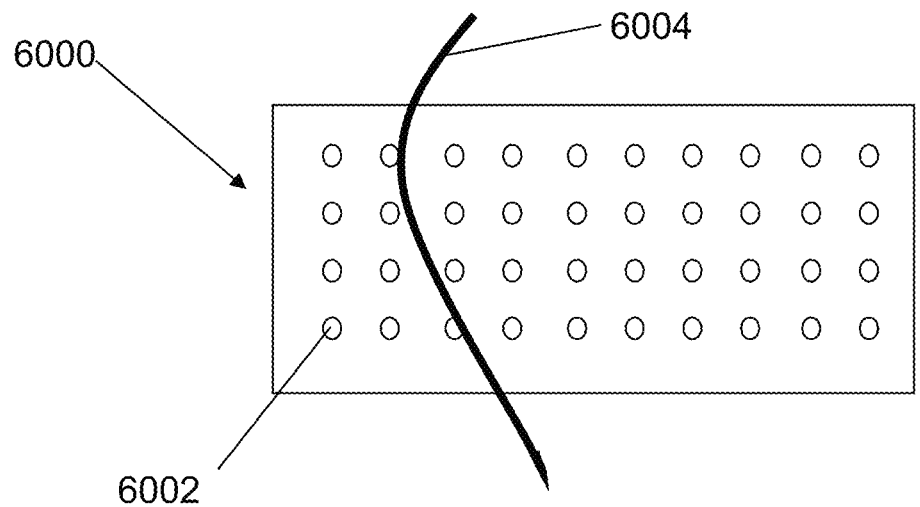
FIG. 60 illustrates an embodiment of the present invention comprising a nozzle array having holes.
Figure 61:
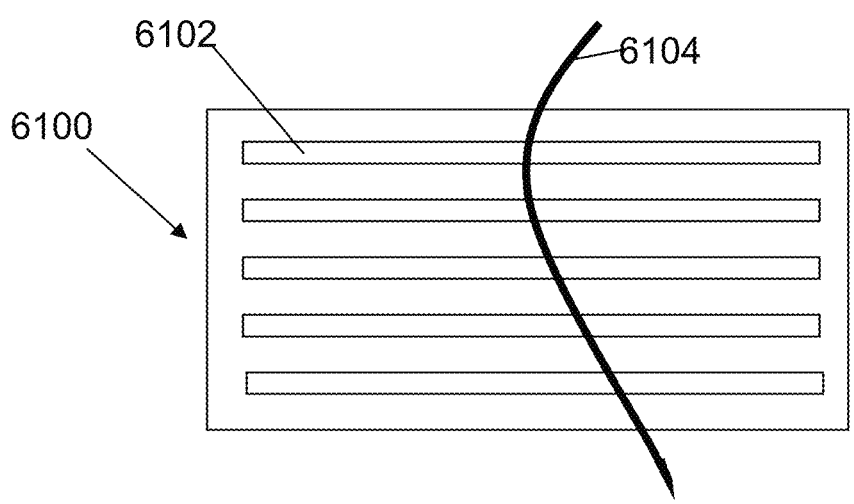
FIG. 61 illustrates an embodiment of the present invention comprising a nozzle array having slots.
Figure 62:
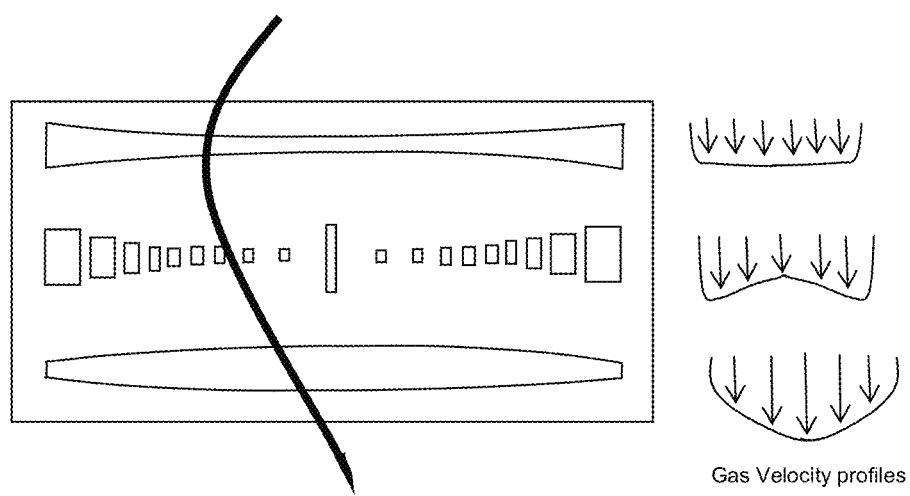
FIG. 62 illustrates an embodiment of the present invention comprising a nozzle array having different shaped openings.

Referring to FIGS. 60 and 61, gas nozzles preferably comprises openings that can be in the shape of holes (as in FIG. 60) and/or slots (as in FIG. 61) and/or any other shape, including but not limited to squares, rectangles, ovals, parallelograms, hexagons, pentagons, combinations thereof and the like. The nozzle arrays for gas flows can have the same nozzle shapes or they can have different nozzle shapes. FIG. 60 illustrates a cross-section of nozzle array 6000. Holes 6002 can either be on a regular grid or an irregular grid and can be either aligned or misaligned with the "opposite" nozzle, Holes can be any shape, including but not limited to, circular, rectangular, oval, elliptical, square, combinations thereof and the like. Probe 6004 illustrates an example of how a probe is aligned against nozzle array 6000.

FIG. 61 illustrates a cross-section of nozzle array 6100. Slots 6102 can either be on a regular grid or an irregular grid and can be aligned or misaligned with the "opposite" nozzle. Slots 6102 can be any shape, including but not limited to rectangular, oval, elliptical, combinations thereof and the like. Probe 6104 illustrates an example of how a probe is aligned against array 6100.

Figure 66:
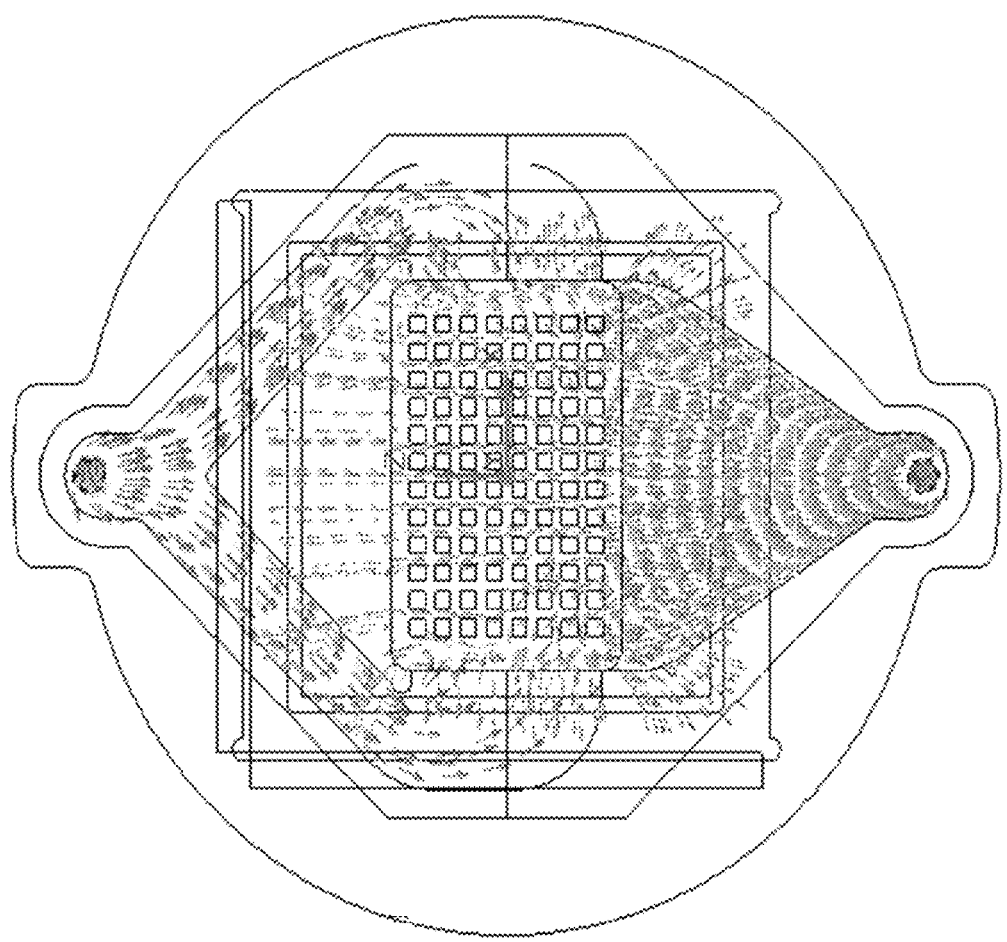

FIGS. 63-66 illustrate examples of gas flow being circulated around and through a probe array. The gas flow is preferably circulated in a predetermined gas flow configuration. FIGS. 63-66 also show the velocity profiles of the gas flows in color. FIG. 63 illustrates an embodiment of the present invention comprising two opposite gas flows without offset being circulated around and through a probe array. FIG. 64 illustrates an embodiment of the present invention comprising two opposite gas flows with offset. As illustrated in the drawings, the two opposite gas flows with offset has improved flow circulation around and through the probe array. FIGS. 65 and 66 illustrate an embodiment of the present invention comprising one main gas flow and two lateral reinforced gas flows. In this embodiment, the gas flow is improved, particularly around the center of the probe array. The gas flow around and through the probe array preferably comprises one main gas flow and two lateral reinforced gas flows, however that particular configuration is not required.

In one embodiment of the present invention, the gas flow is preferably moving at a velocity of approximately 0.5 to 10 ft/s. Referring to FIG. 63, the velocity of the gas flow is approximately 0.5 to 3 ft/s around the probe array, as the region within the probe array is mostly blue to turquoise. FIG. 64 shows a slightly increased velocity of gas flow of approximately 1 to 6 ft/s around the probe array, as the region within the probe array is mostly blue to green. FIGS. 65 and 66 also show a velocity of gas flow of about 1 to 6 ft/s, as the region within the probe array is also mostly blue to green. However, FIGS. 65 and 66 have more gas flow flowing through and around the center of the probe array.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A probe array for probing a device under test having a plurality of contact pads comprising:
   at least one power/ground probe wherein said power/ground probe comprises at least two skates;
   at least one signal probe;
   said power/ground probe comprising a width that is greater than a width of said signal probe.

2. The probe array of claim 1 wherein said power/ground probe comprises a sacrificial substrate.

3. The probe array of claim 2 wherein said sacrificial substrate is disposed on a tip of said power/ground probe.

4. The probe array of claim 2 wherein said sacrificial substrate does not make contact with a contact pad.

5. The probe array of claim 2 wherein said sacrificial substrate makes contact with a contact pad.

6. The probe array of claim 1 wherein a first skate contacts a first power/ground IC pad and a second skate contacts a second power/ground IC pad.

7. The probe array of claim 1 wherein said skates contact a same IC pad.

8. The probe array of claim 1 wherein a sacrificial substrate is disposed between said at least two skates.

9. The probe array of claim 1 wherein said width of said power/ground probe is a multiple of said width of said signal probe.

10. The probe array of claim 1 wherein said power/ground probe comprises one or more attachment points for connecting to a space transformer pad.

* * * * *